(12) United States Patent
Yoshimori et al.

(10) Patent No.: US 8,809,959 B2
(45) Date of Patent: Aug. 19, 2014

(54) SEMICONDUCTOR DEVICE AND A MANUFACTURING METHOD THEREOF

(71) Applicant: Renesas Electronics Corporation, Kawasaki (JP)

(72) Inventors: Hiromasa Yoshimori, Kawasaki (JP); Hirofumi Shinohara, Kawasaki (JP); Toshiaki Iwamatsu, Kawasaki (JP)

(73) Assignee: Renesas Electronics Corporation, Kanagawa (JP)

(*) Notice: Subject to any disclaimer, the term of this patent is extended or adjusted under 35 U.S.C. 154(b) by 0 days.

(21) Appl. No.: 13/693,351

(22) Filed: Dec. 4, 2012

(65) Prior Publication Data

US 2013/0161753 A1 Jun. 27, 2013

(30) Foreign Application Priority Data

Dec. 5, 2011 (JP) ................. 2011-265852

(51) Int. Cl.
*H01L 27/088* (2006.01)

(52) U.S. Cl.
USPC .... 257/368; 257/369; 257/392; 257/E27.062; 257/E21.19

(58) Field of Classification Search
USPC ............. 257/392, 368, 369, E27.062, E21.19
See application file for complete search history.

(56) References Cited

U.S. PATENT DOCUMENTS

| | | | |
|---|---|---|---|
| 6,642,131 B2 | 11/2003 | Harada | |
| 7,754,570 B2 | 7/2010 | Kimizuka et al. | |
| 7,915,686 B2 | 3/2011 | Shimamoto et al. | |
| 8,018,004 B2 | 9/2011 | Sato et al. | |
| 2007/0284670 A1 | 12/2007 | Yamamotot et al. | |
| 2009/0194823 A1* | 8/2009 | Maeda | 257/392 |
| 2010/0102395 A1 | 4/2010 | Yamamoto et al. | |
| 2010/0155844 A1 | 6/2010 | Takahashi | |
| 2010/0176455 A1* | 7/2010 | Arayashiki | 257/369 |
| 2010/0330812 A1 | 12/2010 | Akiyama et al. | |
| 2012/0018814 A1* | 1/2012 | Morooka | 257/392 |
| 2012/0139055 A1* | 6/2012 | Sato et al. | 257/369 |

FOREIGN PATENT DOCUMENTS

| | | |
|---|---|---|
| JP | 2003-8011 A | 1/2003 |
| JP | 2006-93670 A | 4/2006 |
| JP | 2006-332179 A | 12/2006 |
| JP | 2007-288096 A | 11/2007 |
| JP | 2008-288465 A | 11/2008 |
| JP | 2010-103386 A | 5/2010 |
| JP | 2010-161299 A | 7/2010 |
| JP | 2011-9321 A | 1/2011 |
| WO | WO 2008/015940 A1 | 2/2008 |
| WO | WO 2008/035598 A1 | 3/2008 |

* cited by examiner

*Primary Examiner* — Mamadou Diallo
(74) *Attorney, Agent, or Firm* — Foley & Lardner LLP

(57) ABSTRACT

The performances of a semiconductor device are improved. The device includes a first MISFET in which hafnium is added to the gate electrode side of a first gate insulation film including silicon oxynitride, and a second MISFET in which hafnium is added to the gate electrode side of a second gate insulation film including silicon oxynitride. The hafnium concentration in the second gate insulation film of the second MISFET is set smaller than the hafnium concentration in the first gate insulation film of the first MISFET; and the nitrogen concentration in the second gate insulation film of the second MISFET is set smaller than the nitrogen concentration in the first gate insulation film of the first MISFET. As a result, the threshold voltage of the second MISFET is adjusted to be smaller than the threshold voltage of the first MISFET.

11 Claims, 49 Drawing Sheets

SEMICONDUCTOR DEVICE AND A MANUFACTURING METHOD THEREOF

CROSS-REFERENCE TO RELATED APPLICATIONS

The disclosure of Japanese Patent Application No. 2011-265852 filed on Dec. 5, 2011 including the specification, drawings and abstract is incorporated herein by reference in its entirety.

BACKGROUND

The present invention relates to a semiconductor device and a manufacturing method thereof. More particularly, it relates to a technology effectively applicable to a semiconductor device having MISFETs, and manufacturing thereof.

Over a semiconductor substrate, a gate insulation film is formed. Over the gate insulation film, a gate electrode is formed. Thus, by ion implantation or the like, source/drain regions are formed. As a result, a MISFET (Metal Insulator Semiconductor Field Effect Transistor) can be formed. For such a MISFET, there is known the following technology: to the interface between the gate insulation film and the gate electrode, namely, to the top of the gate insulation film, a trace amount of metal such as hafnium (Hf) is added, thereby to reduce the impurity concentration of the channel region; as a result, the threshold voltage (Vth) is adjusted.

Japanese Unexamined Patent Publication No. 2006-093670 (Patent Document 1) describes the following technology: a metal such as hafnium (Hf) is caused to be present at the interface between the gate electrode and the gate insulation film; as a result, the threshold voltage (Vth) is adjusted.

Japanese Unexamined Patent Publication No. 2006-332179 (Patent Document 2) describes the following technology: a metal such as hafnium (Hf) is introduced into the vicinity of the interface between the gate electrode and the gate insulation film; as a result, the impurity concentration of the channel necessary for achieving the same threshold voltage (Vth) is adjusted so as to be reduced.

WO08/035598 (Patent Document 3) describes the following technology: the gate insulation film is set to be a HfSiON film, and the work function of the gate electrode is adjusted; as a result, the threshold voltage (Vth) is adjusted.

Whereas, there is known the following technology: the type of the metal to be added is varied between an n channel type MISFET and a p channel type MISFET forming a complementary type MISFET; as a result, the transistor characteristics such as threshold voltage (Vth) are adjusted.

WO08/015940 (Patent Document 4) describes the following technology: the type of impurities contained in the Ni silicide region between the gate insulation film and the gate electrode is varied between an n channel type MISFET and a p channel type MISFET; as a result, the threshold voltage (Vth) is adjusted.

Japanese Unexamined Patent Publication No. 2010-103386 (Patent Document 5) describes the following technology: a diffusion preventive film containing Al or the like is formed in the gate insulation film in only the p channel type MISFET; as a result, the flat band voltage is adjusted.

Japanese Unexamined Patent Publication No. 2007-288096 (Patent Document 6) describes the following technology: as a first gate insulation film of an n channel type MISFET, and a second gate insulation film of a p channel type MISFET, a high-k film containing hafnium (Hf) is used; and in order to make even the gate leakage currents of both the MISFETs, the film thickness of the first gate insulation film is set larger than the thickness of the second gate insulation film.

Japanese Unexamined Patent Publication No. 2008-288465 (Patent Document 7) describes the following technology: as the gate insulation film of an n channel type MISFET, a high-k film containing hafnium (Hf) is used, and as the gate insulation film of a p channel type MISFET, a silicon oxide film is used.

Japanese Unexamined Patent Publication No. 2011-009321 (Patent Document 8) describes the following technology: over a region in which a p channel type MISFET is formed, for example, a HfO film with a thickness of 1.0 nm is formed, and over a region in which an n channel type MISFET is formed, for example, a HfO film with a thickness of 1.5 nm is formed.

On the other hand, when a metal such as hafnium (Hf) is added to the gate insulation film, a metal is crystallized by heat load, which may result in the reduction of the reliability of the gate insulation film. However, by allowing the gate insulation film to include a silicon oxynitride film (SiON film) functioning as a barrier layer, it is possible to improve the reliability of the gate insulation film even when a metal is added thereto. Namely, it is an effective method for improving the reliability of the gate insulation film to use a silicon oxynitride film (SiON film) functioning as a barrier layer in the gate insulation film containing a metal such as hafnium (Hf).

Japanese Unexamined Patent Publication No. 2003-008011 (Patent Document 9) describes the following technology: there is used a gate insulation film having a high-k film formed of a hafnium oxide film ($HfO_2$ film) containing silicon (Si), and a lower barrier film formed of a silicon oxynitride film (SiON film) containing hafnium (Hf) formed on the bottom side of the high-k film.

Japanese Unexamined Patent Publication No. 2010-161299 (Patent Document 10) describes the following technology: the surface density of hafnium (Hf) in the n channel type MISFET is set smaller than the surface density of hafnium (Hf) in the p channel type MISFET, and the nitrogen concentration of a silicon oxynitride film (SiON film) in the n channel type MISFET is set smaller than the nitrogen concentration of a silicon oxynitride film (SiON film) in the p channel type MISFET.

[PATENT DOCUMENTS]

[Patent Document 1]
Japanese Unexamined Patent Publication No. 2006-093670
[Patent Document 2]
Japanese Unexamined Patent Publication No. 2006-332179
[Patent Document 3]
WO08/035598
Patent Document 4
WO08/015940
[Patent Document 5]
Japanese Unexamined Patent Publication No. 2010-103386
[Patent Document 6]
Japanese Unexamined Patent Publication No. 2007-288096
[Patent Document 7]
Japanese Unexamined Patent Publication No. 2008-288465
[Patent Document 8]
Japanese Unexamined Patent Publication No. 2011-009321
[Patent Document 9]
Japanese Unexamined Patent Publication No. 2003-008011
[Patent Document 10]
Japanese Unexamined Patent Publication No. 2010-161299

SUMMARY

A study by the present inventors revealed the following.

As described above, it is an effective method for improving the reliability of the gate insulation film to use a silicon oxynitride (SiON) film functioning as a barrier film in the gate insulation film containing a metal such as hafnium (Hf). However, in the p channel type MISFET, when a silicon oxynitride (SiON) film is used as a barrier layer, nitrogen (N) is mixed into the gate insulation film, resulting in an increase in positive fixed charges in the gate insulation film. As a result, the threshold voltage (Vth) increases. For this reason, it is difficult to perform adjustment so as to reduce the threshold voltage (Vth).

As a method for manufacturing a p channel type MISFET having a small threshold voltage (Vth), there can also be considered reduction of the impurity concentration in the channel region. However, in a MISFET with a short channel length, the reduction of the impurity concentration in the channel region results in the deterioration of the transistor characteristics, or the like. As a result, the performances of the semiconductor device are reduced.

It is an object of the present invention to provide a technology capable of improving the performances of a semiconductor device.

The foregoing and other objects and novel features of the present invention will be apparent from the description of this specification and the accompanying drawings.

Summaries of the representative ones of the inventions disclosed in the present application will be described in brief as follows.

A semiconductor device in accordance with a representative embodiment includes two types of MISFETs in each of which hafnium has been added to the gate electrode side of a gate insulation film formed of silicon oxynitride. Then, the hafnium concentration in the gate insulation film of one MISFET is set smaller than the hafnium concentration in the gate insulation film of the other MISFET. In addition, the nitrogen concentration in the gate insulation film of one MISFET is set smaller than the nitrogen concentration in the gate insulation film of the other MISFET. As a result, the threshold voltage of one MISFET is adjusted so as to be smaller than the threshold voltage of the other MISFET.

Further, with a method for manufacturing a semiconductor device in accordance with another representative embodiment, with a part of an insulation film formed over a semiconductor substrate, and formed of silicon oxide being covered with a mask film, a first nitriding treatment and a hafnium addition step are performed, and the mask film is removed. Then, a second nitriding treatment and a hafnium addition step are performed. Then, the threshold voltage of a MISFET formed in a region which was covered with the mask film is adjusted so as to be smaller than the threshold voltage of a MISFET formed in a region which was not covered with the mask film.

The effects obtainable by representative ones of the inventions disclosed in the present application will be described in brief as follows.

In accordance with representative embodiments, it is possible to improve the performances of a semiconductor device.

DETAILED DESCRIPTION

Figure 1:
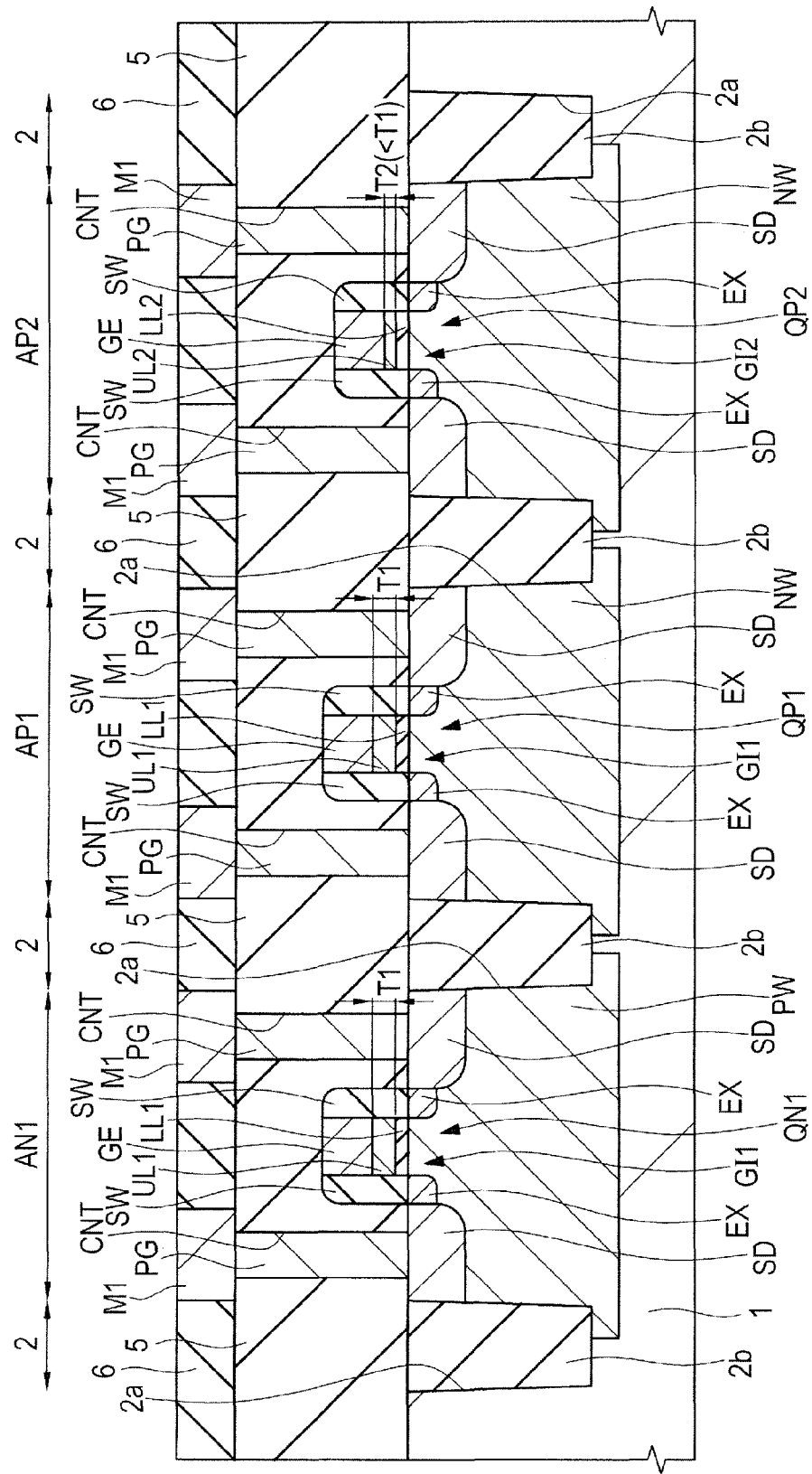
FIG. 1 is an essential-part cross-sectional view of a semiconductor device of a first embodiment.

In the description of the following embodiment, the embodiment may be described in a plurality of divided sections or embodiments for convenience, if required. However, unless otherwise specified, these are not independent of each other, but are in a relation such that one is a modification example of a part or the whole of the other, or details, complementary explanation, or the like of the other. Further, in the following embodiments, when a reference is made to the number of elements, and the like (including number, numerical value, quantity, range, or the like), the number of elements is not limited to the specific number, but maybe greater than or less than the specific number, unless otherwise specified, or except the case where the number is apparently limited to the specific number in principle. Further in the following embodiments, it is naturally understood that the constitutional elements (including element steps, or the like) are not always essential, unless otherwise specified, or except the case where they are apparently considered essential in principle, or except for other cases. Similarly, in the following embodiments, when a reference is made to the shapes, positional relationships, or the like of the constitutional elements, or the like, it is understood that they include ones substantially analogous or similar to the shapes or the like, unless otherwise specified, or unless otherwise considered apparently in principle, or except for other cases. This also applies to the foregoing numerical values and ranges.

Below, embodiments of the present invention will be described in details by reference to the accompanying drawings. Incidentally, in all the drawings for describing the following embodiments, members having the same function are given the same reference signs and numerals, and a repeated description thereon is omitted. Further, in the following embodiment, the description of the same or similar parts will not be repeated in principle unless particularly necessary.

Further, in the accompanying drawings for use in the embodiments, hatching may be omitted even in cross section for ease of understanding of the drawing. Whereas, hatching may be given even in plan view for ease of understanding of the drawing.

First Embodiment

<Semiconductor Device>

A semiconductor device which is one embodiment of the present invention will be described by reference to the accompanying drawings. The semiconductor device of the present embodiment is a semiconductor device having a MISFET as a semiconductor element.

Figure 2:
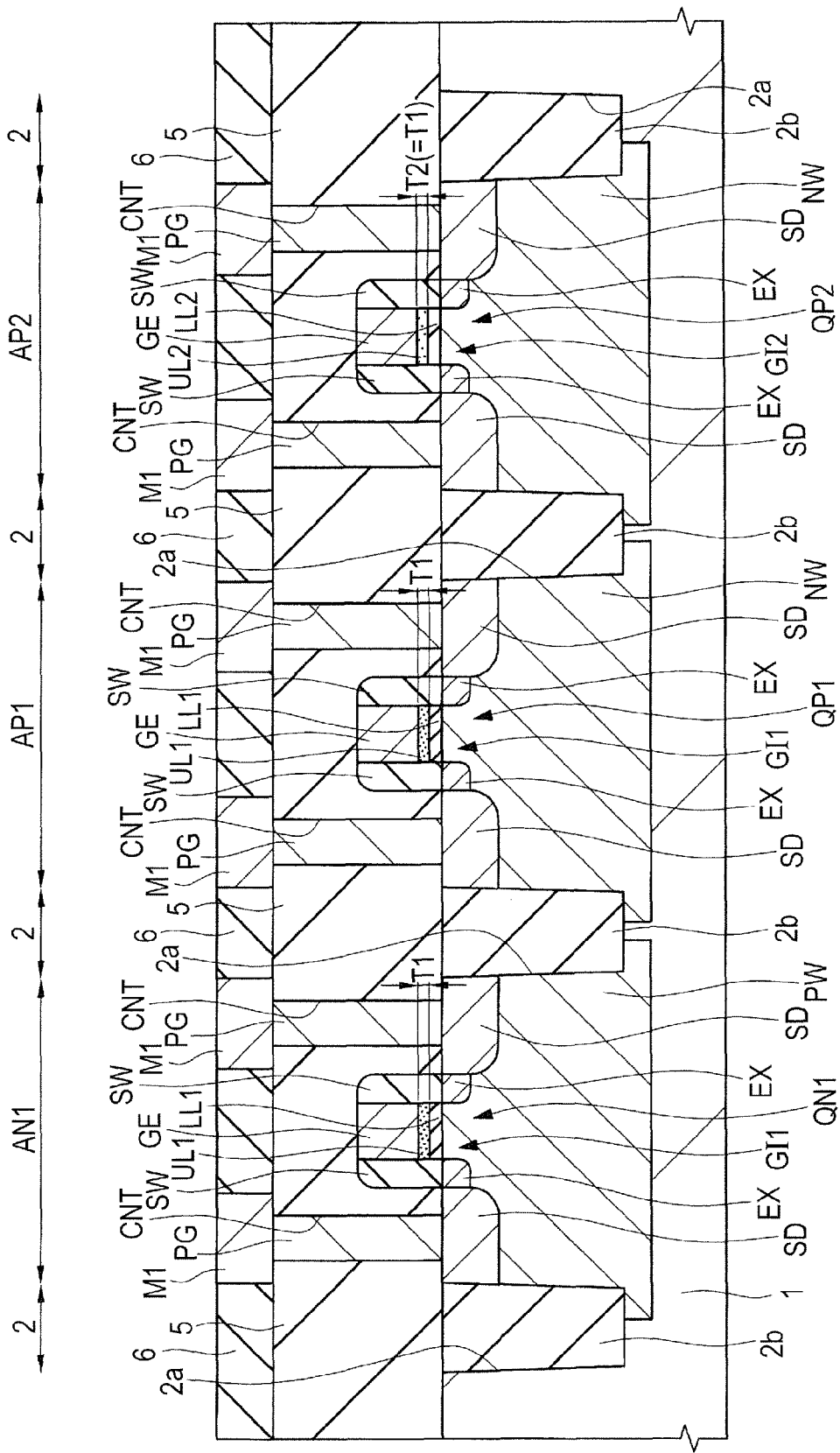
FIG. 2 is an essential-part cross-sectional view of the semiconductor device of the first embodiment.

FIGS. 1 and 2 are each an essential-part cross-sectional view of the semiconductor device of a first embodiment.

As shown in FIG. 1, a MISFET included in the semiconductor device of the present embodiment is formed at a semiconductor substrate 1. The semiconductor substrate 1 is, for example, a single crystal silicon substrate. Over a main surface of the semiconductor substrate 1, there are defined element isolation regions 2 and MISFET formation regions (active regions) AN1, AP1, and AP2. The MISFET formation regions AN1, AP1, and AP2 are regions divided by the element isolation regions 2. The MISFET formation region AN1 is a region (n type MISFET formation region AN1) in which an n channel type MISFET QN1 is formed. The MISFET formation region AP1 is a region (p type MISFET formation region AP1) in which a p channel type MISFET QP1 is formed. The MISFET formation region AP2 is a region (p type MISFET formation region AP2) in which a p channel type MISFET QP2 is formed. The threshold voltage (Vth) of the p channel type MISFET QP2 formed in the MISFET formation region AP2 is smaller than the threshold voltage (Vth) of the p channel type MISFET QP1 formed in the MISFET formation region AP1.

Incidentally, in the present specification, when the magnitudes of the threshold voltages (Vth) are compared, it is assumed that the magnitudes of the absolute values of the threshold voltages (Vth) are compared. Whereas, in FIG. 1, for ease of understanding, the MISFET formation regions AN1, AP1, and AP2 are shown adjacent to one another. However, the actual positional relationship between the MISFET formation regions AN1, AP1, and AP2 can be changed, if required.

In the n type MISFET formation region AN1, a p type well region PW is formed in the semiconductor substrate 1. In each of the p type MISFET formation regions AP1 and AP2, an n type well region NW is formed in the semiconductor substrate 1.

First, a description will be given to a specific configuration of the n channel type MISFET QN1 formed in the n type MISFET formation region AN1.

The n channel type MISFET QN1 has a gate electrode GE formed over the semiconductor substrate 1. The gate electrode GE is formed over the p type well region PW formed in the semiconductor substrate 1 in the n type MISFET formation region AN1. Whereas, the n channel type MISFET QN1 has a gate insulation film GI1 formed between the gate electrode GE and the semiconductor substrate 1. Namely, the n channel type MISFET QN1 has the gate insulation film GI1 formed over the semiconductor substrate 1 and the gate electrode GE formed over the gate insulation film GI1.

As the gate electrode GE, there is used a conductor film formed of, for example, polycrystal silicon (doped polysilicon) including impurities introduced therein, and made low in resistivity. Alternatively, as the gate electrode GE, there is used a conductor film formed of one of, for example, titanium nitride (TiN), tantalum nitride (TaN), tungsten nitride (WN), titanium carbide (TiC), tantalum carbide (TaC), tungsten carbide (WC), or tantalum carbide nitride (TaCN). Still alternatively, there may be adopted a MIPS (Metal Inserted Polysilicon Stack) structure which is a lamination structure of a conductor film formed of one of those described above except for polycrystal silicon, and a conductor film formed of polycrystal silicon.

The gate insulation film GI1 includes a metal, silicon, oxygen, and nitrogen.

Examples of the metal to be contained in the gate insulation film GI1 may include hafnium (Hf), aluminum (Al), and titanium (Ti). By adjusting the content of the metal in the gate insulation film GI1, it is possible to adjust the threshold voltage (Vth) of the MISFET QN1 without adjusting the impurity concentration of the channel region. Further, when the metal contained in the gate insulation film GI1 is, for example, titanium (Ti), as the gate insulation film GI1, the one containing, for example, titanium nitride (TiN) can also be used. Whereas, hafnium (Hf) is preferable among the metals described above in that it produces a still larger effect of enabling adjustment of the threshold voltage (Vth) without adjusting the impurity concentration of the channel region by the adjustment of the content of the metal in the gate insulation film GI1.

The silicon, oxygen, and nitrogen included in the gate insulation film GI1 are present as, for example, silicon oxynitride (SiON) in the gate insulation film GI1. Out of these, nitrogen can suppress the deterioration of the reliability of the gate insulation film GI1 due to crystallization of the contained metal when the gate insulation film GI1 contains the metal described above.

Incidentally, a detailed structure of the gate insulation film GI1 will be described later.

Over the sidewall of the gate electrode GE, a sidewall spacer SW is formed as a sidewall insulation film. Then, in portions which are in the n type MISFET formation region AN1, and are on the opposite sides across the gate electrode GE including the sidewall spacer SW formed thereover, there are formed source/drain regions SD. In the n type MISFET formation region AN1, the source/drain regions SD are n type semiconductor regions including n type impurities such as phosphorus (P) or arsenic (As) diffused therein.

Whereas, in the n type MISFET formation region AN1, in the semiconductor substrate 1, there are formed extension regions EX, and the source/drain regions SD with a higher impurity concentration than that thereof; as a result, there are formed source/drain regions of a LDD (Lightly doped Drain) structure.

Incidentally, over the source/drain regions SD and over the gate electrode GE, using a Salicide: Self Aligned Silicide technology, there can be formed a metal silicide layer such as a cobalt silicide layer or a nickel silicide layer.

Then, a description will be given to the specific configuration of the p channel type MISFET QP1 with a large threshold voltage (Vth) formed in the p type MISFET formation region AP1.

The p channel type MISFET QP1 has a gate electrode GE formed over the semiconductor substrate 1. The gate electrode GE is formed over the n type well region NW formed in the semiconductor substrate 1 in the p type MISFET formation region AP1. Whereas, the p channel type MISFET QP1 has a gate insulation film GI1 formed between the gate electrode GE and the semiconductor substrate 1. Namely, the p channel type MISFET QP1 has the gate insulation film GI1 formed over the semiconductor substrate 1, and the gate electrode GE formed over the gate insulation film GI1.

As the gate electrode GE, there can be used the same material as that for the gate electrode GE of the n channel type MISFET QN1.

The gate insulation film GI1 includes a metal, silicon, oxygen, and nitrogen as with the gate insulation film GI1 of the n channel type MISFET QN1.

As the metals to be contained in the gate insulation film GI1, as with the metals to be contained in the gate insulation film GI1 of the MISFET QN1, mention may be made of, for example, hafnium (Hf), aluminum (Al), and titanium (Ti). By adjusting the content of the metal in the gate insulation film GI1, it is possible to adjust the threshold voltage (Vth) of the MISFET QP1 without adjusting the impurity concentration of the channel region. Further, when the metal contained in the gate insulation film GI1 is, for example, titanium (Ti), as the gate insulation film GI1, the one containing, for example, titanium nitride (TiN) can also be used. Whereas, hafnium (Hf) is preferable among the metals described above in that it produces a still larger effect of enabling adjustment of the threshold voltage (Vth) without adjusting the impurity concentration of the channel region by the adjustment of the content of the metal in the gate insulation film GI1.

The silicon, oxygen, and nitrogen included in the gate insulation film GI1 are present as, for example, silicon oxynitride (SIGN) in the gate insulation film GI1 as with the silicon, oxygen, and nitrogen included in the gate insulation film GI1 of the MISFET QN1. Out of these, nitrogen can suppress the deterioration of the reliability of the gate insulation film GI1 due to crystallization of the contained metals when the gate insulation film GI1 includes the metals described above.

Incidentally, the detailed structure of the gate insulation film GI1 will be described later.

Over the sidewall of the gate electrode GE, a sidewall spacer SW is formed as a sidewall insulation film. Then, in portions which are in the p type MISFET formation region AP1, and are on the opposite sides across the gate electrode GE including the sidewall spacer SW formed thereover, there are formed source/drain regions SD. In the p type MISFET formation region AP1, the source/drain regions SD are p type semi, conductor regions including p type impurities such as boron (B) diffused therein.

Whereas, also in the p type MISFET formation region AP1, in the semiconductor substrate 1, the extension regions EX are formed, and the source/drain regions SD of a LDD structure are formed. Further, also in the p type MISFET formation region AP1, over the source/drain regions SD and over the gate electrode GE, using a salicide technology, there can be formed a metal silicide layer.

Then, a description will be given to the specific configuration of a p channel type MISFET QP2 with a small threshold voltage (Vth) formed in the p type MISFET formation region AP2.

The p channel type MISFET QP2 has a gate electrode GE formed over the semiconductor substrate 1. The gate electrode GE is formed over the n type well region NW formed in the semiconductor substrate 1 in the p type MISFET formation region AP2. Whereas, the p channel type MISFET QP2 has a gate insulation film GI2 including silicon, oxygen, nitrogen, and a metal formed between the gate electrode GE and the semiconductor substrate 1. Namely, the p channel type MISFET QP2 has a gate insulation film GI2 formed over the semiconductor substrate 1, and the gate electrode GE formed over the gate insulation film GI2.

As the gate electrode GE, there can be used the same material as that for the gate electrode GE of the p channel type MISFET QP1.

The gate insulation film GI2 includes a metal, silicon, oxygen, and nitrogen as with the gate insulation film GI1 of the p channel type MISFET QP1.

As the metals contained in the gate insulation film GI2, as with the metals contained in the gate insulation film GI1 of the MISFET QP1, mention may be made of, for example, hafnium (Hf), aluminum (Al), and titanium (Ti). By adjusting the content of the metal in the gate insulation film GI2, it is possible to adjust the threshold voltage (Vth) of the MISFET QP2 without adjusting the impurity concentration of the channel region. Further, when the metal contained in the gate insulation film GI2 is, for example, titanium (Ti), as the gate insulation film GI2, the one including, for example, titanium nitride (TiN) can also be used. Whereas, hafnium (Hf) is preferable among the metals described above in that it produces a still larger effect of enabling adjustment of the threshold voltage (Vth) without adjusting the impurity concentration of the channel region by the adjustment of the content of the metal in the gate insulation film GI2.

The silicon, oxygen, and nitrogen included in the gate insulation film GI2 are present as, for example, silicon oxynitride (SiON) in the gate insulation film GI2 as with the silicon, oxygen, and nitrogen included in the gate insulation film GI1 of the MISFET QP1. Out of these, nitrogen can suppress the deterioration of the reliability of the gate insulation film GI2 due to crystallization of the contained metals when the gate insulation film GI2 includes the metals described above.

Incidentally, the detailed structure of the gate insulation film GI2 will be described later.

However, the concentration of the metal in the gate insulation film GI2 is smaller than the concentration of the metal in the gate insulation film GI1. The concentration of nitrogen in the gate insulation film GI2 is smaller than the concentration of nitrogen in the gate insulation film GI1. As a result, the threshold voltage (Vth) of the MISFET QP2 can be adjusted so as to be smaller than both of the threshold voltage (Vth) of the MISFET QP1 and the threshold voltage (Vth) of the MISFET QN1 without adjusting the impurity concentration of the channel region. Further, it is possible to suppress the deterioration of the reliability of the gate insulation film GI2 due to crystallization of the metals contained in the gate insulation film GI2. Thus, in the MISFET QP2, it is possible to suppress the increase in threshold voltage (Vth) due to inclusion of nitrogen in the gate insulation film GI2. Then, the threshold voltage (Vth) can be adjusted so as to be reduced without reducing the impurity concentration. For this reason, even when the channel length is short, it is possible to suppress the deterioration of the transistor characteristics in a MISFET with a small threshold voltage (Vth).

As described previously, as the metal to be contained in the gate insulation films GI1 and GI2, preferably, hafnium (Hf) is used. When hafnium (Hf) is used as the metal to be contained in the gate insulation films GI1 and GI2, the concentration of hafnium (Hf) in the gate insulation film GI2 is smaller than the concentration of hafnium (Hf) in the gate insulation film GI1; and the concentration of nitrogen in the gate insulation film GI2 is smaller than the concentration of nitrogen in the gate insulation film GI1. As a result, the threshold voltage (Vth) of the MISFET QP2 can be adjusted so as to be smaller than both of the threshold voltage (Vth) of the MISFET QP1 and the threshold voltage (Vth) of the MISFET QN1 without adjusting the impurity concentration of the channel region.

Incidentally, the concentration of a metal in the present invention is assumed to mean, for example, the number of atoms of the metal per unit area (atoms/cm$^2$). The concentration of nitrogen in the present invention is assumed to mean, for example, the ratio of number of atoms (atom %) of nitrogen relative to the total sum of respective numbers of atoms of silicon, oxygen, and nitrogen.

Further, the concentration of the metal in the gate insulation film GI1 of the MISFET QN1 is not required to be equal to the concentration of the metal in the gate insulation film GI1 of the MISFET QP1. The concentration of nitrogen in the gate insulation film GI1 of the MISFET QN1 is not required to be equal to the concentration of nitrogen in the gate insulation film GI1 of MISFET QP1.

Over the sidewall of the gate electrode GE, a sidewall spacer SW is formed as a sidewall insulation film. Then, in portions which are in the p type MISFET formation region AP2, and are on the opposite sides across the gate electrode GE including the sidewall spacer SW formed thereover, there are formed source/drain regions SD. In the p type MISFET formation region AP2, the source/drain regions SD are p type semiconductor regions including p type impurities such as boron (B) diffused therein.

Whereas, also in the p type MISFET formation region AP2, in the semiconductor substrate 1, the extension regions EX are formed, and the source/drain regions SD of a LDD structure are formed. Further, also in the p type MISFET formation region AP2, over the source/drain regions SD and over the gate electrode GE, using a salicide technology, there can be formed a metal silicide layer.

Then, a description will be given to the detailed structure of the gate insulation films GI1 and GI2. Incidentally, below, a description will be given to an example in which the gate insulation films GI1 and GI2 contain hafnium as a metal. However, the same also applies to the case where the gate insulation films GI1 and GI2 contain other metal than hafnium among the metals described above.

As shown in FIG. 1, the gate insulation film GI1 preferably has a lower layer film LL1 containing silicon, oxygen, and nitrogen formed over the semiconductor substrate 1, and an upper layer film UL1 containing hafnium formed over the lower layer film LL1. As a result, the lower layer film LL1 can be used as a barrier layer for suppressing the deterioration of the reliability of the gate insulation film GI1 due to crystallization of hafnium contained in the upper layer film UL1.

Whereas, the gate insulation film GI2 preferably has a lower layer film LL2 containing silicon, oxygen, and nitrogen formed over the semiconductor substrate 1, and an upper layer film UL2 containing hafnium formed over the lower layer film LL2. As a result, the lower layer film LL2 can be used as a barrier layer for suppressing the deterioration of the reliability of the gate insulation film GI2 due to crystallization of hafnium contained in the upper layer film UL1.

As the lower layer films LL1 and LL2, there is used, for example, a film formed of silicon oxynitride (SiON). As the upper layer films UL1 and UL2, there is used a film formed of one or more of hafnium oxide (HfO), hafnium oxynitride (HfON), and HfSiON.

Further, preferably, the thickness T2 of the upper layer film UL2 is set smaller than the thickness T1 of the upper layer film UL1. As a result, the concentration of hafnium in the gate insulation film GI2 can be made smaller than the concentration of hafnium in the gate insulation film GI1 with ease.

Specifically, the concentration of hafnium in the gate insulation film GI1 is preferably $5 \times 10^{13}$ to $2 \times 10^{14}$ atoms/cm$^2$. When the concentration of hafnium in the gate insulation film GI1 is less than $5 \times 10^{13}$ atoms/cm$^2$, the threshold voltages (Vth) of the MISFETs QP1 and QN1 may be unadjustable so as to be sufficiently large. Whereas, when the concentration of hafnium in the gate insulation film GI1 exceeds $2 \times 10^{14}$ atoms/cm$^2$, hafnium becomes more likely to be crystallized. This may reduce the reliability of the gate insulation films GI1 of the MISFETs QP1 and QN1.

Further, the concentration of nitrogen in the gate insulation film GI1 is preferably 5 to 20 atom %. When the concentration of nitrogen in the gate insulation film GI1 is less than 5 atom %, hafnium becomes more likely to be crystallized. This may reduce the reliability of the gate insulation films GI1 of the MISFETs QP1 and QN1. Whereas, when the concentration of nitrogen in the gate insulation film GI1 exceeds 20 atom %, the positive fixed charges in the gate insulation film GI1 increase, which may result in the following: the threshold voltage (Vth) of the MISFET QP1 becomes too large; on the other hand, the threshold voltage (Vth) of the MISFET QN1 cannot be adjusted so as to be sufficiently large.

Whereas, preferably, the concentration of hafnium in the gate insulation film GI2 is 0 to $1 \times 10^{14}$ atoms/cm$^2$, and the concentration of hafnium in the gate insulation film GI2 is smaller than the concentration of hafnium in the gate insulation film GI1. When the concentration of hafnium in the gate insulation film GI2 exceeds $1 \times 10^{14}$ atoms/cm$^2$, the threshold voltage (Vth) of the MISFET QP2 may be unadjustable so as to be sufficiently small.

Whereas, preferably, the concentration of nitrogen in the gate insulation film GI2 is 2 to 7 atom %, and, the concentration of nitrogen in the gate insulation film GI2 is smaller than the concentration of nitrogen in the gate insulation film GI1. When the concentration of nitrogen in the gate insulation film GI2 is less than 2 atom %, hafnium becomes more likely to be crystallized. This may reduce the reliability of the gate insulation film GI2. Whereas, when the concentration of nitrogen in the gate insulation film GI2 exceeds 7 atom %, the positive fixed charges in the gate insulation film GI2 increase. As a result, the threshold voltage (Vth) of the MISFET QP2 may be unadjustable so as to be sufficiently small.

Incidentally, FIG. 1 shows the case where the thickness T2 of the upper layer film UL2 is smaller than the thickness T1 of the upper layer film UL1. However, the concentration of hafnium in the upper layer film UL2 is desirably smaller than the concentration of hafnium in the upper layer film UL1. The thickness T2 of the upper layer film UL2 is not required to be smaller than the thickness T1 of the upper layer film UL1. FIG. 2 shows the case where although the concentration of hafnium in the upper layer film UL2 is smaller than the concentration of hafnium in the upper layer film UL1, the thickness T2 of the upper layer film UL2 is equal to the thickness T1 of the upper layer film UL1.

In FIG. 2, the dots of the upper layer film UL2 in the MISFET QP2 are shown more thinly than the dots of the upper layer film UL1 in the MISFET QN1 and the dots of the upper layer film UL1 in the MISFET QP1. Such representation indicates that the concentration of hafnium in the upper layer film UL2 of the MISFET QP2 is smaller than the concentration of hafnium in the upper layer film UL1 of the MISFET QN1 and the concentration of hafnium in the upper layer film UL1 of the MISFET QP1. Incidentally, out of the portions shown in FIG. 2, the portions except for the upper layer films UL1 and UL2 are the same as those of FIG. 1, and hence will not be described.

In the element isolation region 2, in the main surface of the semiconductor substrate 1, there is formed an element isolation trench 2a. In the formed element isolation trench 2a, an insulation film 2b is embedded. The insulation film 2b divides the n channel type MISFET QN1 formed in the n type MISFET formation region AN1, the p channel type MISFET QP1 formed in the p type MISFET formation region AP1, and the p channel type MISFET QP2 formed in the p type MISFET formation region AP2 from one another. The insulation film 2b is preferably formed of a silicon oxide film. The insulation film 2b is formed by, for example, a STI (Shallow Trench Isolation) method as described later.

Over the entire main surface (front surface) of the semiconductor substrate 1, an interlayer insulation film 5 is formed in such a manner as to cover the gate electrodes GE, the sidewall spacers SW, and the source/drain regions SD of the MISFETs QN1, QP1, and QP2. The interlayer insulation film 5 is formed of, for example, a single film of silicon oxide film, or a lamination film of a silicon nitride film and a silicon oxide film thicker than that (with the silicon nitride film on the lower layer side). The top surface of the interlayer insulation film 5 is planarized so that the MISFET formation regions AN1, AP1, and AP2 roughly agree in height with one another.

In the interlayer insulation film 5, there are formed contact holes CNT. In each contact hole CNT, there is formed a conductive plug PG. The contact holes CNT, and the plugs PG filling them, respectively, are formed over the source/drain regions SD and over the gate electrode GE of the MISFET formation regions AN1, AP1, and AP2, and the like. The bottoms of the plugs PG are electrically coupled with the source/drain regions SD and the gate electrodes GE formed in the MISFET formation regions AN1, AP1, and AP2.

Over the interlayer insulation film 5 including the plugs PG embedded therein, there is formed an insulation film 6 formed of, for example, a silicon oxide film. In the wiring trench (opening) formed in the insulation film 6, there is formed a wire M1 as a first-layer wire. The wire M1 is electrically coupled via the plugs PG with the source/drain regions SD and the gate electrodes GE formed in the MISFET formation regions AN1, AP1, and AP2, and the like.

The wire M1 is formed by a damascene technology (herein, a single damascene technology). However, as other modes, the wire M1 can also be formed by a patterned conductive film (e.g., a tungsten wire or an aluminum wire).

<Manufacturing Steps of Semiconductor Device>

Figure 3:
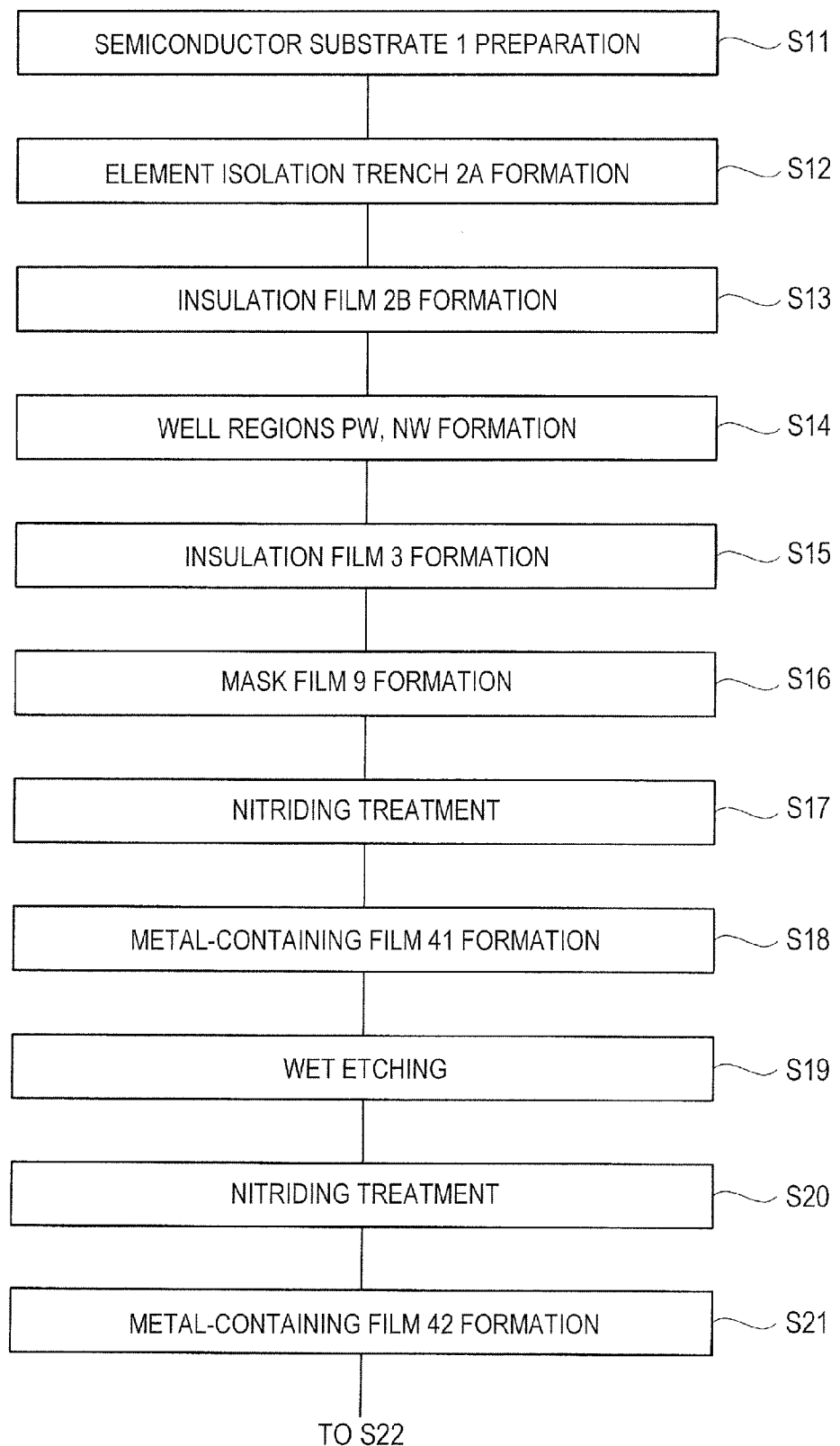
FIG. 3 is a manufacturing process flowchart showing a part of manufacturing steps of the semiconductor device of the first embodiment.
Figure 4:
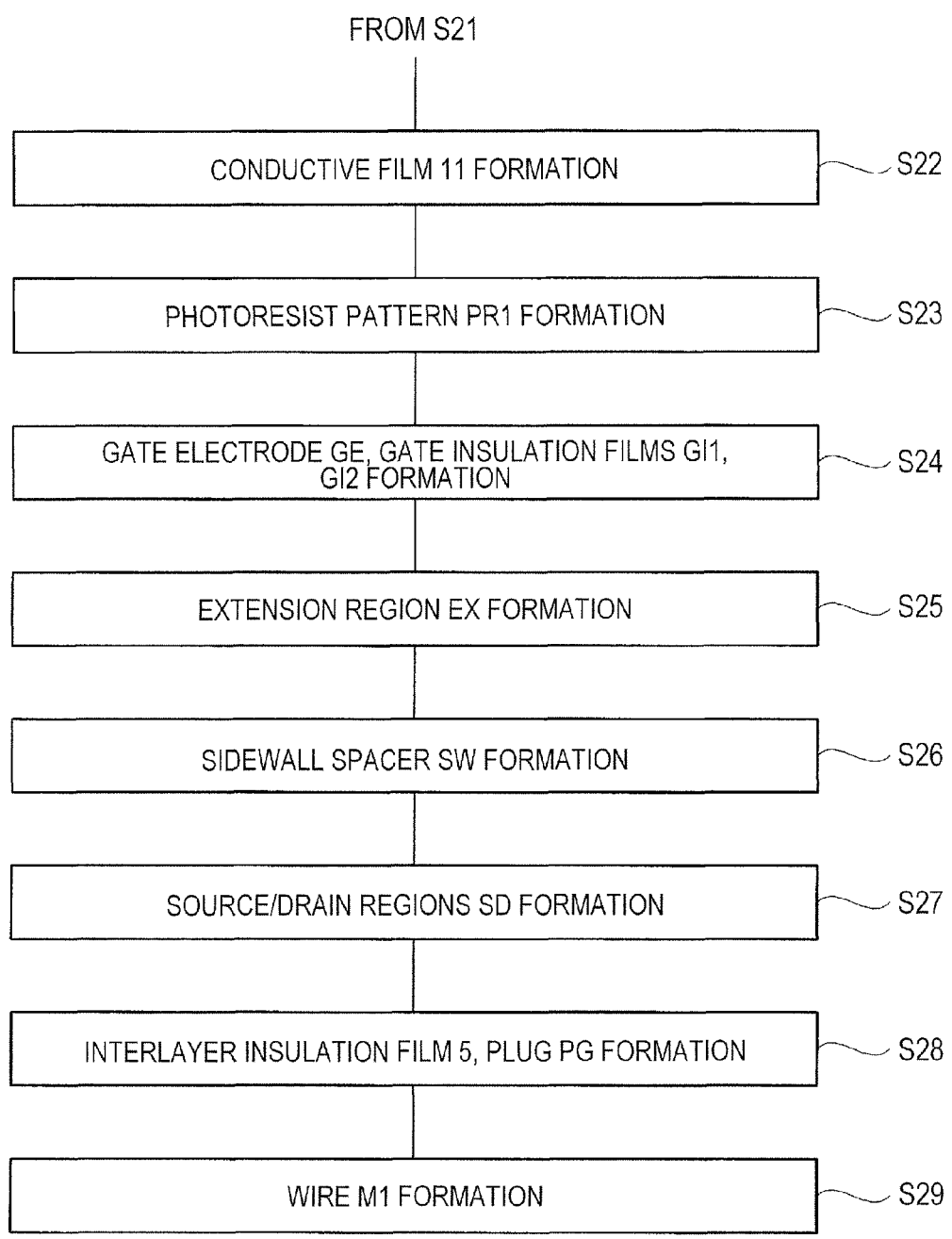
FIG. 4 is a manufacturing process flowchart showing a part of manufacturing steps of the semiconductor device of the first embodiment.
Figure 20:
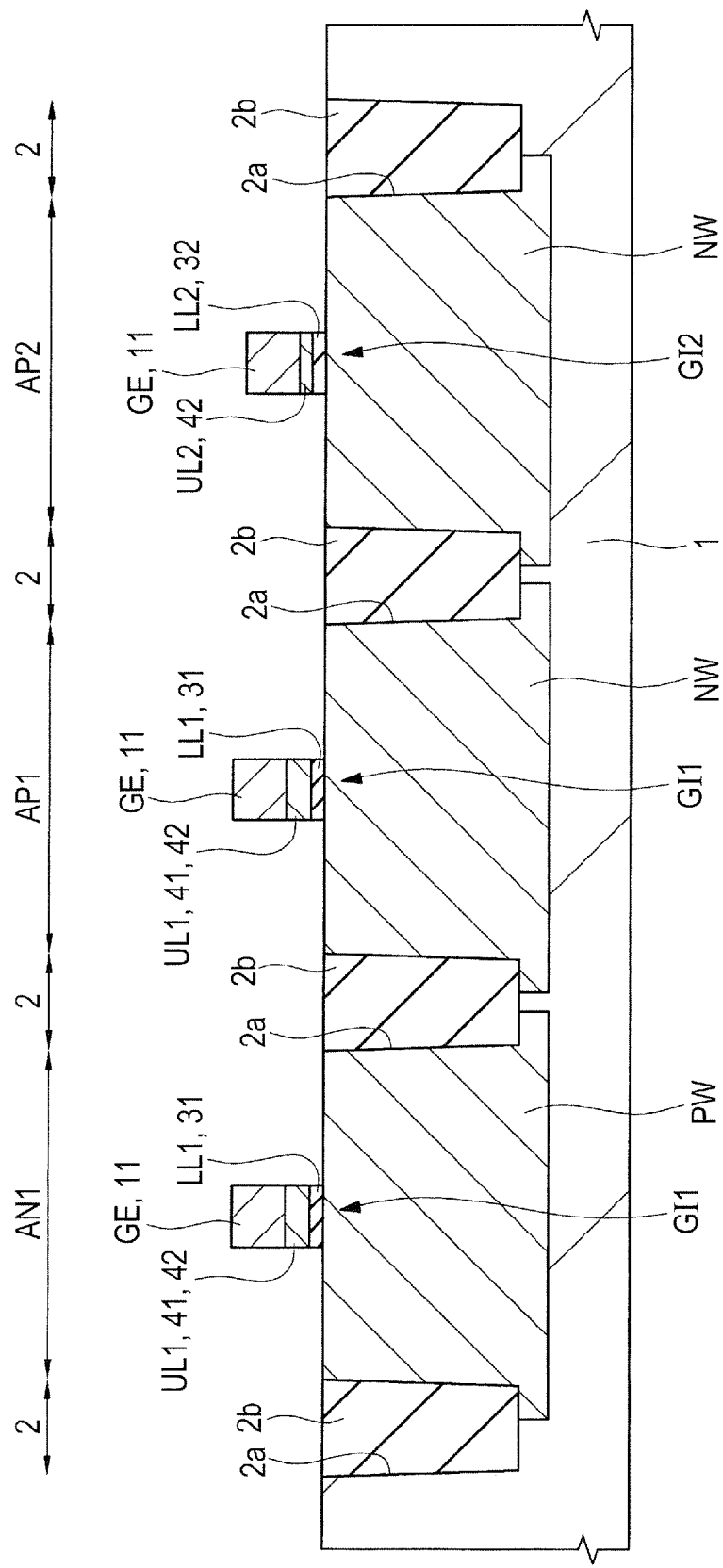
FIG. 20 is an essential-part cross-sectional view in a manufacturing step of the semiconductor device of the first embodiment.
Figure 21:
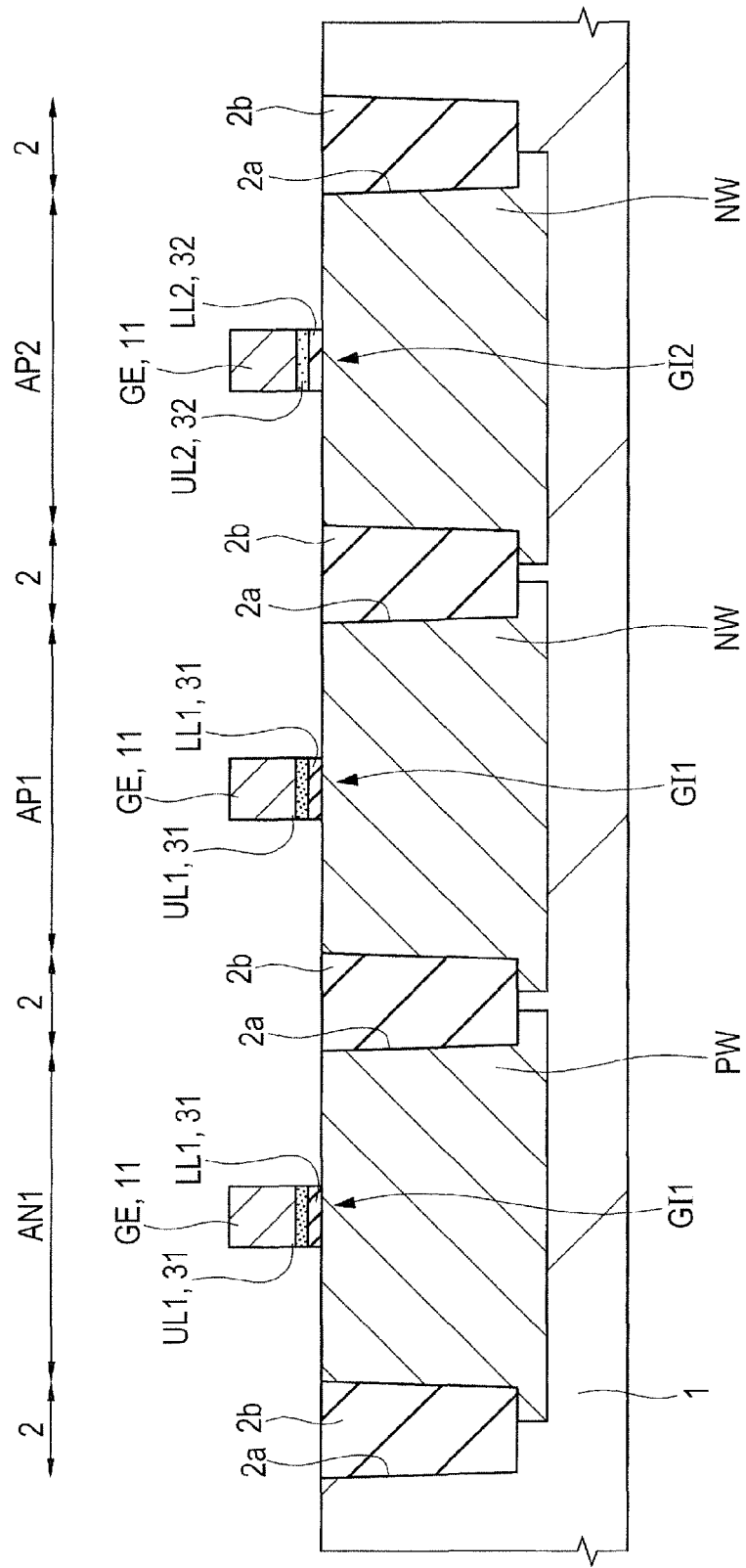
FIG. 21 is an essential-part cross-sectional view in a manufacturing step of the semiconductor device of the first embodiment.

The manufacturing steps of the semiconductor device of the present embodiment will be described by reference to the accompanying drawings. FIGS. 3 and 4 are each a manufacturing process flowchart showing a part of manufacturing steps of the semiconductor device of the first embodiment. FIGS. 5 to 25 are each an essential-part cross-sectional view in a manufacturing step of the semiconductor device of the first embodiment. Incidentally, FIGS. 13, 17, and 21 show the states in each of which a metal-containing film is not formed definitely, and a metal is added to an insulation film 31 or an insulation film 32 in the steps shown in FIGS. 12, 16, and 20 (Step S18 of FIG. 3, Step S21 of FIG. 3, and Step S24 of FIG. 4), respectively.

Figure 5:
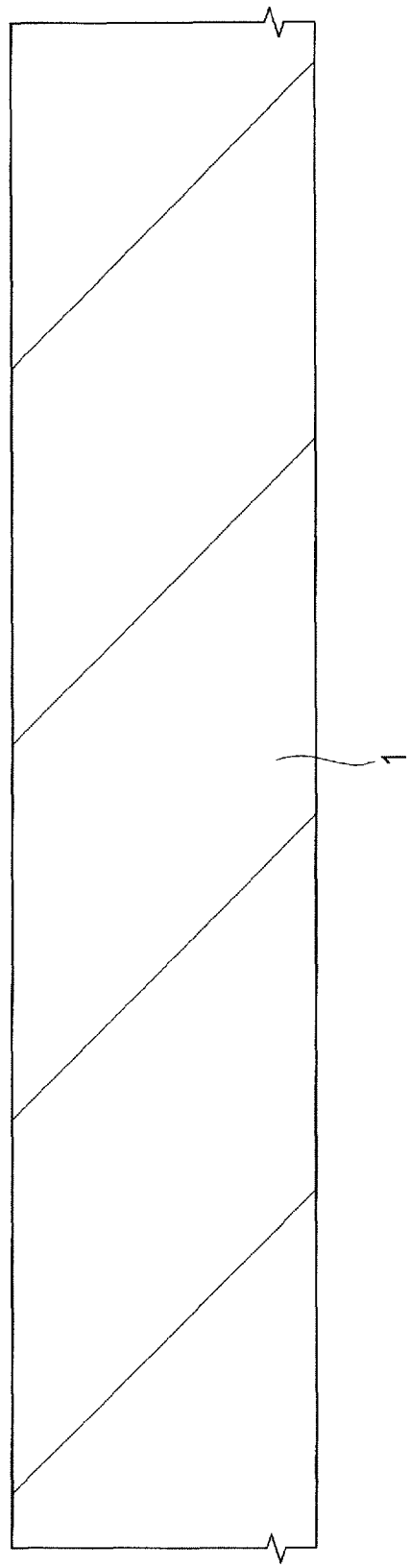
FIG. 5 is an essential-part cross-sectional view in a manufacturing step of the semiconductor device of the first embodiment.

First, as shown in FIG. 5, the semiconductor substrate 1 is prepared (Step S11 of FIG. 3). In the Step S11, there is prepared the semiconductor substrate 1 formed of a p type single crystal silicon (Si) having a specific resistance of, for example, about 1 to 10 Ωcm, or the like.

Figure 6:
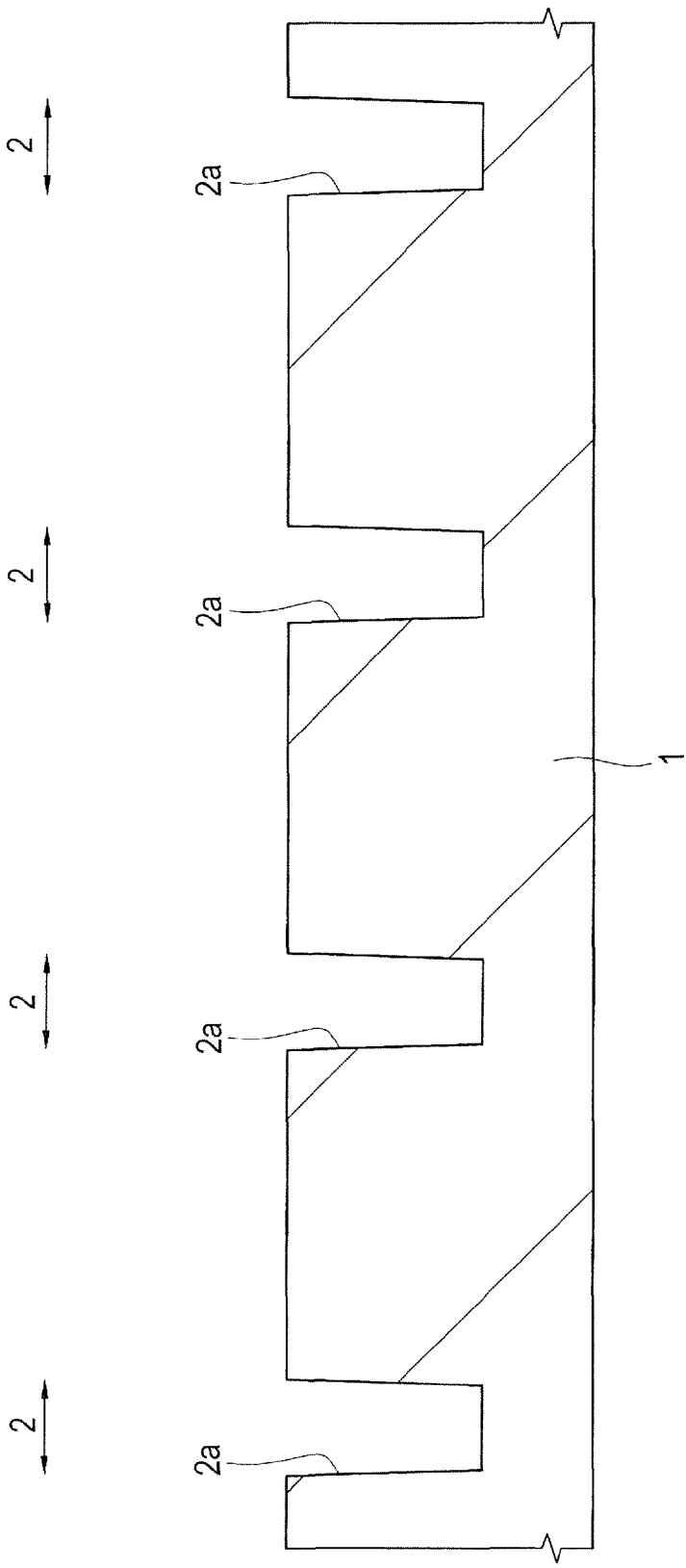
FIG. 6 is an essential-part cross-sectional view in a manufacturing step of the semiconductor device of the first embodiment.

Then, as shown in FIG. 6, in each element isolation region 2, each element isolation trench 2a is formed (Step S12 of FIG. 3). In the Step S12, the semiconductor substrate 1 is dry etched. As a result, in the semiconductor substrate 1, there are formed the element isolation trenches 2a with a depth of, for example, about 300 nm.

Incidentally, in Step S12, over the entire main surface (front surface) of the semiconductor substrate 1, an insulation film formed of silicon oxide (not shown), and an insulation film formed of silicon nitride (not shown) are successively formed. Then, by dry etching with a photoresist pattern (not shown) as an etching mask, there can be formed the element isolation trenches 2a.

Figure 7:
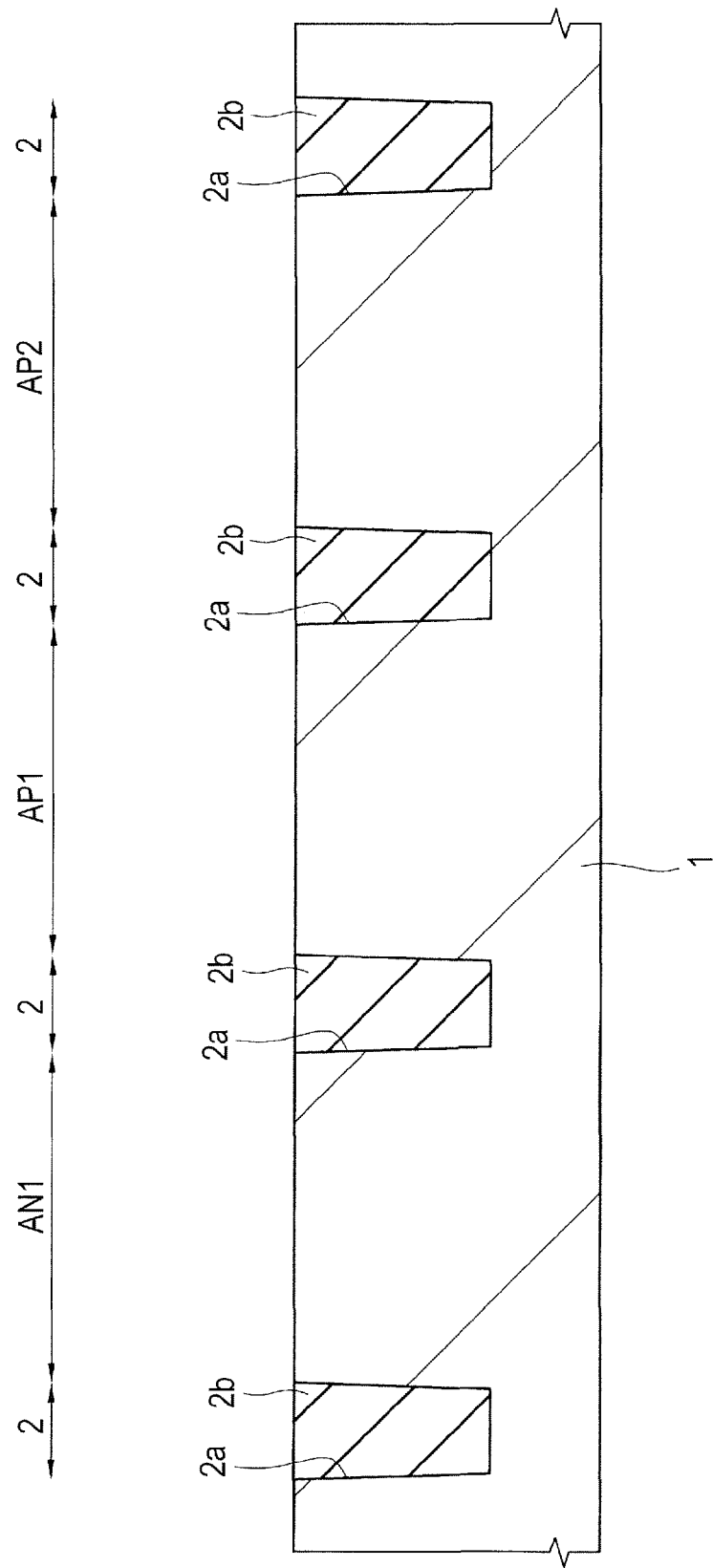
FIG. 7 is an essential-part cross-sectional view in a manufacturing step of the semiconductor device of the first embodiment.

Then, as shown in FIG. 7, in each element isolation region 2, there is formed an insulation film 2b (Step S13 of FIG. 3). In the Step S13, over the entire main surface (front surface) of the semiconductor substrate 1, the insulation film 2b is formed in such a manner as to fill the element isolation trench 2a. After performing a heat treatment (annealing treatment) for sintering the insulation film 2b embedded in the element isolation trench 2a, the insulation film 2b is polished by a CMP (Chemical Mechanical Polishing) method. The insulation film 2b is formed of, for example, a silicon oxide film, and is formed by, for example, a plasma CVD (Chemical Vapor Deposition) method. Whereas, the heat treatment can be performed by subjecting the semiconductor substrate 1 to a heat treatment at, for example, about 400 to 1200° C.

Incidentally, the following procedure is also acceptable: before the formation of the insulation film 2b, over the entire main surface (front surface) of the semiconductor substrate 1 including the insides of the element isolation trenches 2a, for example, an insulation film formed of silicon nitride (not shown) is formed thinly; this prevents the oxidation of the sidewalls of the element isolation trenches 2a by the heat treatment.

Further, after polishing by the CMP method, there is performed a procedure for reducing the difference in level between the insulation film 2b embedded in each element isolation trench 2a and the semiconductor substrate 1. FIG. 7 shows the case where the height position of the top surface of the insulation film 2b in each element isolation trench 2a is generally equal to the height position of the top surface of the semiconductor substrate 1, and the difference in level is reduced.

In this manner, as shown in FIG. 7, in each element isolation region 2, the insulation film 2b is formed by a STI method. Then, in the semiconductor substrate 1, the element isolation regions 2 define (mark out) the MISFET formation regions (active regions) AN1, AP1, and AP2. Then, in the MISFET formation regions AN1, AP1, and AP2, various semiconductor elements (e.g., QN1, QP1, and QP2 which are MISFETs described later) are formed in the subsequent steps.

Figure 8:
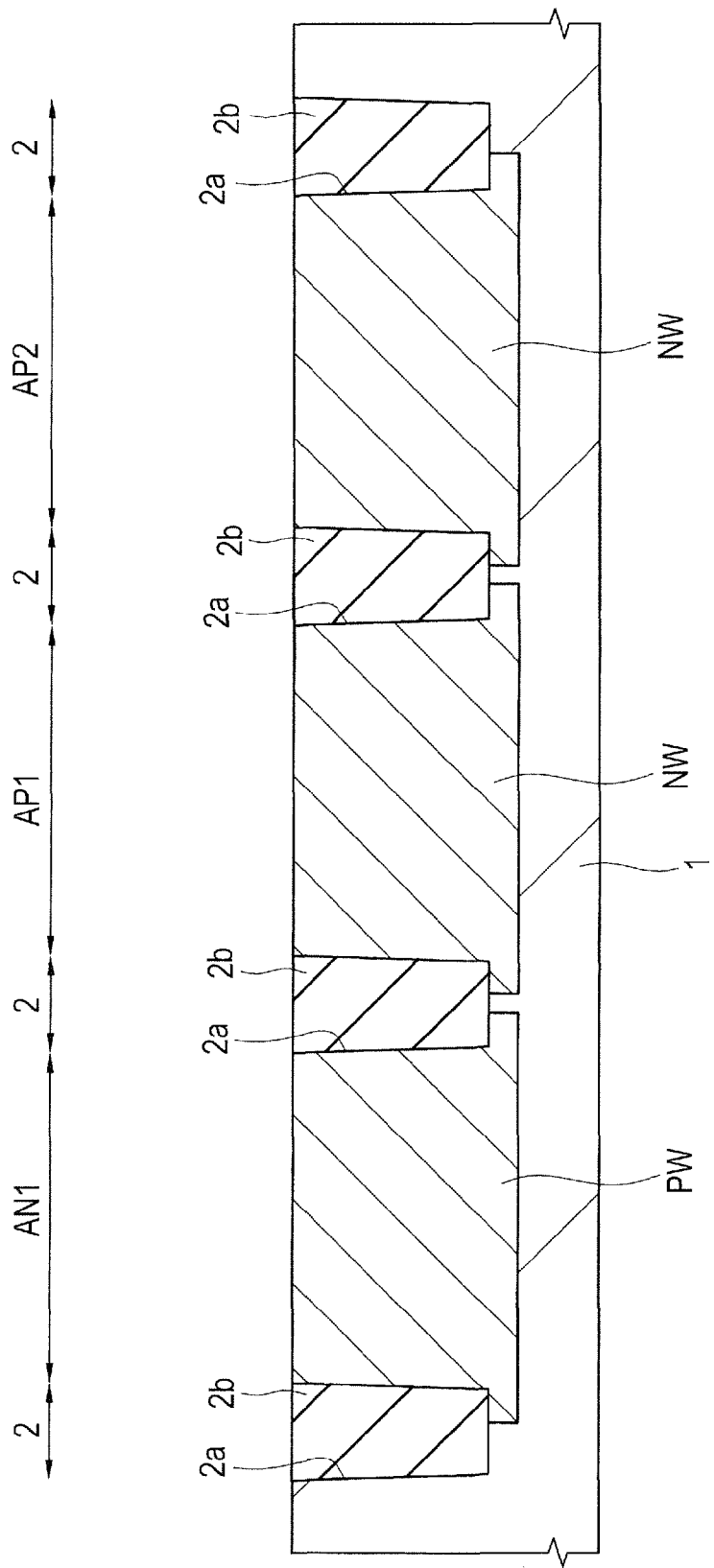
FIG. 8 is an essential-part cross-sectional view in a manufacturing step of the semiconductor device of the first embodiment.

Then, as shown in FIG. 8, there is performed a step of forming a well region from the top surface to a prescribed depth of the semiconductor substrate 1 (Step S14 of FIG. 3). In the Step S14, the step of forming a well region is repeated twice. In the first step, in the semiconductor substrate 1, there is formed a p type well region PW containing p type impurities (e.g., boron). In the second step, in the semiconductor substrate 1, there is formed an n type well region NW containing n type impurities (e.g., phosphorus or arsenic).

The p type well region PW can be formed by introducing p type impurities into the semiconductor substrate 1 using, for example, an ion implantation method. First, over the entire main surface (front surface) of the semiconductor substrate 1, a photoresist layer is coated. Then, the photoresist layer is exposed to light, and developed. As a result, a photoresist pattern (not shown) is formed in such a manner as to have an opening in the MISFET formation region AN1. Then, using the formed photoresist pattern as a mask, boron (B) is ion-implanted in a concentration of, for example, $5\times10^{12}$ to $5\times10^{13}/cm^2$. As a result, there is formed a p type well region PW with a concentration of impurities (impurity concentration) of $5\times10^{17}$ to $5\times10^{18}/cm^3$. Then, the photoresist pattern is removed.

The n type well region NW can be formed by introducing n type impurities into the semiconductor substrate 1 using, for example, an ion implantation method. First, over the entire main surface (front surface) of the semiconductor substrate 1, a photoresist layer is coated. Then, the photoresist layer is exposed to light, and developed. As a result, a photoresist pattern (not shown) is formed in such a manner as to have an opening in the MISFET formation regions AN1 and AN2. Then, using the formed photoresist pattern as a mask, phosphorus (P) or arsenic (As) is ion-implanted in a concentration of, for example, $5\times10^{12}$ to $5\times10^{13}/cm^2$. As a result, there is formed an n type well region NW with a concentration of impurities (impurity concentration) of $5\times10^{17}$ to $5\times10^{18}/cm^3$. Then, the photoresist pattern is removed.

Figure 9:
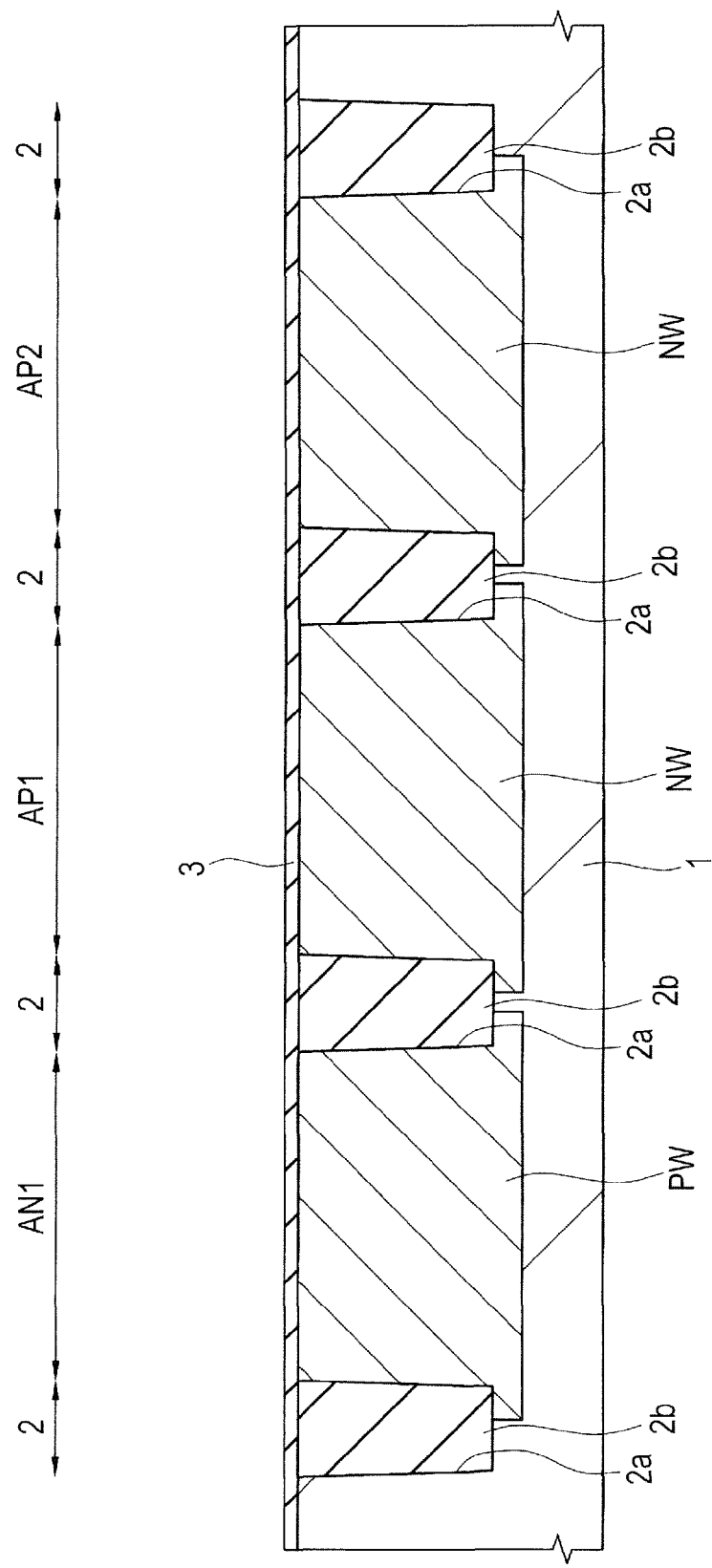
FIG. 9 is an essential-part cross-sectional view in a manufacturing step of the semiconductor device of the first embodiment.

Then, as shown in FIG. 9, over the semiconductor substrate 1, there is formed an insulation film 3 (Step S15 of FIG. 3). In the Step S15, over the entire main surface (front surface) of the semiconductor substrate 1, for example, by a thermal oxidation method, there is formed the insulation film 3 with a thickness of, for example, about 2 nm, and formed of silicon oxide.

Figure 10:
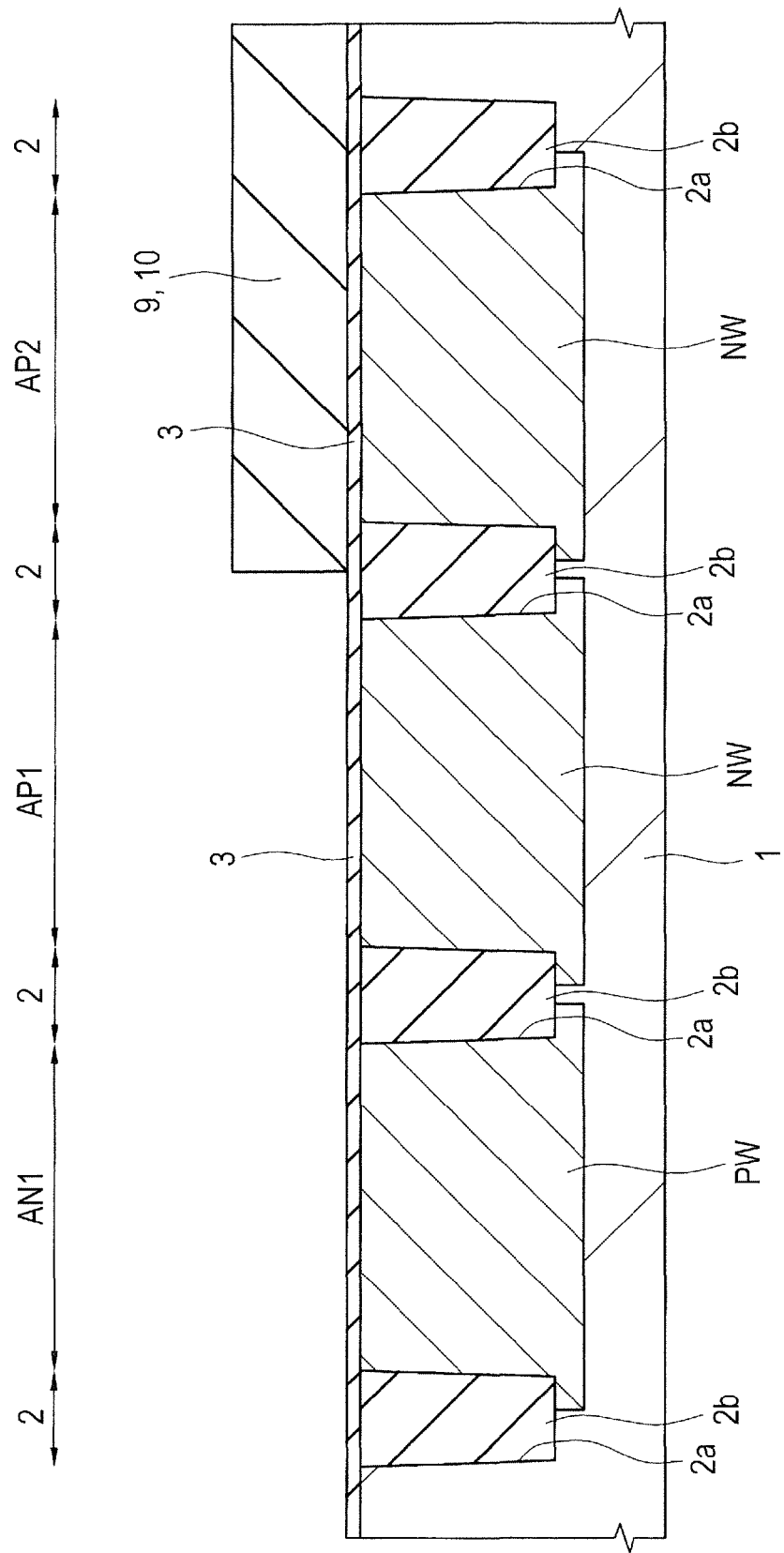
FIG. 10 is an essential-part cross-sectional view in a manufacturing step of the semiconductor device of the first embodiment.

Then, as shown in FIG. 10, over the semiconductor substrate 1, there is formed a mask film 9 (Step S16 of FIG. 3). In the Step S16, for example, by a thermal CVD method, there is formed the mask film 9 with a thickness of, for example, about 5 to 30 nm. The mask film 9 prevents nitriding of the insulation film 3 in the MISFET formation region AP2 in a subsequent step (Step S17 of FIG. 3). Further, the mask film 9 prevents the formation of a metal-containing film 41 (see FIG. 12) over the insulation film 3 in the MISFET formation region AP2 in a subsequent step (Step S18 of FIG. 3). Still further, the mask film 9 is removed by wet etching in a subsequent step (Step S19 of FIG. 3). For this reason, as the mask film 9, there is preferably used a film formed of one or more of silicon oxide such as Tetraethoxysilane; TEOS, silicon nitride (SiN), and titanium nitride (TiN).

After forming the mask film 9, over the entire main surface (front surface) of the semiconductor substrate 1, a photoresist layer is coated. The photoresist layer is exposed to light and is developed. As a result, a photoresist pattern (not shown) is formed in such a manner as to have an opening in the MISFET formation regions AN1 and AP1. Then, with the photoresist pattern as an etching mask, the mask film 9 is dry etched. Accordingly, in the MISFET formation regions AN1 and AP1, the mask film 9 is removed, and the insulation film 3 is exposed. Thereafter, for example, an ashing treatment and a washing treatment using a treatment solution such as a SPM (Sulfuric acid-Hydrogen Peroxide Mixture) solution are performed, thereby to remove the photoresist pattern. As a result, a hard mask pattern 10 formed of the mask film 3 is formed in such a manner as to have an opening in the MISFET formation regions AN1 and AP1, and to cover the insulation film 3 in the MISFET formation region AP2. Namely, the hard mask pattern 10 formed of the mask film 9 is formed in such a manner as to expose the insulation film 3 in the MISFET formation regions AN1 and AP1, and to cover the insulation film 3 in the MISFET formation region AP2.

Figure 11:
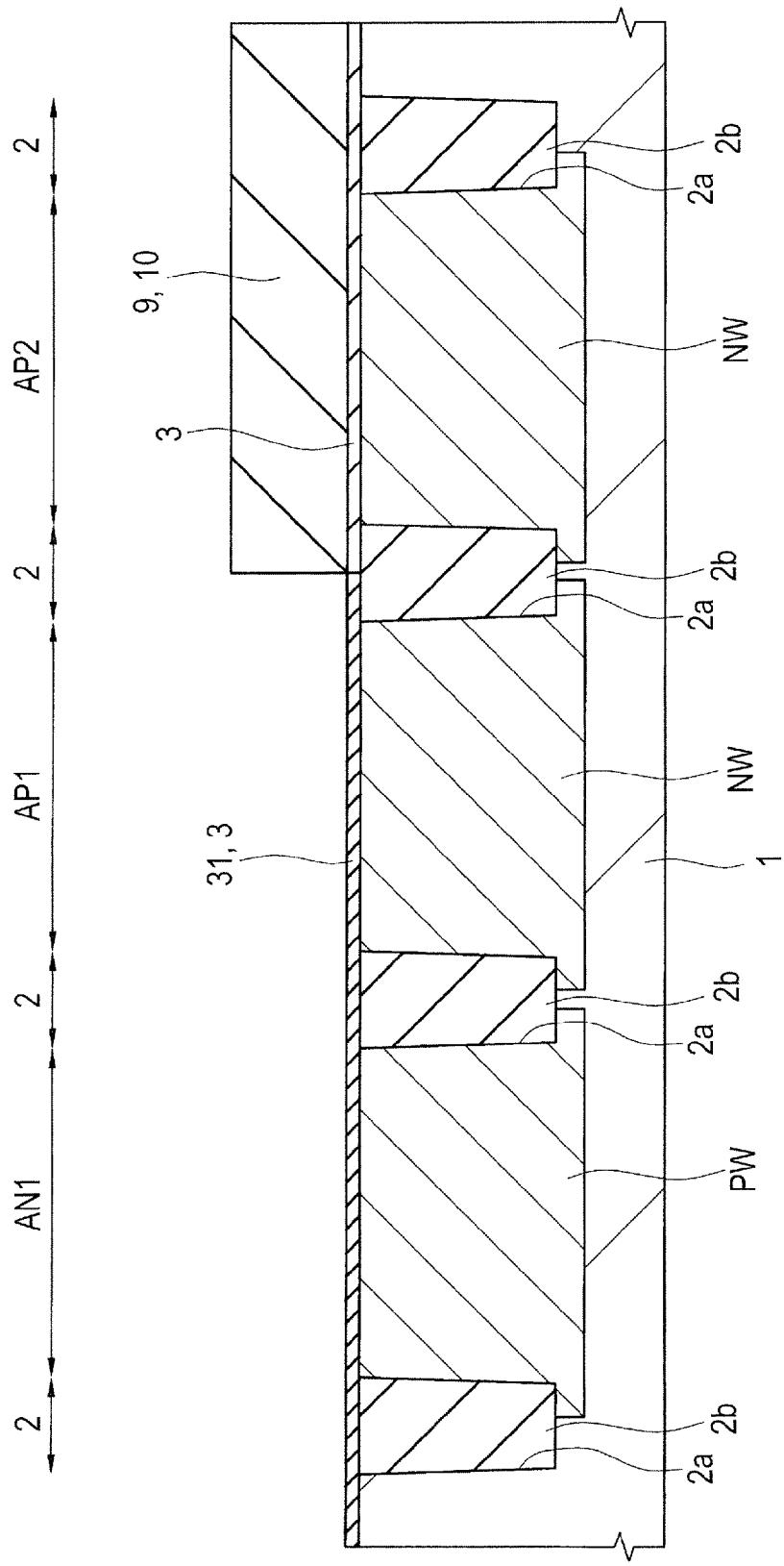
FIG. 11 is an essential-part cross-sectional view in a manufacturing step of the semiconductor device of the first embodiment.

Then, as shown in FIG. 11, the semiconductor substrate 1 is subjected to a nitriding treatment (Step S17 of FIG. 3). In the Step S17, the entire main surface (front surface) of the semiconductor substrate 1 except for the insulation film 3 in the MISFET formation region AP2 covered with the mask film 9 is subjected to a nitriding treatment. By the nitriding treatment, the insulation film 3 formed of silicon oxide in the MISFET formation regions AN1 and AP1 is nitrided, resulting in an insulation film 31 formed of silicon oxynitride. At this step, the concentration of nitrogen in the insulation film 31 in the MISFET formation regions AN1 and AP1 is set so as to be, for example, about 10 atom %.

The nitriding treatment is performed by, for example, plasma nitriding or thermal nitriding. The plasma nitriding is the following method: a plasma excites a nitrogen type gas such as a nitrogen ($N_2$) gas to generate nitrogen ions or nitrogen radicals (active species); the semiconductor substrate 1 is exposed thereto, so that the substrate surface is subjected to a nitriding treatment by nitrogen ions or nitrogen radicals (active species). Whereas, the thermal nitriding is the following method: in an atmosphere such as a nitrogen monoxide (NO) gas, the substrate is held at a high temperature such as about 1000° C., thereby to subject the substrate surface to a nitriding treatment.

Figure 12:
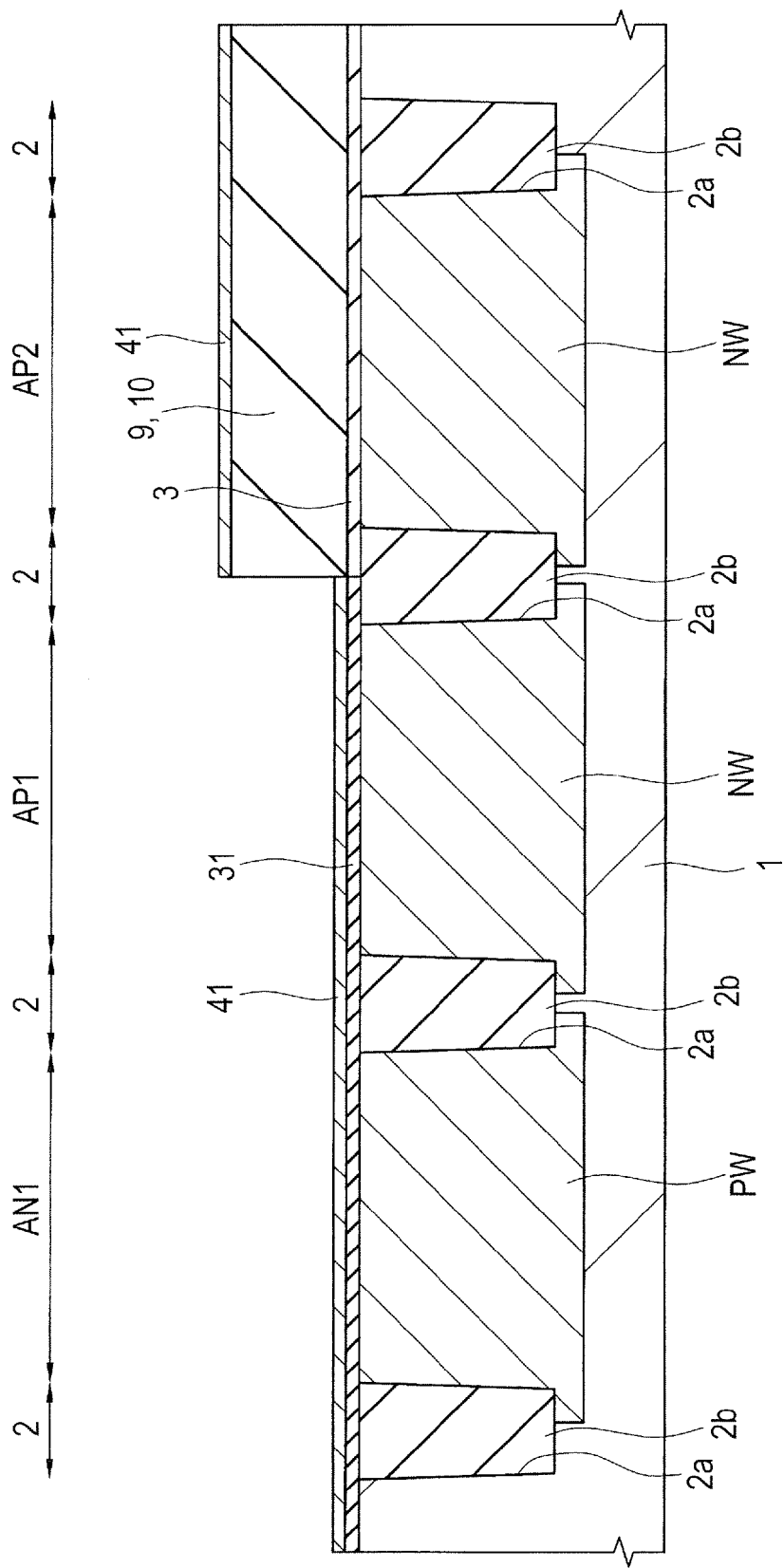
FIG. 12 is an essential-part cross-sectional view in a manufacturing step of the semiconductor device of the first embodiment.
Figure 13:
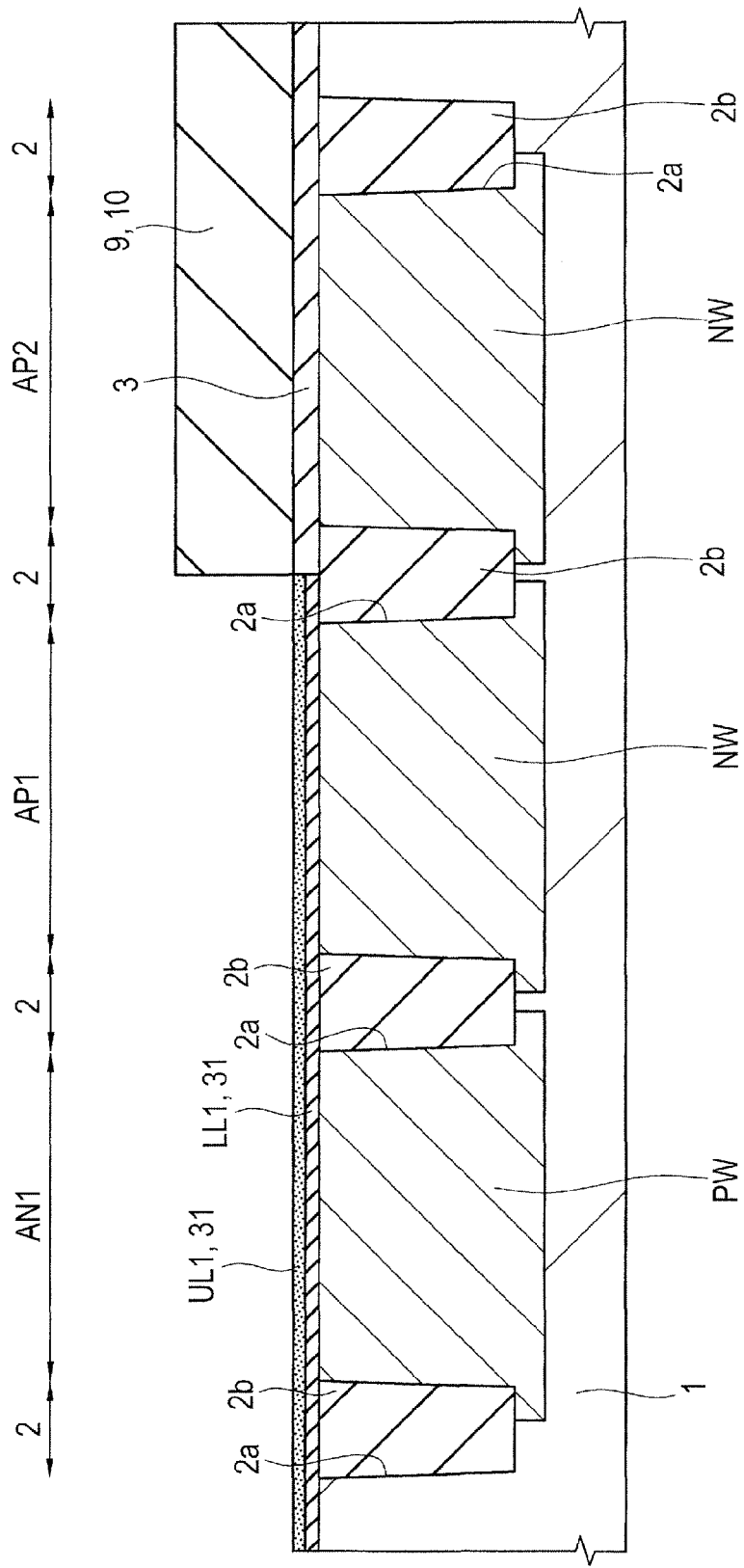
FIG. 13 is an essential-part cross-sectional view in a manufacturing step of the semiconductor device of the first embodiment.

Then, as shown in FIG. 12, over the semiconductor substrate 1, a metal-containing film 41 is formed (deposited) (Step S18 of FIG. 3). In the Step S18, with the insulation film 3 in the MISFET formation region AP2 being covered with the mask film 9, the metal-containing film 41 with a thickness of, for example, about 1 nm is formed over the entire main surface (front surface) of the semiconductor substrate 1 by, for example, an ALD (Atomic Layer Deposition) method. As a result, in the MISFET formation regions AN1 and AP1, the metal-containing film 41 with a thickness of, for example, about 1 nm is formed over the insulation film 31 with a thickness of, for example, about 2 nm, and formed of silicon oxynitride.

As the metal-containing film 41, there is formed the one containing a metal such as hafnium (Hf), aluminum (Al), or titanium (Ti). Further, when the metal contained in the metal-containing film 41 is, for example, titanium (Ti), as the metal-containing film 41, there can also be formed the one containing, for example, titanium nitride (TiN). Out of these, hafnium (Hf) is preferable in that it produces a larger effect of enabling adjustment of the threshold voltage (Vth) without adjusting the impurity concentration of the channel region than those of other metals. Whereas, when the metal-containing film 41 contains hafnium, the metal-containing film 41 is formed of one or more of hafnium oxide (HfO), hafnium oxynitride (HfON), and HfSiON. At this step, the concentration of hafnium in the metal-containing film 41 is set to be, for example, about $5 \times 10^{13}$ atoms/cm$^2$.

Incidentally, in a subsequent step (Step S19 of FIG. 3), a part of the metal-containing film 41 (see FIG. 14) may be etched together with the mask film 9. For this reason, in consideration of the reduction due to etching in Step S19, in Step S18, the concentration of hafnium is preferably set to be an amount about 1.5 to 2.0 times the desirable concentration. At this step, the concentration of hafnium in the metal-containing film 41 is set to be, for example, about $7.5 \times 10^{13}$ to $1 \times 10^{14}$ atoms/cm$^2$.

FIG. 12 shows the case where the metal-containing film 41 is definitely formed. However, there is also a case where a metal-containing film is not definitely formed, and a metal is added to the insulation film 31. FIG. 13 shows the following state: a metal is added to the insulation film 31, so that in the MISFET formation regions AN1 and AP1, there are formed an upper layer film UL1 formed of the insulation film 31 including a metal added therein, and a lower layer film LL1 formed of the insulation film 31 not including a metal added therein.

Figure 14:
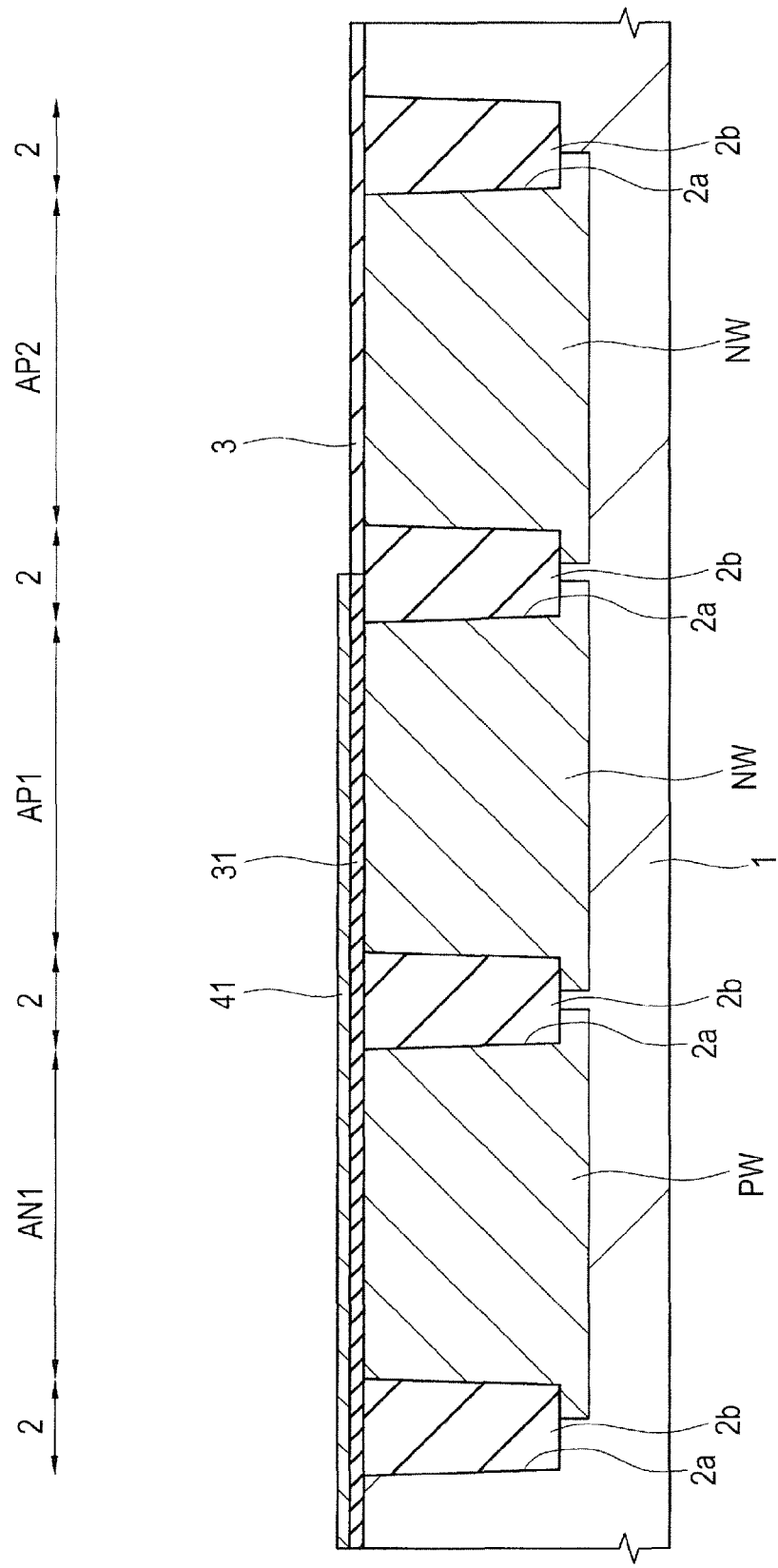
FIG. 14 is an essential-part cross-sectional view in a manufacturing step of the semiconductor device of the first embodiment.

Then, as shown in FIG. 14, wet etching is performed (Step S19 of FIG. 3). In the Step S19, the mask film 9 is removed by wet etching. When the mask film 9 is formed of silicon oxide such as TEOS, silicon nitride (SiN), or titanium nitride (TiN), as the chemical solution (etchant) for wet etching, there is preferably used hydrofluoric acid, or hot phosphoric acid or hydrofluoric acid. Then, in the MISFET formation region AP2, the mask film 9 is removed, and the insulation film 3 is exposed.

Figure 15:
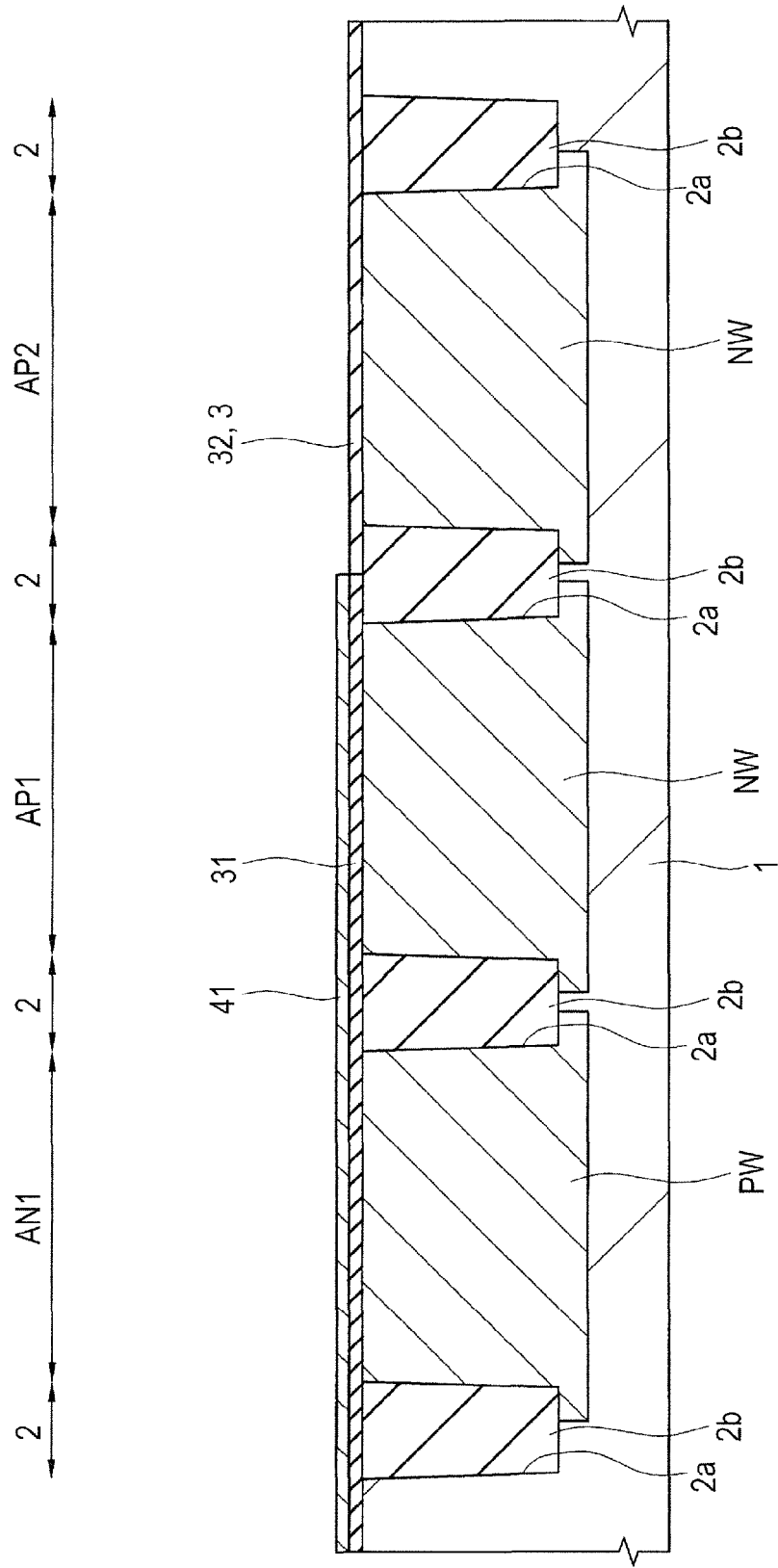
FIG. 15 is an essential-part cross-sectional view in a manufacturing step of the semiconductor device of the first embodiment.

Then, as shown in FIG. 15, the semiconductor substrate 1 is subjected to a nitriding treatment (Step S20 of FIG. 3). In the Step S20, the entire main surface (front surface) of the semiconductor substrate 1 including the portion of the insulation film 3 in the MISFET formation region AP2 not nitrided in Step S17 is subjected to a nitriding treatment. By the nitriding treatment, the insulation film 3 formed of silicon oxide in the MISFET formation region AP2 is nitrided, resulting in an insulation film 32 formed of silicon oxynitride. At this step, the concentration of nitrogen in the insulation film 32 in the MISFET formation region AP2 is set to be, for example, about 5 atom %.

On the other hand, in Step S20, in the MISFET formation regions AN1 and AP1, the insulation film 31 including the metal-containing film 41 formed on the surface thereof, and formed of silicon oxynitride may be further nitrided. However, in the MISFET formation region AN1, when the insulation film 31 is further nitrided, the positive fixed charges in the resulting gate insulation film GI1(see FIG. 1) may increase. For the n channel type MISFET QN1 to be formed in the MISFET formation region AN1, an increase in positive fixed charges in the gate insulation film GI1 may result in a smaller (reduction of) threshold voltage (Vth). In such a case, in order to inhibit the reduction of the threshold voltage (Vth) of the MISFET QN1, preferably, in Step S17 or Step S20, a nitriding treatment is performed with the MISFET formation region AN1 being covered; in this manner or other manners, the concentration of nitrogen in the insulation film 31 in the MISFET formation region AN1 is prevented from exceeding about 5 atom %.

The nitriding treatment in Step S20 is also performed in the same manner as the nitriding treatment in Step S17.

Figure 16:
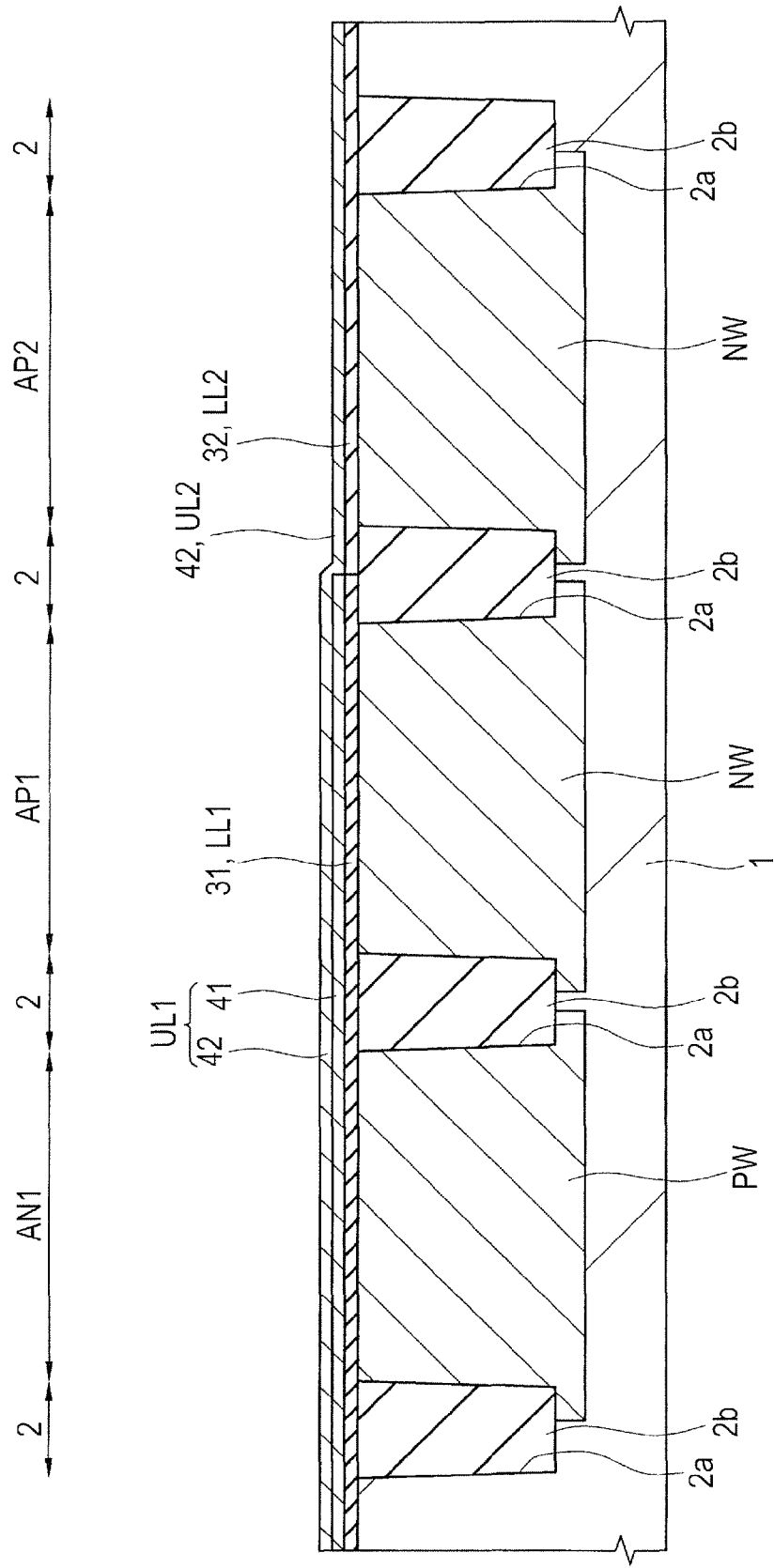
FIG. 16 is an essential-part cross-sectional view in a manufacturing step of the semiconductor device of the first embodiment.
Figure 17:
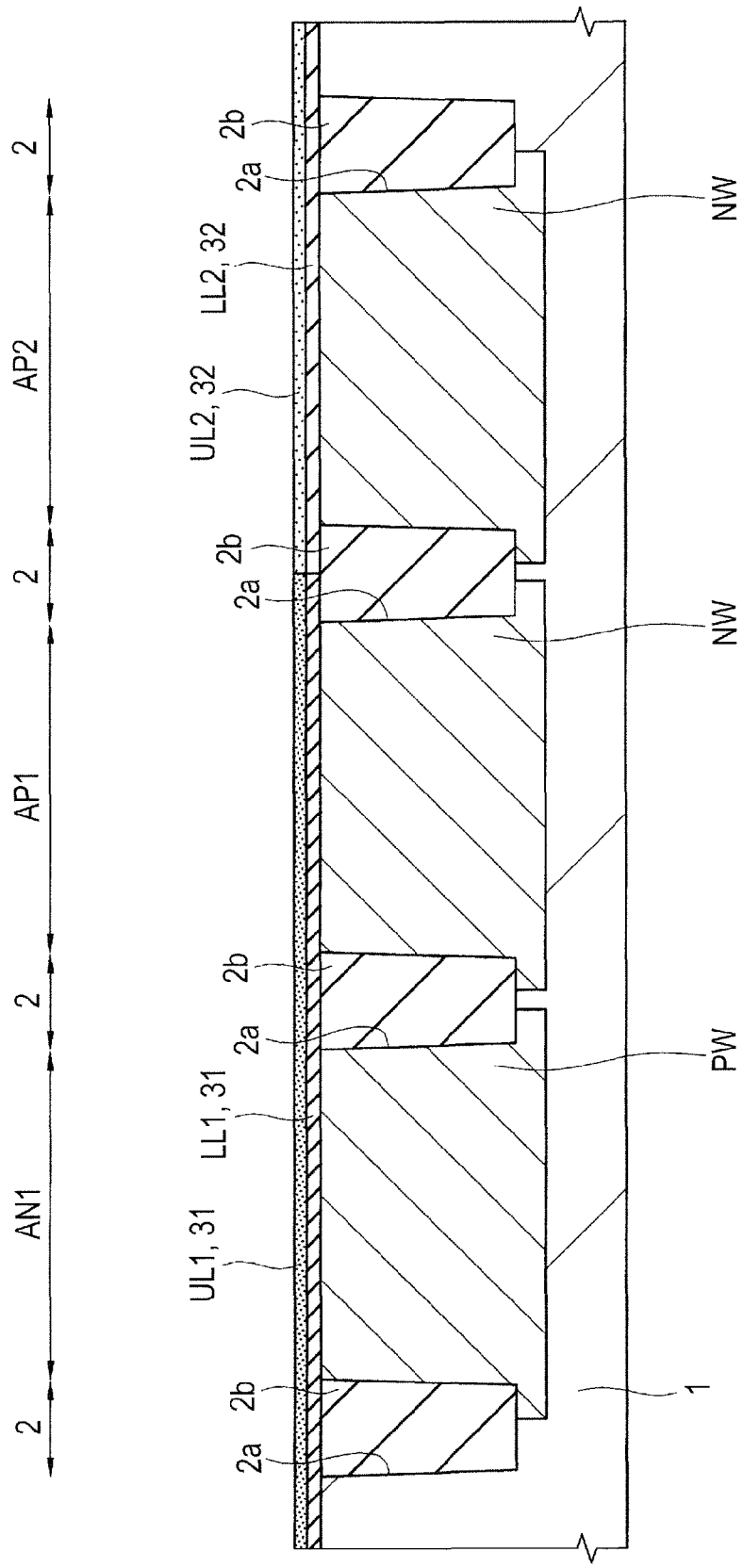
FIG. 17 is an essential-part cross-sectional view in a manufacturing step of the semiconductor device of the first embodiment.

Then, as shown in FIG. 16, over the semiconductor substrate 1, the metal-containing film 42 is formed (deposited) (Step S21 of FIG. 3). In the Step S21, over the entire main surface (front surface) of the semiconductor substrate 1, including the insulation film 32 in the MISFET formation region AP2 not including the metal-containing film 41 formed (deposited) thereover in Step S18, the metal-containing film 42 with a thickness of, for example, about 1 nm is formed by, for example, an ALD method. As a result, in the MISFET formation region AP2, over the surface of the insulation film 32 with a thickness of, for example, about 2 nm, and formed of silicon oxynitride, there is formed the metal-containing film 42 with a thickness of, for example, about 1 nm. Whereas, in the MISFET formation regions AN1 and AP1, over the surface of the metal-containing film 41 with a thickness of, for example, about 1 nm, there is formed the metal-containing film 42 with a thickness of, for example, about 1 nm.

The insulation film 31 in the MISFET formation regions AN1 and AP1 forms the lower layer film LL1 of the gate insulation film GI1 (see FIG. 20) to be formed in the subsequent step (Step S24 of FIG. 4). The metal-containing film 41 and the metal-containing film 42 in the MISFET formation regions AN1 and AP1 form the upper layer film UL1 of the gate insulation film GI1 (see FIG. 20) to be formed in the subsequent step (Step S24 of FIG. 4). The insulation film 32 in the MISFET formation region AP2 forms the lower layer film LL2 of the gate insulation film GI2 (see FIG. 20) to be formed in the subsequent step (Step S24 of FIG. 4). The metal-containing film 42 in the MISFET formation region AP2 forms the upper layer film UL2 of the gate insulation film GI2 (see FIG. 20) to be formed in the subsequent step (Step S24 of FIG. 4). Then, the thickness of the upper layer film UL2 formed of the metal-containing film 42 is smaller than the thickness of the upper layer film UL1 formed of the metal-containing films 41 and 42.

For the metal-containing film 42, there is used the same material as that for the metal-containing film 41. Further, when the metal-containing film 42 contains hafnium, the concentration of hafnium in the metal-containing film 42 is set to be, for example, about $5 \times 10^{13}$ atoms/cm$^2$. Then, when the concentration of hafnium in the metal-containing film 41 is set to be, for example, about $5 \times 10^{13}$ atoms/cm$^2$ as described above, the concentration of hafnium in the upper layer film UL2 formed of the metal-containing film 42 is set to be, for example, about $5 \times 10^{13}$ atoms/cm$^2$. As a result, the concentration of hafnium in the upper layer film UL1 formed of the metal-containing films 41 and 42 can be set as, for example, about $1 \times 10^{14}$ atoms/cm$^2$.

FIG. 16 shows the case where the metal-containing film 42 is definitely formed. However, there is also a case where the metal-containing film is not definitely formed, and a metal is added to the insulation film 32. FIG. 17 shows the following state: a metal is added to the insulation film 32, so that in the MISFET formation region AP2, there are formed an upper layer film UL2 formed of the insulation film 32 including a metal added therein, and a lower layer film LL2 formed of the insulation film 32 not including a metal added therein. Incidentally, in FIG. 17, also in the MISFET formation regions AN1 and AP1, there are formed an upper layer film UL1 formed of the insulation film 31 including a metal added therein, and a lower layer film LL1 formed of the insulation film 31 not including a metal added therein.

Whereas, in FIG. 17, the dots of the upper layer film UL1 in the MISFET formation regions AN1 and AP1 are shown more thickly than the dots of the upper layer film UL2 in the MISFET formation region AP2. Such representation indicates that the concentration of the metal in the upper layer film UL1 in the MISFET formation regions AN1 and AP1 is larger than the concentration of the metal in the upper layer film UL2 in the MISFET formation region AP2.

Figure 18:
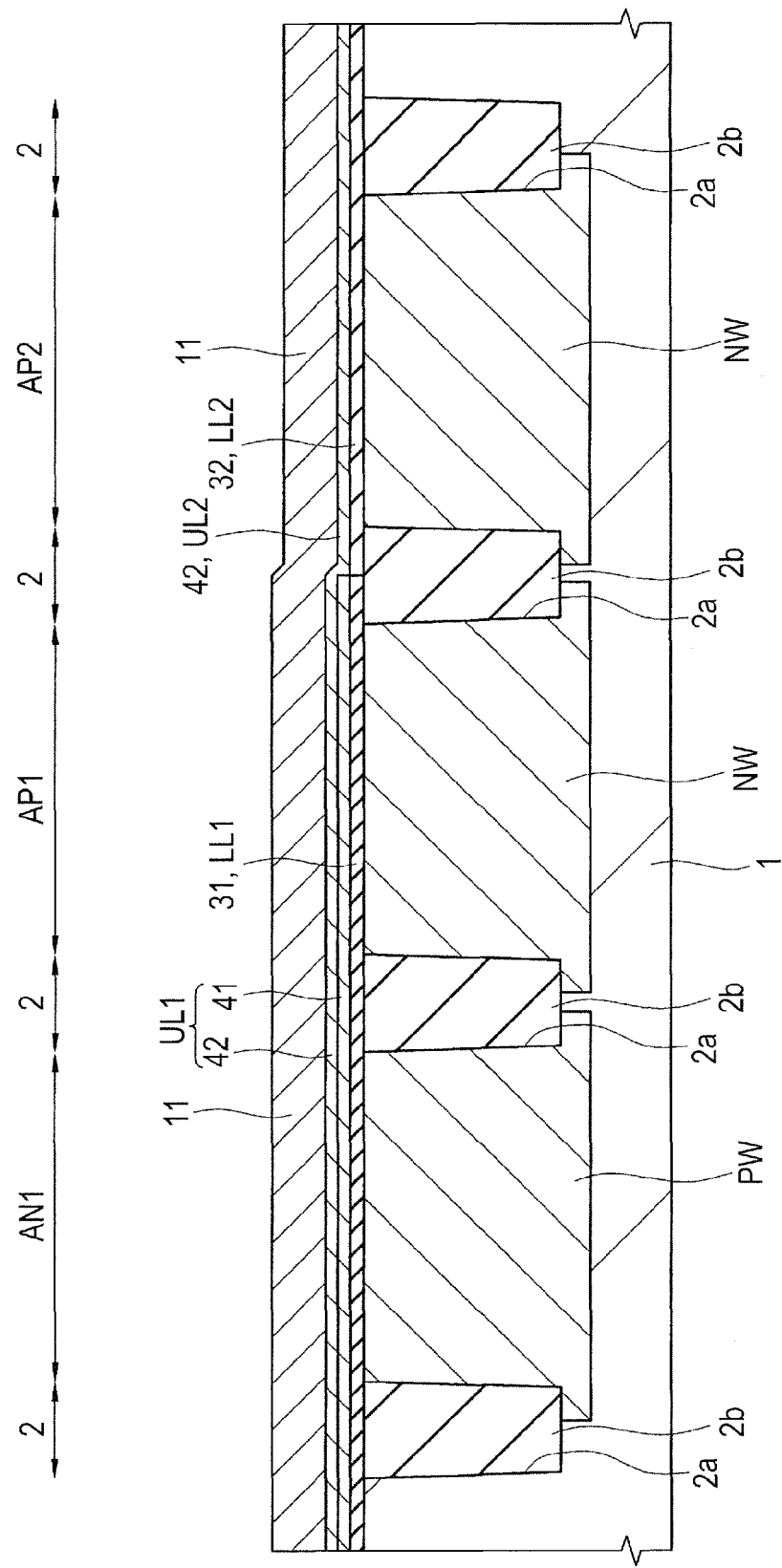
FIG. 18 is an essential-part cross-sectional view in a manufacturing step of the semiconductor device of the first embodiment.

Then, as shown in FIG. 18, over the semiconductor substrate 1, there is formed a gate electrode conductor film 11 (Step S22 of FIG. 4). In the Step S22, over the entire main surface (front surface) of the semiconductor substrate 1, there is formed the gate electrode conductor film 11. As the gate electrode conductor film 11, there can be used a conductor film formed of, for example, polycrystal silicon (doped polysilicon).

Figure 19:
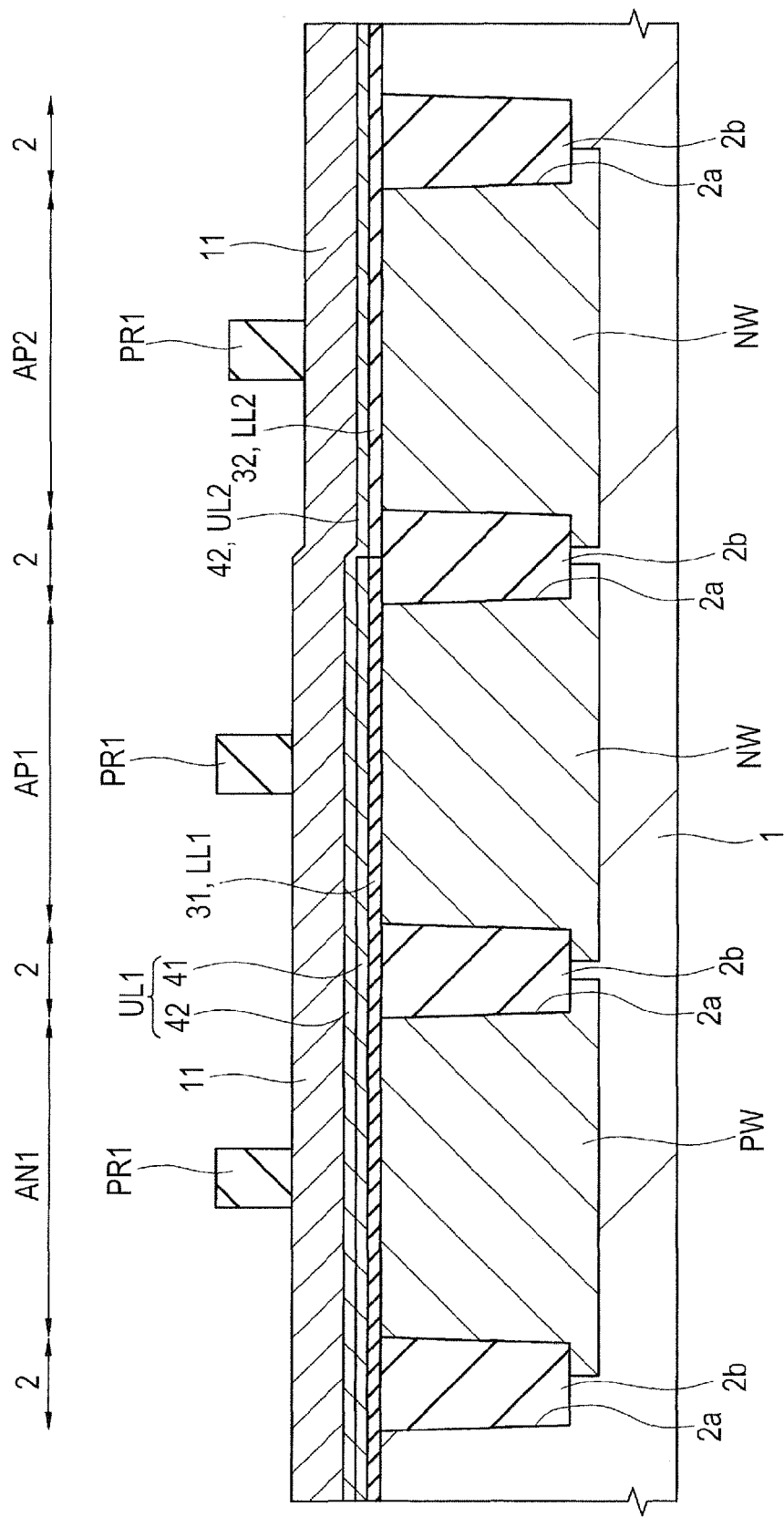
FIG. 19 is an essential-part cross-sectional view in a manufacturing step of the semiconductor device of the first embodiment.

Then, as shown in FIG. 19, over the entire main surface (front surface) of the semiconductor substrate 1, a photoresist layer is coated, and then, is exposed to light and developed, thereby to form a photoresist pattern PR1 (Step S23 of FIG. 4).

Then, there are formed the gate electrodes GE, and the gate insulation films GI1 and GI2 (Step S24 of FIG. 4). In the Step S24, by dry etching using the photoresist pattern PR1 as an etching mask, there are etched the conductor film 11, the metal-containing film 42, the metal-containing film 41, the insulation film 31, and the insulation film 32. As a result, as shown in FIG. 20, in the MISFET formation regions AN1 and AP1, there are formed the patterned gate electrodes GE and gate insulation film GI1. On the other hand, in the MISFET formation region AP2, there are formed the patterned gate electrode GE and gate insulation film GI2. Then, the photoresist pattern PR1 is removed. FIG. 20 shows the stage (state) at (in) which the photoresist pattern PR1 has been removed.

As shown in FIG. 20, the gate electrode GE is formed of the conductor film 11. The gate insulation film GI1 has the lower layer film LL1 formed of the insulation film 31, and the upper layer film UL1 formed over the lower layer film LL1, and formed of the metal-containing film 42 and the metal-containing film 41. The gate insulation film GI2 has the lower layer film LL2 formed of the insulation film 32, and the upper layer film UL2 formed over the lower layer film LL2, and formed of the metal-containing film 42.

Incidentally, as described by reference to FIGS. 13 and 17, in the case where the metal-containing film 41 and the metal-containing film 42 are not definitely formed, and a metal is added to the insulation film 31 and the insulation film 32, in Step S24, the conductor film 11, the insulation film 31 and the insulation film 32 are etched by dry etching. As a result, in the MISFET formation regions AN1 and AP1, there are formed the patterned gate electrode GE and gate insulation film GI1. In the MISFET formation region AP2, there are formed the patterned gate electrode GE and gate insulation film GI2. This state is shown in FIG. 21. Incidentally, in FIG. 21, in the MISFET formation regions AN1 and AP1, the gate insulation film GI1 has the upper layer film UL1 formed of the insulation film 31 including a metal added therein, and the lower layer film LL1 formed of the insulation film 31 not including a metal added therein. Whereas, in the MISFET formation region AP2, the gate insulation film GI2 has the upper layer film UL2 formed of the insulation film 32 including a metal added therein, and the lower layer film LL2 formed of the insulation film 32 not including a metal added therein.

Figure 22:
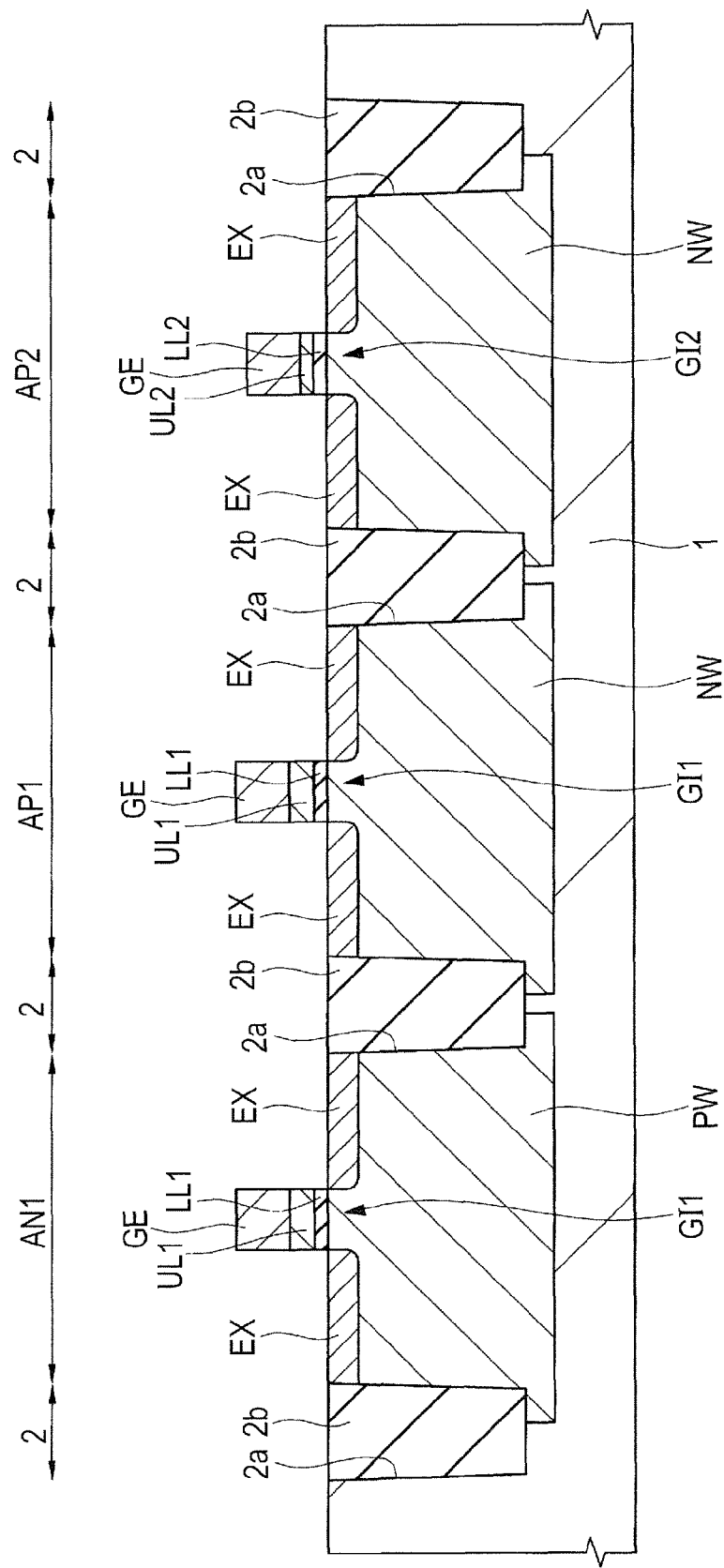
FIG. 22 is an essential-part cross-sectional view in a manufacturing step of the semiconductor device of the first embodiment.

Then, as shown in FIG. 22, there are formed extension regions EX (Step S25 of FIG. 4). In the Step S25, first, in the MISFET formation region AN1, n type impurities such as phosphorus (P) or arsenic (As) are ion-implanted into regions on opposite sides of the gate electrode GE in the p type well region PW, thereby to form n type extension regions EX. Whereas, in the MISFET formation regions AP1 and AP2, p type impurities such as boron (B) are ion-implanted into regions on the opposite sides of the gate electrode GE in the n type well region NW, thereby to form p type extension regions EX. During the ion implantation, the gate electrode GE can function as an ion implantation preventing mask. For this reason, the extension regions EX are formed in alignment (self-alignment) with the region immediately under the gate electrode GE.

Figure 23:
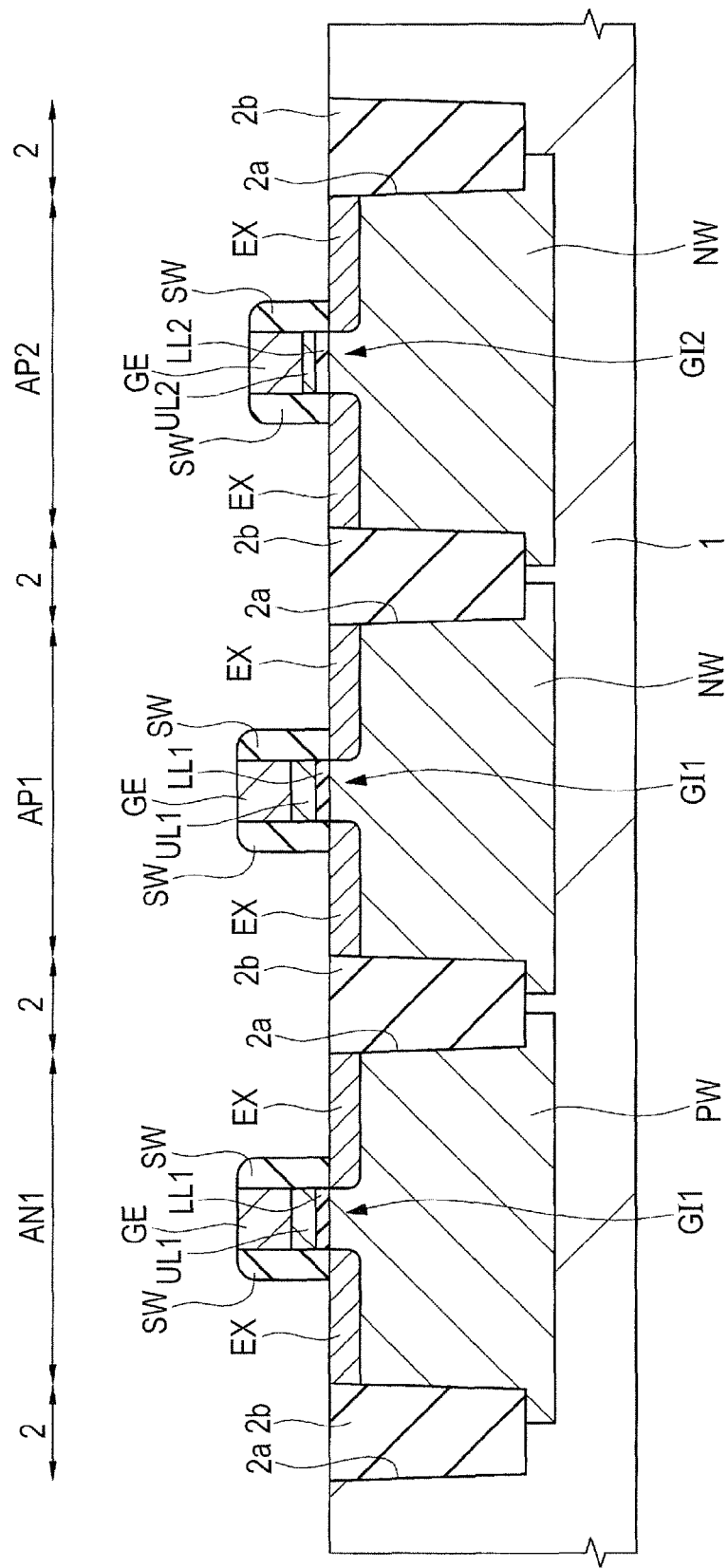
FIG. 23 is an essential-part cross-sectional view in a manufacturing step of the semiconductor device of the first embodiment.

Then, as shown in FIG. 23, over the sidewalls of the gate electrode GE, as sidewall insulation films, there are formed sidewall spacers SW formed of, for example, a silicon oxide film or a silicon nitride film, or a lamination film thereof (Step S26 of FIG. 4). In the Step S26, for example, over the entire main surface (front surface) of the semiconductor substrate 1, a silicon oxide film or a silicon nitride film or a lamination film thereof is deposited. The silicon oxide film or the silicon nitride film or a lamination film thereof is anisotropically etched by a RIE (Reactive Ion Etching) method, or the like, thereby to form the sidewall spacers SW.

Then, the source/drain regions SD are formed (Step S27 of FIG. 4). In the Step S27, in the MISFET formation region AN1, n type impurities such as phosphorus (P) or arsenic (As) are ion-implanted into regions on the opposite sides of the gate electrode GE and the sidewall spacers SW in the p type well region PW. As a result, the n type source/drain regions SD are formed. Whereas, in the MISFET formation regions AP1 and AP2, p type impurities such as boron (B) are ion-implanted into regions on the opposite sides of the gate electrode GE and the sidewall spacers SW in the n type well region NW. As a result, the p type source/drain regions SD are formed. During the ion implantation, the gate electrodes GE and the sidewall spacers SW on the sidewalls thereof can function as an ion implantation preventing mask. For this reason, the source/drain regions SD are formed in alignment (self-alignment) with the regions immediately under the gate electrodes GE. After the ion implantation for forming the source/drain regions SD, there is performed an annealing treatment for activating the introduced impurities. The annealing treatment can be performed by, for example, a flash lamp annealing treatment at about 1050° C.

Figure 24:
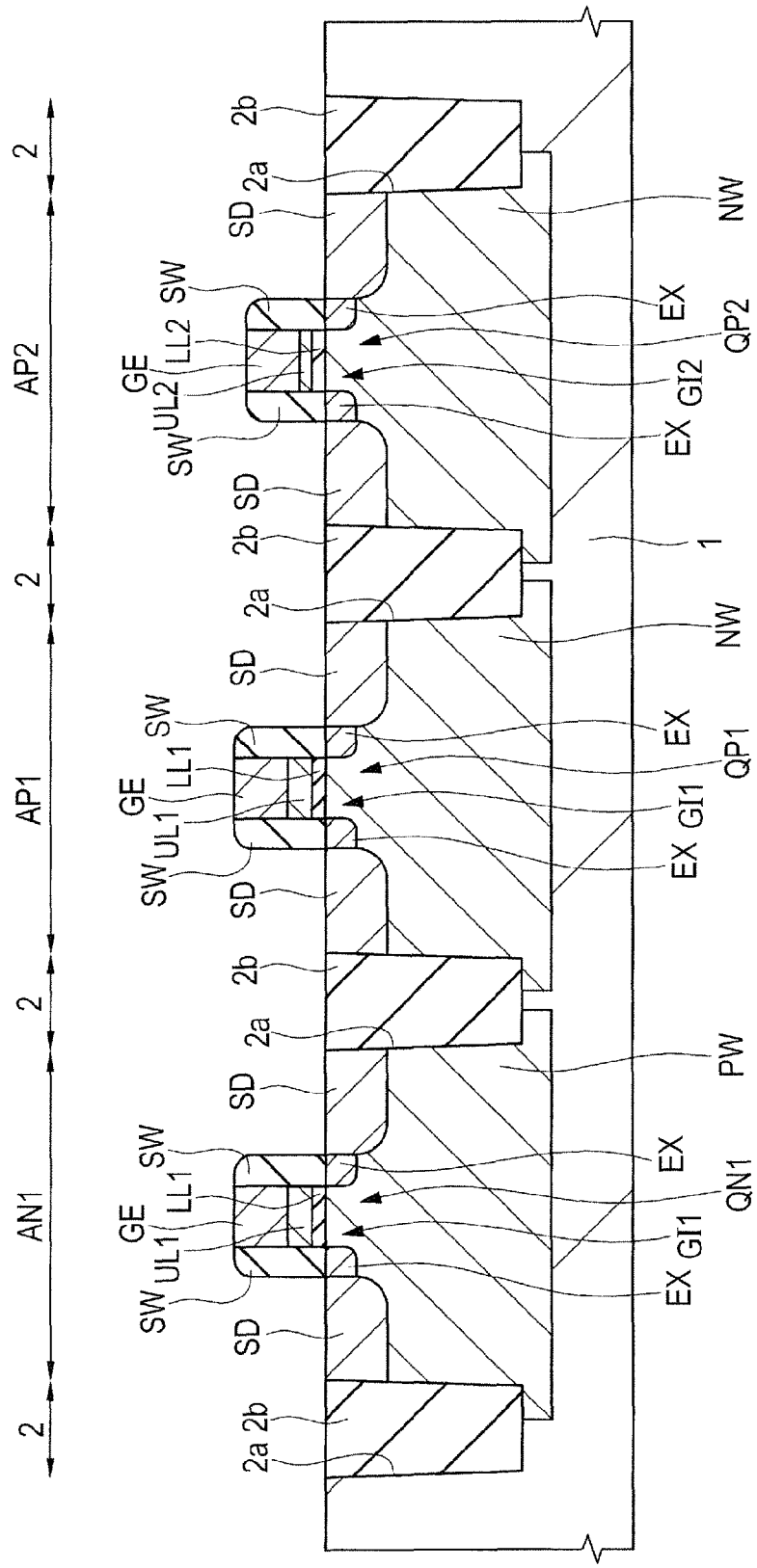
FIG. 24 is an essential-part cross-sectional view in a manufacturing step of the semiconductor device of the first embodiment.

In this manner, as shown in FIG. 24, a pair of the extension region EX formed on one side of the gate electrode GE and the source/drain region SD form a semiconductor region functioning as a source or a drain of a LDD structure. The source/drain regions SD are higher in impurity concentration and larger in depth (junction depth) than the extension region EX. Then, in the MISFET formation regions AN1, AP1, and AP2, MISFETs QN1, QP1, and QP2 are formed, respectively.

The MISFET QN1 formed in the MISFET formation region AN1 has the gate insulation film GI1 formed of the lower layer film LL1, and the upper layer film UL1 formed over the lower layer film LL1. The MISFET QP1 formed in the MISFET formation region AP1 has the gate insulation film GI1 formed of the lower layer film LL1, and the upper layer film UL1 formed over the lower layer film LL1. The MISFET QP2 formed in the MISFET formation region AP2 has the gate insulation film GI2 formed of the lower layer film LL2, and the upper layer film UL2 formed over the lower layer film LL2. The concentration of hafnium (metal) in the upper layer film UL2 is smaller than the concentration of hafnium (metal) in the upper layer film UL1. The concentration of nitrogen in the lower layer film LL2 is smaller than the concentration of nitrogen in the lower layer film LL1. Therefore, in the n type MISFET formation region AN1, there is formed the n channel type MISFET QN1 having a large threshold voltage (Vth); in the p type MISFET formation region AP1, there is formed the p channel type MISFET QP1 having a large threshold voltage (Vth); and in the p type MISFET formation region AP2, there is formed the p channel type MISFET QP2 having a small threshold voltage (Vth).

Incidentally, after Step S27, and before Step S28 described later, by a salicide technology, a low-resistance metal silicide layer formed of cobalt silicide, nickel silicide, or the like may be formed over the surfaces of the gate electrode GE and the source/drain regions SD.

Figure 25:
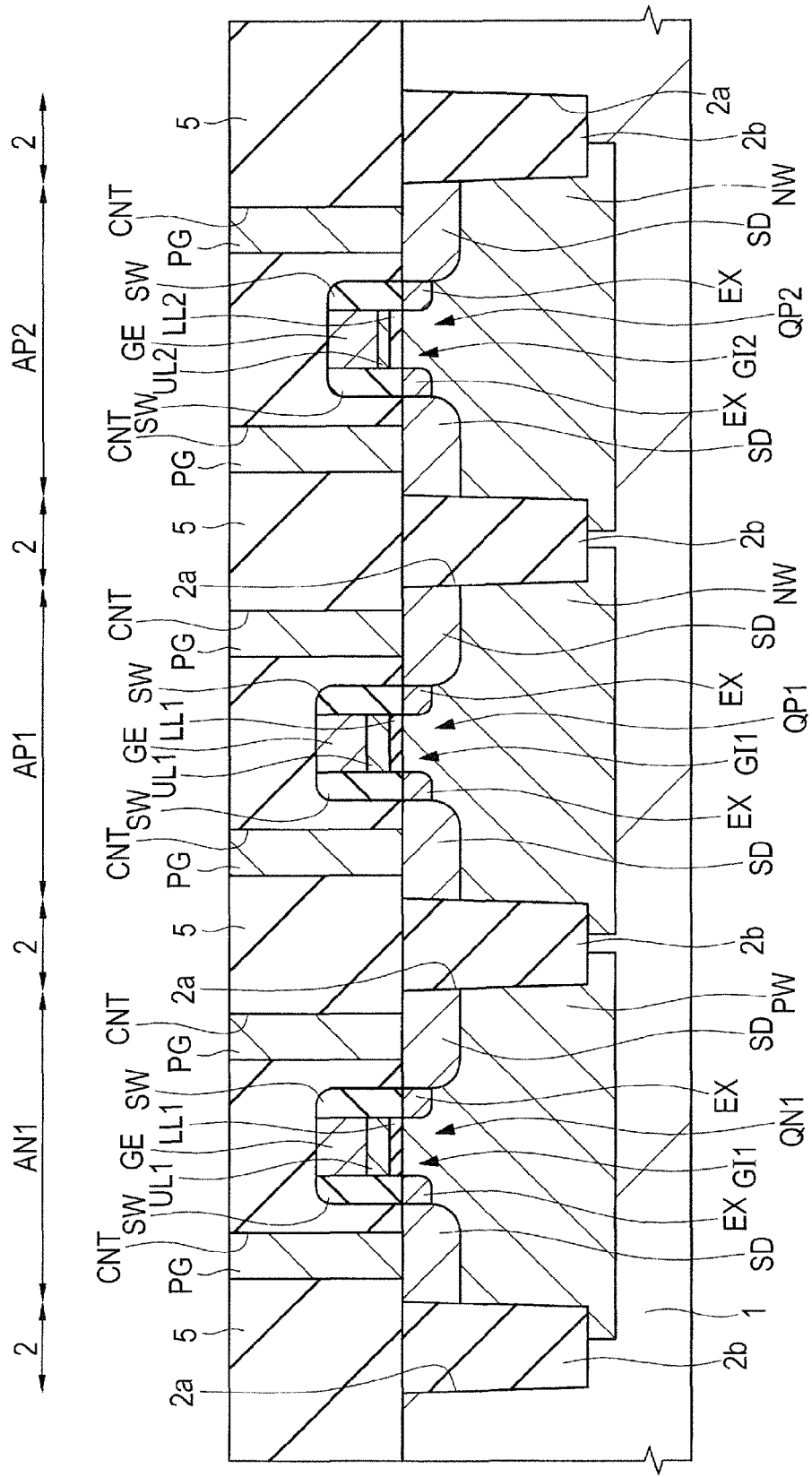
FIG. 25 is an essential-part cross-sectional view in a manufacturing step of the semiconductor device of the first embodiment.

Then, as shown in FIG. 25, there are formed the interlayer insulation film 5 and the plugs PG (Step S28 of FIG. 4).

In the Step S28, first, over the entire main surface (front surface) of the semiconductor substrate 1, there is formed the interlayer insulation film 5. Namely, the interlayer insulation film 5 is formed over the entire main surface (front surface) of the semiconductor substrate 1 in such a manner as to cover the gate electrodes GE and the sidewall spacers SW. The interlayer insulation film 5 is formed of, for example, a single film of silicon oxide film, or a lamination film of a silicon nitride film and a silicon oxide film thicker than this. Thereafter, the surface (top surface) of the interlayer insulation film 5 is subjected to polishing by a CMP method, or other treatments. As a result, the top surface of the interlayer insulation film 5 is planarized. Even when the uneven shape is formed at the surface of the interlayer insulation film 5 due to the underlayer step, the surface of the interlayer insulation film 5 is polished by a CMP method, which can provide an interlayer insulation film with the surface planarized.

Then, using the photoresist pattern (not shown) formed over the interlayer insulation film 5 as an etching mask, the interlayer insulation film 5 is dry etched. As a result, in the interlayer insulation film 5, the contact holes CNT are formed. At the bottoms of the contact holes CNT, there are exposed some portions of the main surface of the semiconductor substrate 1 such as a portion of the gate electrode GE, and portions of the source/drain regions SD.

Then, in each contact hole CNT, there is formed a conductive plug PG formed of tungsten (W) or the like. For forming the plugs PG, for example, over the interlayer insulation film 5 including the insides of the contact hole CNT, a barrier conductor film (e.g., a titanium film or a titanium nitride film, or a lamination film thereof) is formed by a plasma CVD method or the like. Then, a main conductor film formed of a tungsten film or the like is formed over the barrier conductor film in such a manner as to fill the contact holes CNT by a CVD method or the like. The unnecessary portions of the main conductor film and the barrier conductor film over the interlayer insulation film 5 are removed by a CMP method, an etching back method, or the like. As a result, the plugs PG can be formed. In FIG. 25, for simplification of the drawing, the plug PG is shown with the main conductor film and the barrier conductor film integrated. The plug PG is electrically in contact at the bottom thereof with gate electrode GE, the source/drain region SD, or the like.

Then, over the interlayer insulation film 5 including the plugs PG embedded therein, the insulation film 6 is formed. The insulation film 6 can also be formed of a lamination film of a plurality of insulation films.

Then, by a single damascene method, there is formed the wire M1 which is a first-layer wire (Step S29 of FIG. 4). In the Step S29, specifically, the wire M1 can be formed in the following manner. First, by dry etching (plasma dry etching) with a photoresist pattern (not shown) as a mask, in prescribed regions of the insulation film 6, wiring trenches are formed. Then, over the insulation film 6 including the bottoms and the sidewalls of the wiring trenches, there is formed a barrier conductor film (e.g., a titanium nitride film, a tantalum film, or a tantalum nitride film). Subsequently, by a CVD method, a sputtering method, or the like, over the barrier conductor film, there is formed a seed layer of copper. Further, using an electrolytic plating method or the like, a copper plating film is formed over the seed layer. Accordingly, the copper plating film fills the insides of the wiring trenches. Then, the portions of the main conductor film (the copper plating film and the seed layer) and the barrier conductor film in regions except for the wiring trenches are polished and removed by a CMP method. Accordingly, there is formed a first-layer wire M1 which is embedded in each wiring trench, and includes copper as a main conductive material. As a result, there is manufactured a semiconductor device having a structure in which the portions up to the first-layer wire M1 are formed as shown in FIG. 1. In FIG. 1, far simplification of the drawing, the wire M1 is shown with the barrier conductor film, the seed layer, and the copper plating film integrated.

Incidentally, as described by reference to FIGS. 13, 17, and 21, when the metal-containing film 41 and the metal-containing film 42 are not definitely formed, and a metal is added to the insulation film 31 and the insulation film 32, the semiconductor device as shown in FIG. 2 is manufactured. Also in FIG. 2, for simplification of the drawing, the wire M1 is shown with the barrier conductor film, the seed layer, and the copper plating film integrated.

The wire M1 is electrically coupled via the plug PG with the gate electrode GE, the source/drain region SD, or the like. Thereafter, by a dual damascene method, a second-layer wire is formed, but herein, is not shown and not described.

<Regarding Adjustment of Threshold Voltage (Vth) of MISFET>

Figure 26:
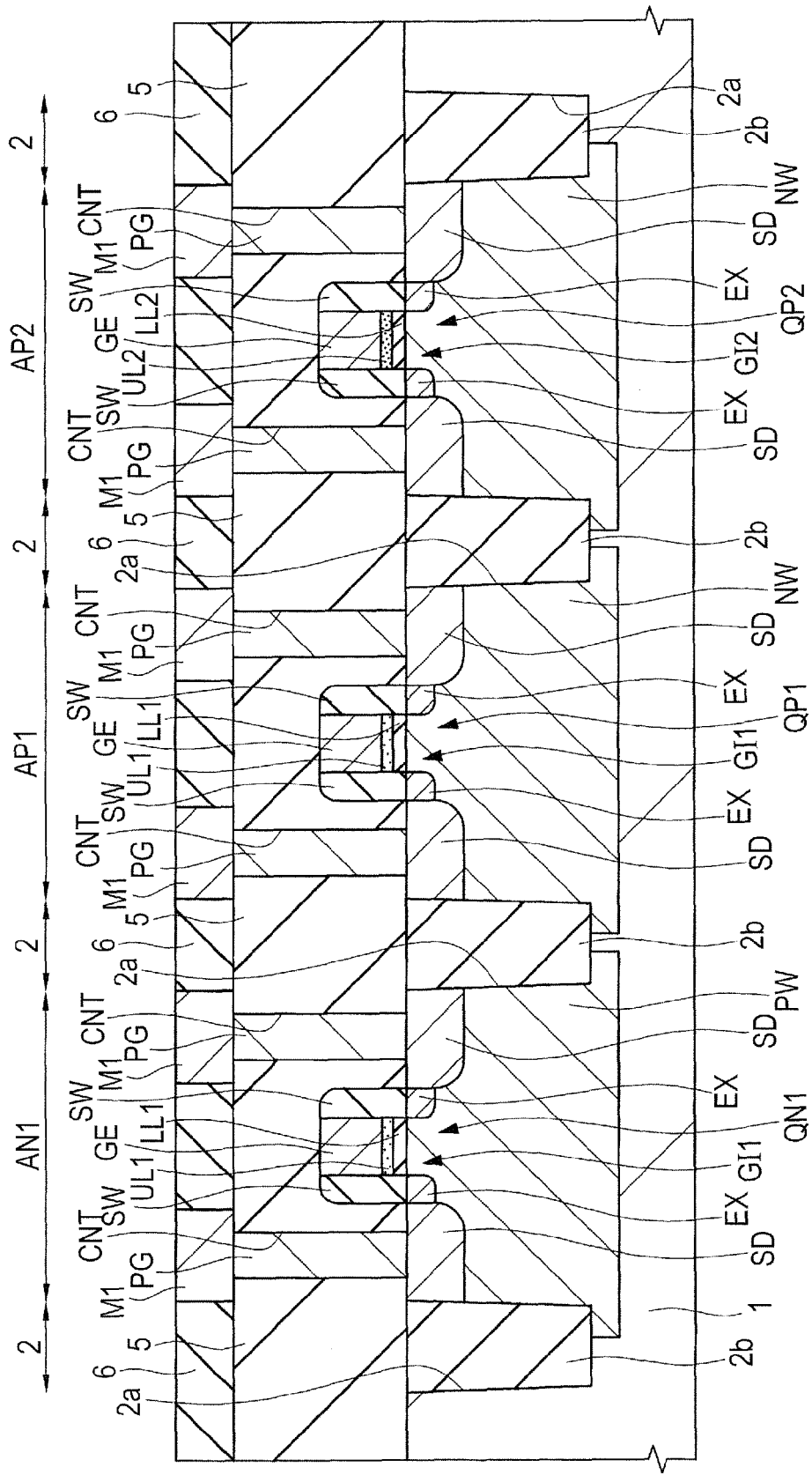
FIG. 26 is an essential-part cross-sectional view of a semiconductor device of a comparative example.

FIG. 26 is an essential-part cross-sectional view of a semiconductor device of a comparative example.

The semiconductor device of the comparative example also has a p channel type MISFET QP1 having a large threshold voltage (Vth), and a p channel type MISFET QP2 having a small threshold voltage (Vth). However, in the semiconductor device of the comparative example, the concentration of hafnium (metal) in the upper layer film UL2 of the MISFET QP2 is larger than the concentration of hafnium (metal) in the upper layer film UL1 of the MISFET QP1; and the concentration of nitrogen in the lower layer film LL2 of the MISFET QP2 is larger than the concentration of nitrogen in the lower layer film LL1 of the MISFET QP1.

Further, the semiconductor device of the comparative example also has the n channel type MISFET QN1, and the p channel type MISFET QP2 having a small threshold voltage (Vth). However, in the semiconductor device of the comparative example, the concentration of hafnium (metal) in the upper layer film UL2 of the MISFET QP2 is larger than the concentration of hafnium (metal) in the upper layer film UL1 of the MISFET QN1; and the concentration of nitrogen in the lower layer film LL2 of the MISFET QP2 is larger than the concentration of nitrogen in the lower layer film LL1 of the MISFET QN1.

Still further, the semiconductor device of the comparative example is equal in respective portions to the semiconductor device of the first embodiment, except for the upper layer films UL1 and UL2, and the lower layer films LL1 and LL2.

Then, an analysis by the present inventors indicates the following: for the semiconductor device of the comparative example, a short channel length of a MISFET tends to cause deterioration of the transistor characteristics such as reduction of the threshold voltage (Vth).

In the semiconductor device of the comparative example, the concentration of hafnium (metal) in the upper layer film UL2 of the MISFET QP2 is larger than the concentration of hafnium (metal) in the upper layer film UL1 of the MISFET QP1; and the concentration of nitrogen in the lower layer film LL2 of the MISFET QP2 is larger than the concentration of nitrogen in the lower layer film LL1 of the MISFET QP1. In this case, the impurity concentration in the channel region of the MISFET QP2 is adjusted so as to be smaller than the impurity concentration in the channel region of the MISFET QP1. As a result, the threshold voltage (Vth) of the MISFET QP2 is adjusted so as to be smaller than the threshold voltage (Vth) of the MISFET QP1.

However, in the p channel type MISFET, with an increase in concentration of nitrogen in the gate insulation film, the positive fixed charges in the gate insulation film increase, resulting in an increase in threshold voltage (Vth). Namely, the threshold voltage (Vth) of the MISFET QP2 having a large concentration of nitrogen in the lower layer film LL2 is larger than the threshold voltage (Vth) of the MISFET QP1 having a small concentration of nitrogen in the lower layer film LL1. Therefore, the threshold voltage (Vth) of the MISFET QP2 which is originally desired to be reduced in threshold voltage (Vth) becomes larger than the threshold voltage (Vth) of the MISFET QP1 which is originally desired to be increased in threshold voltage (Vth). In order to reduce the threshold voltage (Vth) of the MISFET QP2 as desired in such a state, the impurity concentration in the channel region of the MISFET QP2 is required to be adjusted so as to be further reduced. However, it has been shown as follows: when the channel length of the MISFET QP2 is short, a decrease in the impurity concentration in the channel region makes the transistor characteristics more likely to be deteriorated as described above.

Further, in the semiconductor device of the comparative example, the concentration of hafnium (metal) in the upper layer film UL2 of the MISFET QP2 is larger than the concentration of hafnium (metal) in the upper layer film UL1 of the MISFET QN1; and the concentration of nitrogen in the lower layer film LL2 of the MISFET QP2 is larger than the concentration of nitrogen in the lower layer film LL1 of the MISFET QN1. Also in this case, the impurity concentration in the channel region of the MISFET QP2 is adjusted so as to be smaller than the impurity concentration in the channel region of the MISFET QN1. This results in that the threshold voltage (Vth) of the MISFET QP2 is adjusted so as to be smaller than the threshold voltage (Vth) of the MISFET QN1. Incidentally, the term "magnitude relation of the threshold voltages (Vth)" herein used is, as described above, the magnitude relation of the absolute values of the threshold voltages (Vth).

However, in order to reduce the threshold voltage (Vth) of the MISFET QP2 as desired, the impurity concentration in the channel region of the MISFET QP2 is required to be adjusted so as to be reduced. However, it has been shown as follows: when the channel length of the MISFET QP2 is short, a decrease in the impurity concentration in the channel region makes the transistor characteristics more likely to be deteriorated as described above.

<Main Features and Effects of the Present Embodiment>

The semiconductor device of the present embodiment includes the p channel type MISFET QP1 having a large threshold voltage (Vth), and the p channel type MISFET QP2 having a small threshold voltage (Vth). However, in the present embodiment, the concentration of hafnium (metal) in the upper layer film UL2 of the MISFET QP2 is set smaller than the concentration of hafnium (metal) in the upper layer film UL1 of the MISFET QP1; and the concentration of nitrogen in the lower layer film LL2 of the MISFET QP2 is set smaller than the concentration of nitrogen in the lower layer film LL1 of the MISFET QP1.

As a result, without adjusting the impurity concentration in the channel region, the threshold voltage (Vth) of the MISFET QP2 can be adjusted so as to be smaller than the threshold voltage (Vth) of the MISFET QP1. Whereas, the lower layer films LL1 and LL2 are each formed of, for example, silicon oxynitride, and include silicon, oxygen, and nitrogen. This can inhibit the deterioration of the reliability of the gate insulation films GI1 and GI2 due to the crystallization of hafnium (metal).

Whereas, in the p channel type MISFET, with an increase in concentration of nitrogen in the gate insulation film, the positive fixed charges in the gate insulation film increase, resulting in an increase in threshold voltage (Vth). In the present embodiment, the concentration of nitrogen in the lower layer film LL2 of the MISFET QP2 which is desired to be reduced in threshold voltage (Vth) is smaller than the concentration of nitrogen in the lower layer film LL1 of the MISFET QP1 which is desired to be increased in threshold voltage (Vth). Accordingly, particularly in the MISFET QP2, it is possible to suppress an increase in threshold voltage (Vth) due to the positive fixed charges in the gate insulation film GI2. As a result, when the threshold voltage (Vth) of the MISFET QP2 is adjusted so as to be reduced, the impurity concentration in the channel region is not required to be reduced. For this reason, even when the channel length of the MISFET QP2 is short, it is possible to suppress the deterioration of the transistor characteristics.

Further, the semiconductor device of the present embodiment includes the n channel type MISFET QN1 having a large threshold voltage (Vth), and the p channel type MISFET QP2 having a small threshold voltage (Vth). However, in the present embodiment, the concentration of hafnium (metal) in the upper layer film UL2 of the MISFET QP2 is set smaller than the concentration of hafnium (metal) in the upper layer film UL1 of the MISFET QN1; and the concentration of nitrogen in the lower layer film LL2 of the MISFET QP2 is set smaller than the concentration of nitrogen in the lower layer film LL1 of the As a result, without adjusting the impurity concentration in the channel region, the threshold voltage (Vth) of the MISFET QP2 can be adjusted so as to be smaller than the threshold voltage (Vth) of the MISFET QN1. Whereas, the lower layer films LL1 and LL2 are each formed of, for example, silicon oxynitride, and include silicon, oxygen, and nitrogen. This can inhibit the deterioration of the reliability of the gate insulation films GI1 and GI2 due to the crystallization of hafnium (metal). Incidentally, the term "magnitude relation of the threshold voltages (Vth)" herein used is, as described above, the magnitude relation of the absolute values of the threshold voltages (Vth).

Further, in the p channel type MISFET, with an increase in concentration of nitrogen in the gate insulation film, the positive fixed charges in the gate insulation film increase, resulting in an increase in threshold voltage (Vth). In the present embodiment, the concentration of nitrogen in the lower layer film LL2 of the MISFET QP2 which is desired to be reduced in threshold voltage (Vth) is smaller than the concentration of nitrogen in the lower layer film LL1 of the MISFET QN1 which is desired to be increased in threshold voltage (Vth). Accordingly, particularly in the MISFET QP2, it is possible to suppress an increase in threshold voltage (Vth) due to the positive fixed charges in the gate insulation film GI2. As a result, when the threshold voltage (Vth) of the MISFET QP2 is adjusted so as to be reduced, the impurity concentration in the channel region is not required to be reduced. For this reason, even when the channel length of the MISFET QP2 is short, it is possible to suppress the deterioration of the transistor characteristics.

Incidentally, as described above, the same effects can be obtained even when as the metal to be contained in the upper layer films UL1 and UL2, for example, aluminum or titanium is used in place of hafnium. However, use of hafnium is most effective.

Whereas, also for the n channel type MISFET, as with the p channel type MISFET, there may be formed two kinds of MISFETs varying in concentration of hafnium (metal) and concentration of nitrogen in the gate insulation film therebetween. However, for the n channel type MISFET, even when the positive fixed charges in the gate insulation film have increased with an increase in concentration of nitrogen in the gate insulation film, the threshold voltage (Vth) is less likely to increase. Therefore, for the n channel type MISFET, two types of MISFETs varying in concentration of hafnium (metal) and concentration of nitrogen in the gate insulation film therebetween as with the p channel type MISFET are not formed. As described in the present embodiment, preferably, only one type MISFET is formed.

Further, in the present embodiment, a description was given to the example in which there were formed a total of three types of MISFETs of one type of n channel type MISFET and two types of p channel type MISFETs having different threshold voltages (Vth). However, the present invention is also applicable to the case where there are formed a total of two types of MISFETs of an n channel type MISFET, and a p channel type MISFET having a small threshold voltage (Vth). Even when the channel length of the p channel type MISFET having a small threshold voltage (Vth) is short, it is possible to suppress the deterioration of the transistor characteristics. Similarly, the present invention is also applicable to the case where there are formed only two types of p channel type MISFETs having different threshold voltages (Vth). Even when the channel length of the p channel type MISFET having a small threshold voltage (Vth) is short, it is possible to suppress the deterioration of the transistor characteristics.

Second Embodiment

In the first embodiment, the concentration of hafnium (metal) and the concentration of nitrogen in the gate insulation film are changed, so that there are formed a MISFET having a large threshold voltage (Vth) and a MISFET having a small threshold voltage (Vth). In contrast, in a second embodiment, in addition to the MISFET having a large threshold voltage (Vth) and the MISFET having a small threshold voltage (Vth), there is formed a high breakdown voltage MISFET. Then, the concentration of hafnium (metal) in the gate insulation film of the MISFET having a small threshold voltage (Vth) is smaller than the concentration of hafnium (metal) in the gate insulation film of the high breakdown voltage MISFET. The nitrogen concentration in the gate insulation film of the MISFET having a small threshold voltage (Vth) is smaller than the nitrogen concentration in the gate insulation film of the high breakdown voltage MISFET.

<Semiconductor Device>

Figure 27:
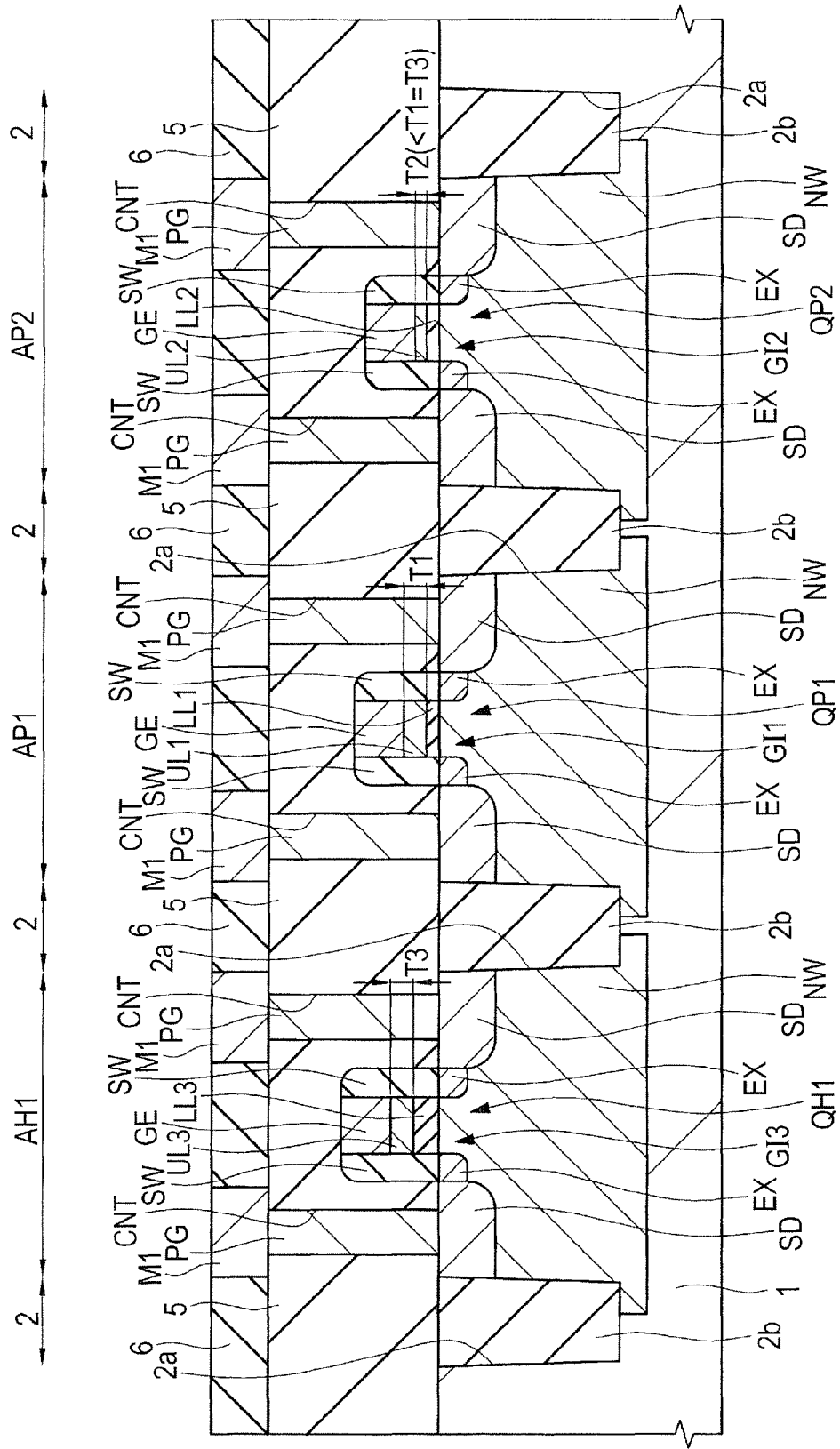
FIG. 27 is an essential-part cross-sectional view of a semiconductor device of a second embodiment.
Figure 28:
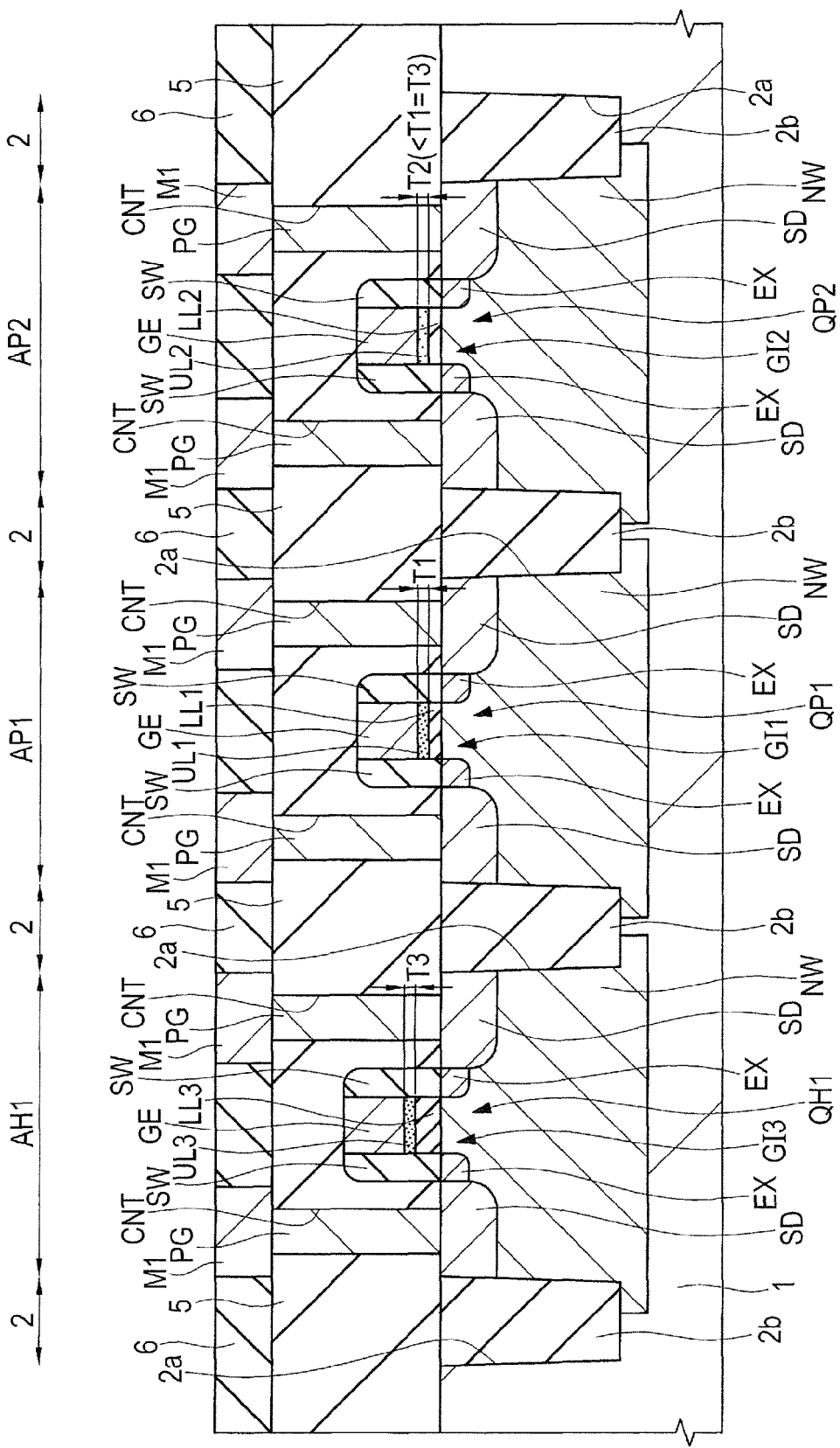
FIG. 28 is an essential-part cross-sectional view of the semiconductor device of the second embodiment.

FIGS. 27 and 28 are each an essential-part cross-sectional view of the semiconductor device of the second embodiment.

In the present embodiment, in addition to the MISFET having a large threshold voltage (Vth) and the MISFET having a small threshold voltage (Vth), there is formed the high breakdown voltage MISFET.

As shown in FIG. 27, the MISFETs to be included in the semiconductor device of the present embodiment are formed over the semiconductor substrate 1. The semiconductor substrate 1 is, for example, a single crystal silicon substrate. In the top of the main surface of the semiconductor substrate 1, there are defined the element isolation regions 2, and the MISFET formation regions (active regions) AH1, AP1, and AP2. The MISFET formation regions AH1, AP1, and AP2 are regions divided by the element isolation regions 2. The MISFET formation region AH1 is a region including a high breakdown voltage MISFET QH1 formed therein (high breakdown voltage MISFET formation region AH1). The MISFET formation region AP1 is a region including a p channel type MISFET QP1 formed therein (p type MISFET formation region AP1). The MISFET formation region AP2 is a region including a p channel type MISFET QP2 formed therein (p type MISFET formation region AP2). The threshold voltage (Vth) of the p channel type MISFET QP2 formed in the MISFET formation region AP2 is smaller than the threshold voltage (Vth) of the p channel type MISFET QP1 formed in the MISFET formation region AP1.

Incidentally, in FIG. 27, for ease of understanding, the MISFET formation regions AH1, AP1, and AP2 are shown adjacent to one another. However, the actual positional relation between the MISFET formation regions AH1, AP1, and AP2 can be changed, if required.

Further, FIG. 27 shows the high breakdown voltage MISFET QH1 as a p channel type MISFET, and the high breakdown voltage MISFET formation region AH1 as a region including a p channel type MISFET formed therein. However, it is also acceptable that the high breakdown voltage MISFET QH1 is shown as an n channel type MISFET, and that the high breakdown voltage MISFET formation region AH1 is shown as a region including the n channel type MISFET formed therein.

Further, in FIG. 27, in the top of the main surface of the semiconductor substrate 1, the n type MISFET formation region AN1 (see FIG. 1) is not defined, and the n channel type MISFET QN1 (see FIG. 1) is not formed. However, also in the present embodiment, as with the first embodiment, in the top of the main surface of the semiconductor substrate 1, the n type MISFET formation region AN1 (see FIG. 1) may be defined, and the n channel type MISFET QN1 may be formed.

As shown in FIG. 27, the specific configuration of the p channel type MISFET QP1 formed in the p type MISFET formation region AP1 can be made equal to that of the p channel type MISFET QP1 (see FIG. 1) in the first embodiment. Further, as shown in FIG. 27, the specific configuration of the p channel type MISFET QP2 in the p type MISFET formation region AP2 can be made equal to that of the p channel type MISFET QP2 (see FIG. 1) in the first embodiment. Therefore, the specific configurations of the MISFET QP1 and the MISFET QP2 will not be described.

Then, a description will be given to the specific configuration of the high breakdown voltage MISFET QH1 formed in the high breakdown voltage MISFET formation region AH1.

The high breakdown voltage MISFET QH1 has a gate electrode GE formed over the semiconductor substrate 1. The gate electrode GE is formed over the n type well region NW formed in the semiconductor substrate 1 in the high breakdown voltage MISFET formation region AH1. Whereas, the high breakdown voltage MISFET QH1 has a gate insulation film GI3 formed between the gate electrode GE and the semiconductor substrate 1. Namely, the high breakdown voltage MISFET QH1 has the gate insulation film GI3 formed over the semiconductor substrate 1, and the gate electrode GE formed over the gate insulation film GI3.

However, the MISFET QH1 is a high breakdown voltage MISFET. For this reason, the thickness of the gate insulation film GI3 is larger than the thickness of any film of the gate insulation film GI1 of the MISFET QP1 and the gate insulation film GI2 of the MISFET QP2.

For the gate electrode GE, there can be used the same material as that for the gate electrode GE of the p channel type MISFET QP1.

The gate insulation film GI3 includes a metal, silicon, oxygen, and nitrogen.

Examples of the metal to be contained in the gate insulation film GI3 may include hafnium (Hf), aluminum (Al), and titanium (Ti). By adjusting the content of the metal in the gate insulation film GI3, it is possible to adjust the threshold voltage (Vth) of the MISFET QH1 without adjusting the impurity concentration in the channel region. Whereas, when the metal contained in the gate insulation film GI3 is, for example, titanium (Ti), as the gate insulation film GI3, there can be used the one containing, for example, titanium nitride (TiN). Further, hafnium (Hf) is preferable among the metals described above in that it produces a still larger effect of enabling adjustment of the threshold voltage (Vth) without adjusting the impurity concentration of the channel region by the adjustment of the content of the metal in the gate insulation film GI3.

The silicon, oxygen, and nitrogen included in the gate insulation film GI3 are present as, for example, silicon oxynitride (SiON) in the gate insulation film GI3. Out of these, nitrogen can suppress the deterioration of the reliability of the gate insulation film GI3 due to crystallization of the contained metal when the gate insulation film GI3 includes the metal described above.

Incidentally, a detailed structure of the gate insulation film GI3 will be described later.

Over the sidewall of the gate electrode GE, a sidewall spacer SW is formed as a sidewall insulation film. Then, in portions which are in the high breakdown voltage MISFET formation region AH1, and are on the opposite sides across the gate electrode GE including the sidewall spacer SW formed thereover, there are formed source/drain regions SD. In the high breakdown voltage MISFET formation region AH1, the source/drain regions SD are n type semiconductor regions including p type impurities such as boron (B) diffused therein.

Whereas, in the high breakdown voltage MISFET formation region AH1, in the semiconductor substrate 1, the extension regions EX are formed, and the source/drain regions SD of a LDD structure are formed. Further, also in the high breakdown voltage MISFET formation region AH1, over the source/drain regions SD and over the gate electrode GE, a metal silicide layer can be formed using a salicide technology.

Also in the present embodiment, as with the first embodiment, the concentration of the metal in the gate insulation film GI2 is smaller than the concentration of the metal in the gate insulation film GI1. The concentration of nitrogen in the gate insulation film GI2 is smaller than the concentration of nitrogen in the gate insulation film GI1. As a result, without adjusting the impurity concentration in the channel region, the threshold voltage (Vth) of the MISFET QP2 can be adjusted so as to be smaller than the threshold voltage (Vth) of the MISFET QN1. Further, it is possible to suppress the deterioration of the reliability of the gate insulation film GI1 due to the crystallization of the metal contained in the gate insulation film GI1 in the MISFET QP1; and it is possible to suppress the increase in threshold voltage (Vth) due to the inclusion of nitrogen in the gate insulation film GI2 in the MISFET QP2. Then, without reducing the impurity concentration, the threshold voltage (Vth) can be adjusted so as to be reduced. For this reason, even when the channel length is short, it is possible to suppress the deterioration of the transistor characteristics in the MISFET having a small threshold voltage (Vth).

In addition to this, in the present embodiment, the concentration of the metal in the gate insulation film GI2 is smaller than the concentration of the metal in the gate insulation film GI3; and the concentration of nitrogen in the gate insulation film GI2 is smaller than the concentration of nitrogen in the gate insulation film GI3. As a result, without adjusting the impurity concentration in the channel region, the threshold voltage (Vth) of the MISFET QP2 can be adjusted so as to be smaller than the threshold voltage (Vth) of the MISFET QH1. In addition, the breakdown voltage of the MISFET QH1 can be increased, which facilitates the design of a semiconductor device including a high breakdown voltage MISFET merged therein.

Further, the concentration of the metal in the gate insulation film GI3 is preferably equal to the concentration of the metal in the gate insulation film GI1; and the concentration of nitrogen in the gate insulation film GI3 is preferably equal to the concentration of nitrogen in the gate insulation film GI1. As a result, the gate insulation film GI3 and the gate insulation film GI1 can be formed by the same step. This can simplify the manufacturing step of a semiconductor device in which the gate insulation films GI1, GI2, and GI3 are formed individually. In the explanation of the manufacturing step of a semiconductor device described later, a description will be given to an example in which the concentration of the metal in the gate insulation film GI3 is equal to the concentration of the metal in the gate insulation film GI1; and the concentration of nitrogen in the gate insulation film GI3 is equal to the concentration of nitrogen in the gate insulation film GI1.

Then, a description will be given to the detailed structure of the gate insulation film GI3.

As shown in FIG. 27, the gate insulation film GI3 preferably has a lower layer film LL3 including silicon, oxygen, and nitrogen formed over the semiconductor substrate 1, and an upper layer film UL3 containing hafnium formed over the lower layer film LL3. However, the MISFET QH1 is a high breakdown voltage MISFET. Accordingly, the thickness of the lower layer film LL3 is larger than the thickness of any film of the lower layer film LL1 of the MISFET QP1, and the lower layer film LL2 of the MISFET QP2. With such a configuration, without adjusting the impurity concentration in the channel region, the threshold voltage (Vth) can be increased, and the breakdown voltage can be increased. This facilitates the design of the high breakdown voltage MISFET.

As the lower layer film LL3, there is used a film formed of, for example, silicon oxynitride (SiON). As the upper layer film UL3, there is used a film formed of one or more of hafnium oxide (HfO), hafnium oxynitride (HfON), and HfSiON.

Further, preferably, the thickness T2 of the upper layer film UL2 is made smaller than the thickness T1 of the upper layer film UL1; and the thickness T2 of the upper layer film UL2 is made smaller than the thickness T3 of the upper layer film UL3. This can make the concentration of hafnium in the gate insulation film GI2 smaller than any of the concentration of hafnium in the gate insulation film GI1 and the concentration of hafnium in the gate insulation film GI3 with ease.

Further, preferably, the thickness of the upper layer film UL3 is made equal to the thickness of the upper layer film UL1. This can make the concentration of hafnium in the gate insulation film GI3 equal to the concentration of hafnium in the gate insulation film GI1 with ease.

Specifically, the concentration of hafnium in the gate insulation film GI3 is preferably $5 \times 10^{13}$ to $2 \times 10^{14}$ atoms/cm$^2$ and larger than the concentration of hafnium in the gate insulation film GI2 as with the concentration of hafnium in the gate insulation film GI1. When the concentration of hafnium in the gate insulation film GI3 is less than $5 \times 10^{13}$ atoms/cm$^2$, the threshold voltage (Vth) of the MISFET QH1 may be unadjustable so as to be sufficiently large. When the concentration of hafnium in the gate insulation film GI3 exceeds $2 \times 10^{14}$ atoms/cm$^2$, hafnium becomes more likely to be crystallized, which may result in the reduction of the reliability of the gate insulation film GI3.

Further, preferably, the concentration of nitrogen in the gate insulation film GI3 is 5 to 20 atom %, and larger than the concentration of nitrogen in the gate insulation film GI2. When the concentration of nitrogen in the gate insulation film GI3 is less than 5 atom %, hafnium becomes more likely to be crystallized, which may result in the reduction of the reliability of the gate insulation film GI3. Whereas, the concentration of nitrogen in the gate insulation film GI3 exceeds 20 atom %, the threshold voltage (Vth) of the MISFET QH1 may become too large.

Incidentally, FIG. 27 shows the case where the thickness T2 of the upper layer film UL2 is smaller than the thickness T3 of the upper layer film UL3 and the thickness T1 of the upper layer film UL1. However, the concentration of hafnium in the upper layer film UL2 is desirably smaller than any of the concentration of hafnium in the upper layer film UL3 and the concentration of hafnium in the upper layer film UL1; and the thickness T2 of the upper layer film UL2 is not required to be smaller than any of the thickness T3 of the upper layer film UL3 and the thickness T1 of the upper layer film UL1. FIG. 28 shows the following case: although the concentration of hafnium in the upper layer film UL2 is smaller than any of the concentration of hafnium in the upper layer film UL3 and the concentration of hafnium in the upper layer film UL1, the thickness T2 of the upper layer film UL2 is equal to both of the thickness T3 of the upper layer film UL3 and the thickness T1 of the upper layer film UL1.

Besides, respective portions of the element isolation regions 2, the element isolation trenches 2a, the insulation film 2b, the interlayer insulation film 5, the contact holes CNT, the plugs PG, the insulation film 6, and the wire M1 of the semiconductor device of the present embodiment are equal to respective portions of the element isolation regions 2, the element isolation trenches 2a, the insulation film 2b, the interlayer insulation film 5, the contact holes CNT, the plugs PG, the insulation film 6, and the wire M1 of the semiconductor device of the first embodiment, respectively, and hence will not be described.

<Manufacturing Steps of Semiconductor Device>

Figure 29:
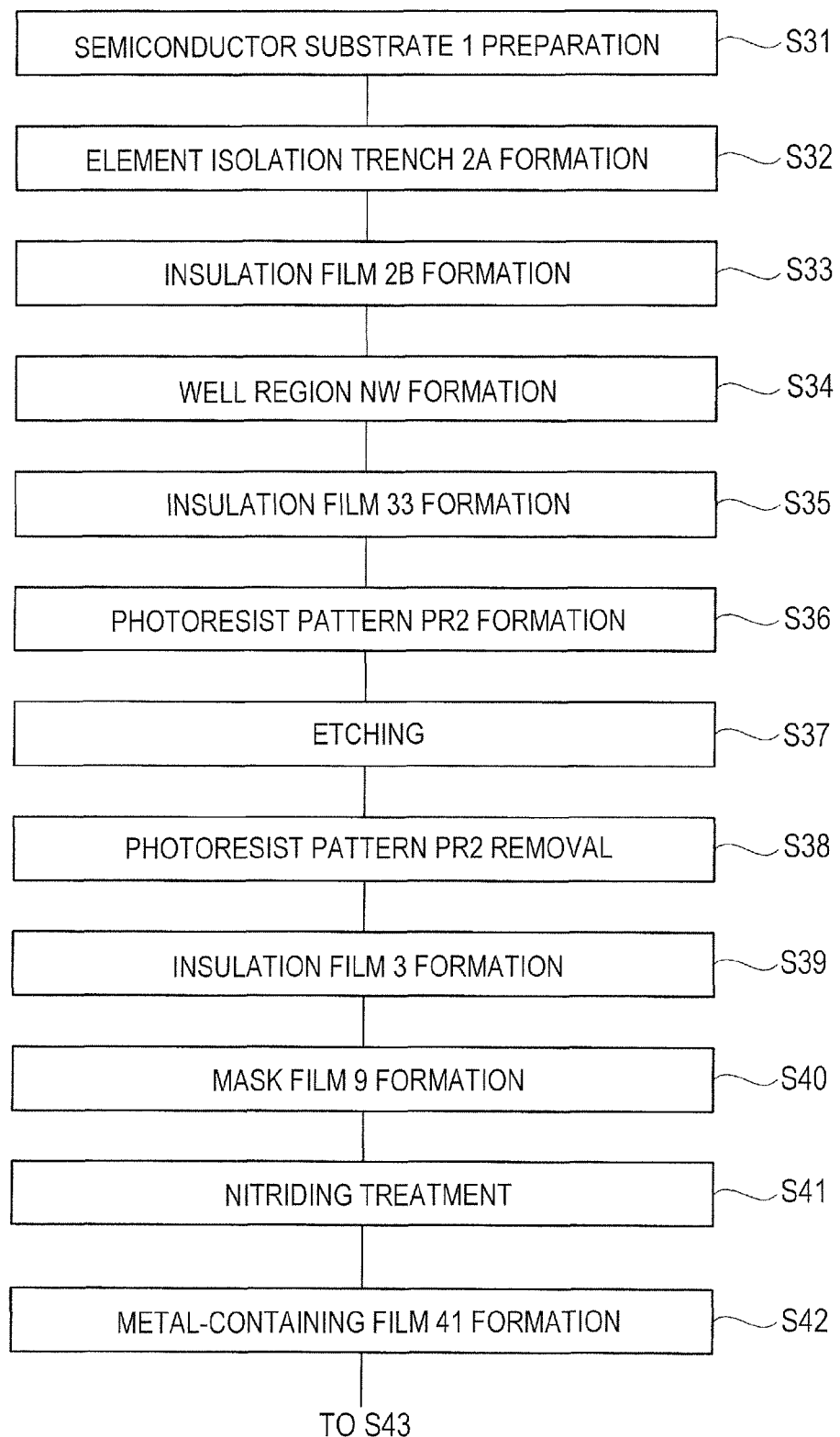
FIG. 29 is a manufacturing process flowchart showing a part of manufacturing steps of the semiconductor device of the second embodiment.
Figure 30:
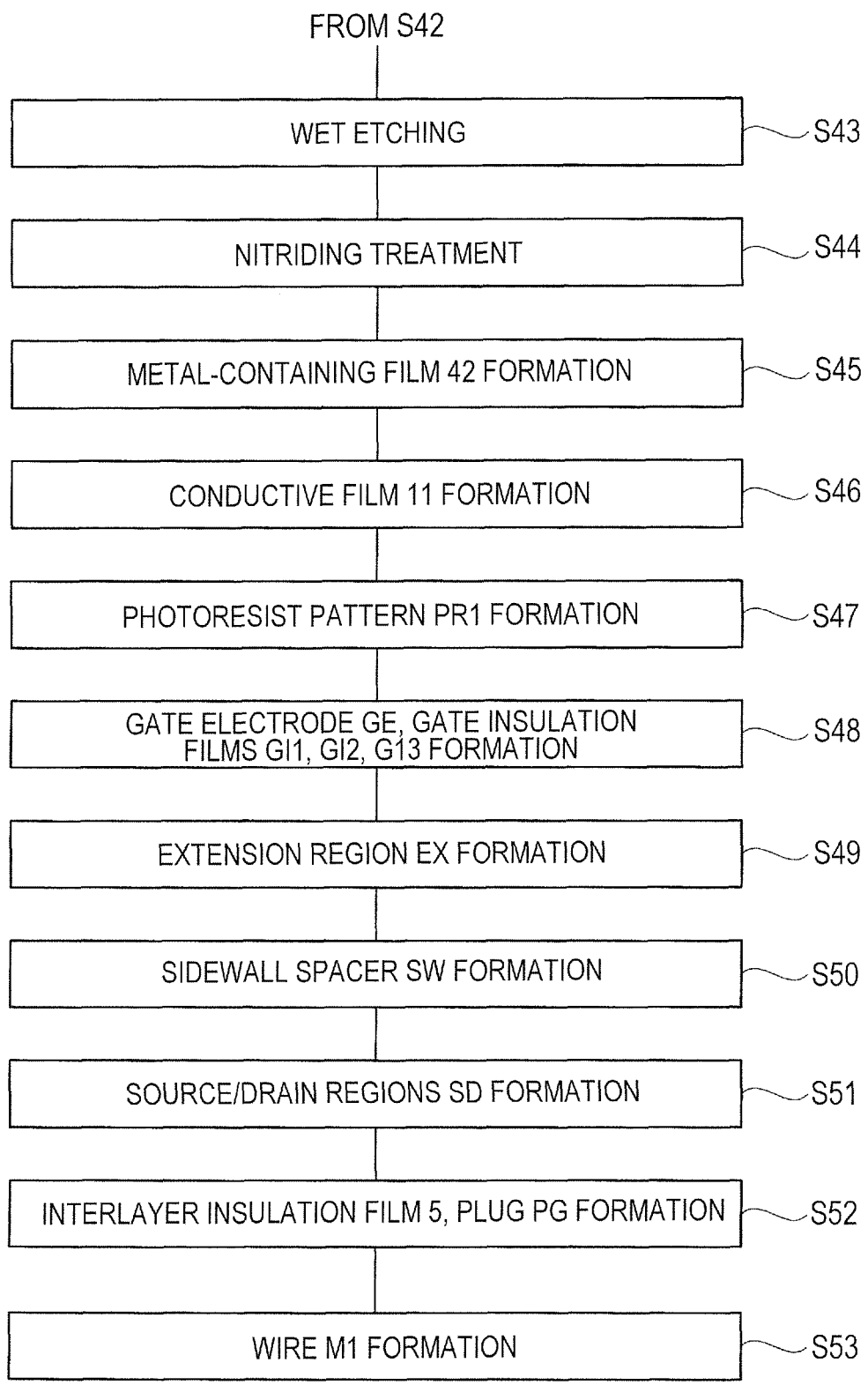
FIG. 30 is a manufacturing process flowchart showing a part of manufacturing steps of the semiconductor device of the second embodiment.
Figure 47:
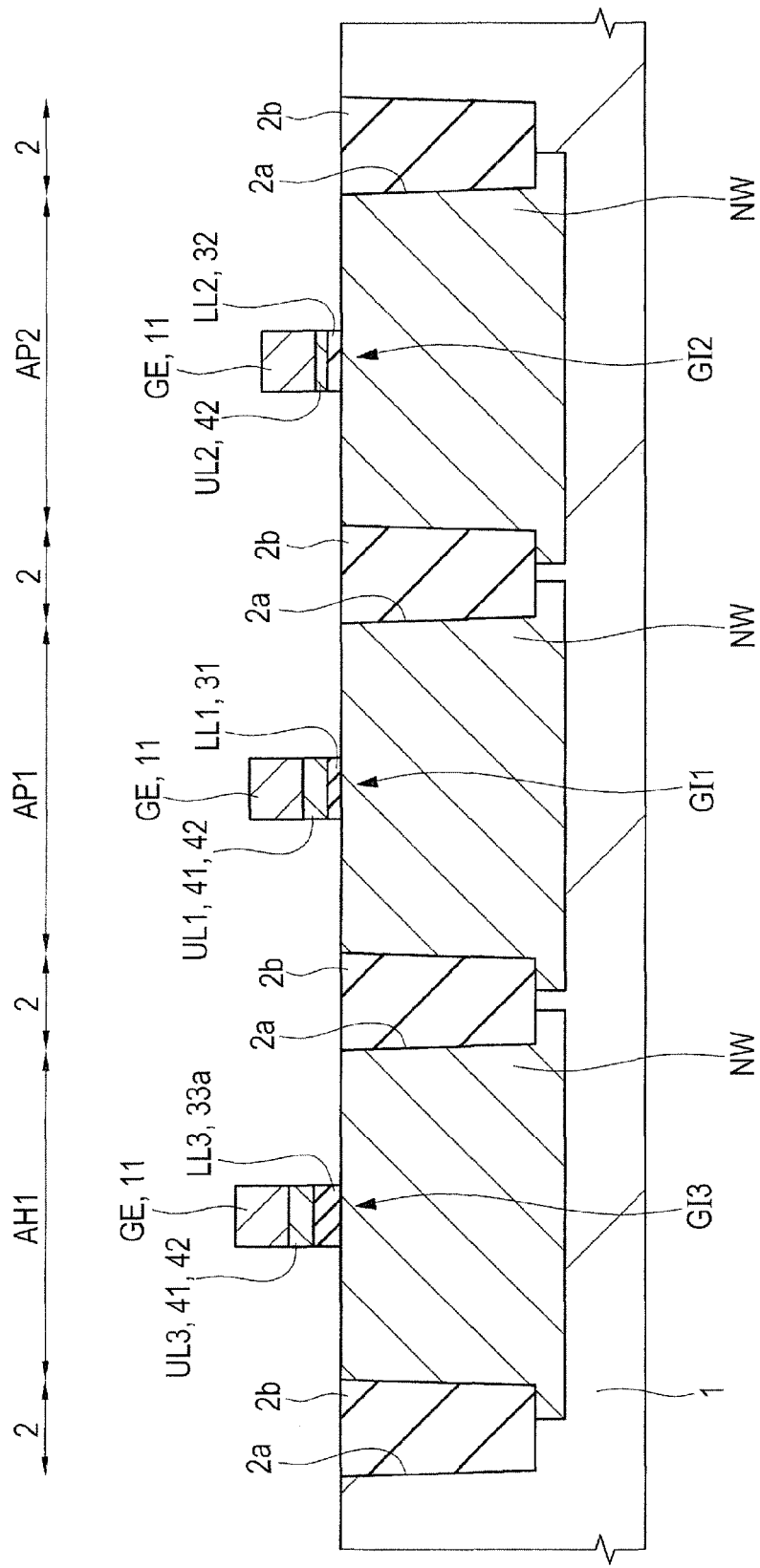
FIG. 47 is an essential-part cross-sectional view in a manufacturing step of the semiconductor device of the second embodiment.
Figure 48:
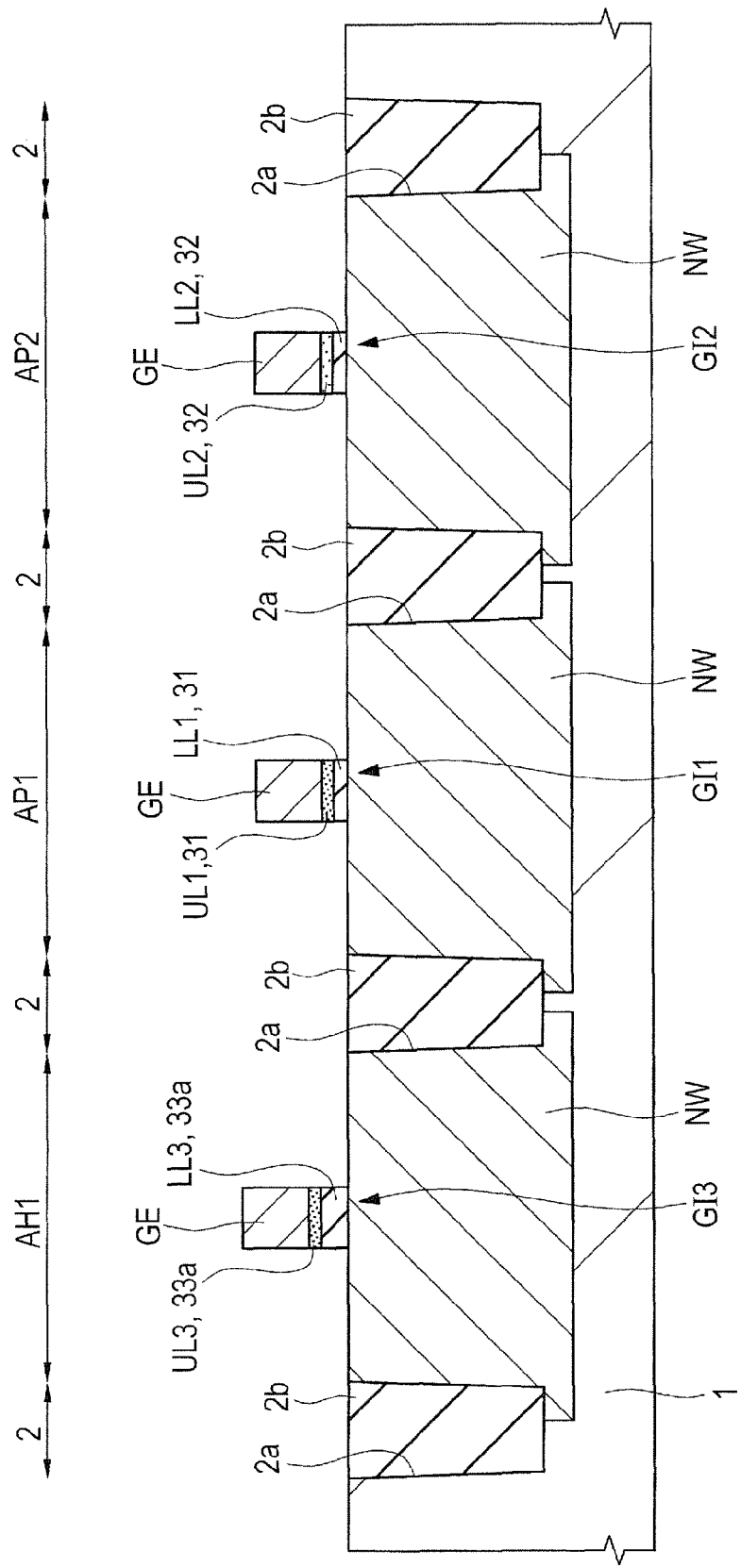
FIG. 48 is an essential-part cross-sectional view in a manufacturing step of the semiconductor device of the second embodiment.

The manufacturing steps of the semiconductor device of the present embodiment will be described by reference to the accompanying drawings. FIGS. 29 and 30 are each a manufacturing process flowchart showing a part of manufacturing steps of the semiconductor device of the second embodiment. FIGS. 31 to 49 are each an essential-part cross-sectional view in a manufacturing step of the semiconductor device of the second embodiment. Incidentally, FIGS. 41, 45, and 48 show the states in which the metal-containing film is not definitely formed, and a metal is added to the insulation film 33*a*, the insulation film 31, or the insulation film 32 in the steps shown in FIGS. 40, 44, and 47 (Step S42 of FIG. 29, Step S45 of FIG. 30, and Step S48 of FIG. 30), respectively.

Figure 31:
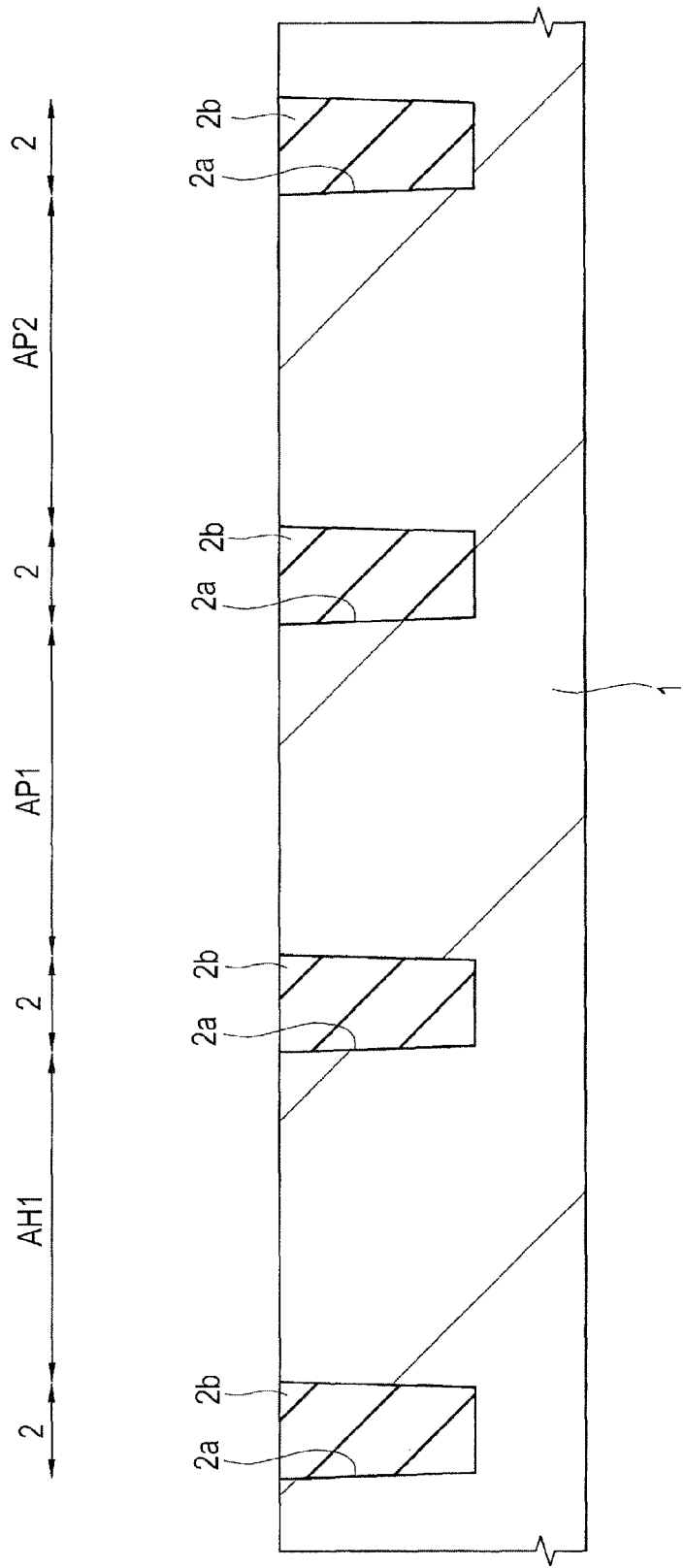
FIG. 31 is an essential-part cross-sectional view in a manufacturing step of the semiconductor device of the second embodiment.

First, the same steps (Step S31 and Step S32 of FIG. 29) as the steps shown in FIGS. 5 and 6 (Step S11 and Step S12 of FIG. 3) are performed, thereby to form the element isolation trenches 2*a* in the element isolation regions 2. Then, the same step (Step S33 of FIG. 29) as Step S13 of FIG. 3 is performed. As a result, as shown in FIG. 31, in each element isolation trench 2*a*, the insulation film 2*b* is formed by a STI method. At this step, in the semiconductor substrate 1, the element isolation regions 2 define (divide) the MISFET formation regions (active regions) AH1, AP1, and AP2. Then, in the MISFET formation regions AH1, AP1, and AP2, various semiconductor elements (e.g., QH1, QP1, and, QP2 which are MISFETs described later) are formed in the subsequent steps.

Figure 32:
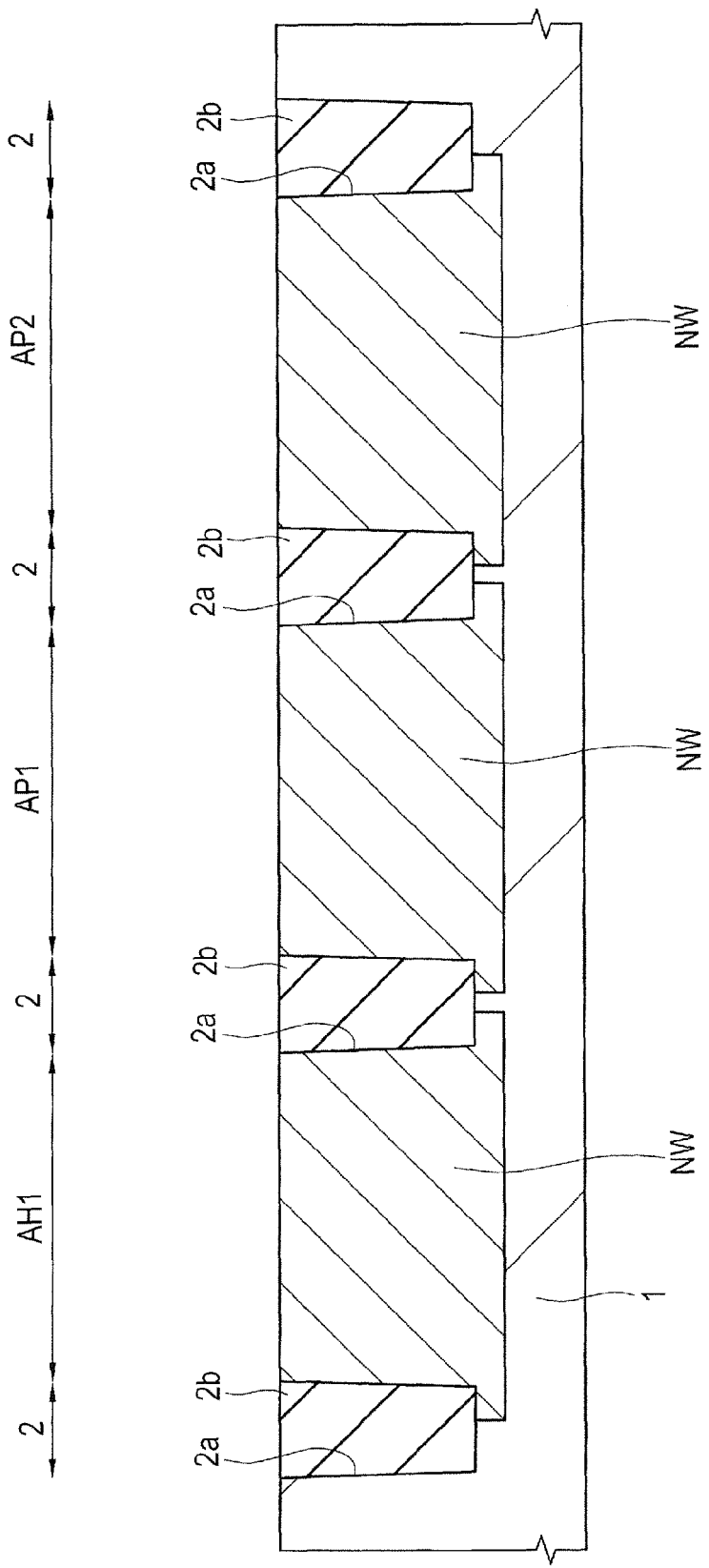
FIG. 32 is an essential-part cross-sectional view in a manufacturing step of the semiconductor device of the second embodiment.

Then, as shown in FIG. 32, there is performed a step of forming a well region from the top surface to a prescribed depth of the semiconductor substrate 1 (Step S34 of FIG. 29). In the Step S34, in the semiconductor substrate 1, there is formed an n type well region NW containing n type impurities (e.g., phosphorus or arsenic). Incidentally, when the high breakdown voltage MISFET formation region AH1 is for an n channel type MISFET, there are repeated a step (first time) of forming a p type well region PW containing p type impurities (e.g., boron), and a step (second time) of forming an n type well region NW containing n type impurities (e.g., phosphorus or arsenic) in the semiconductor substrate 1. Specifically, the steps can be performed in the same manner as the step of Step S14 of FIG. 3.

Figure 33:
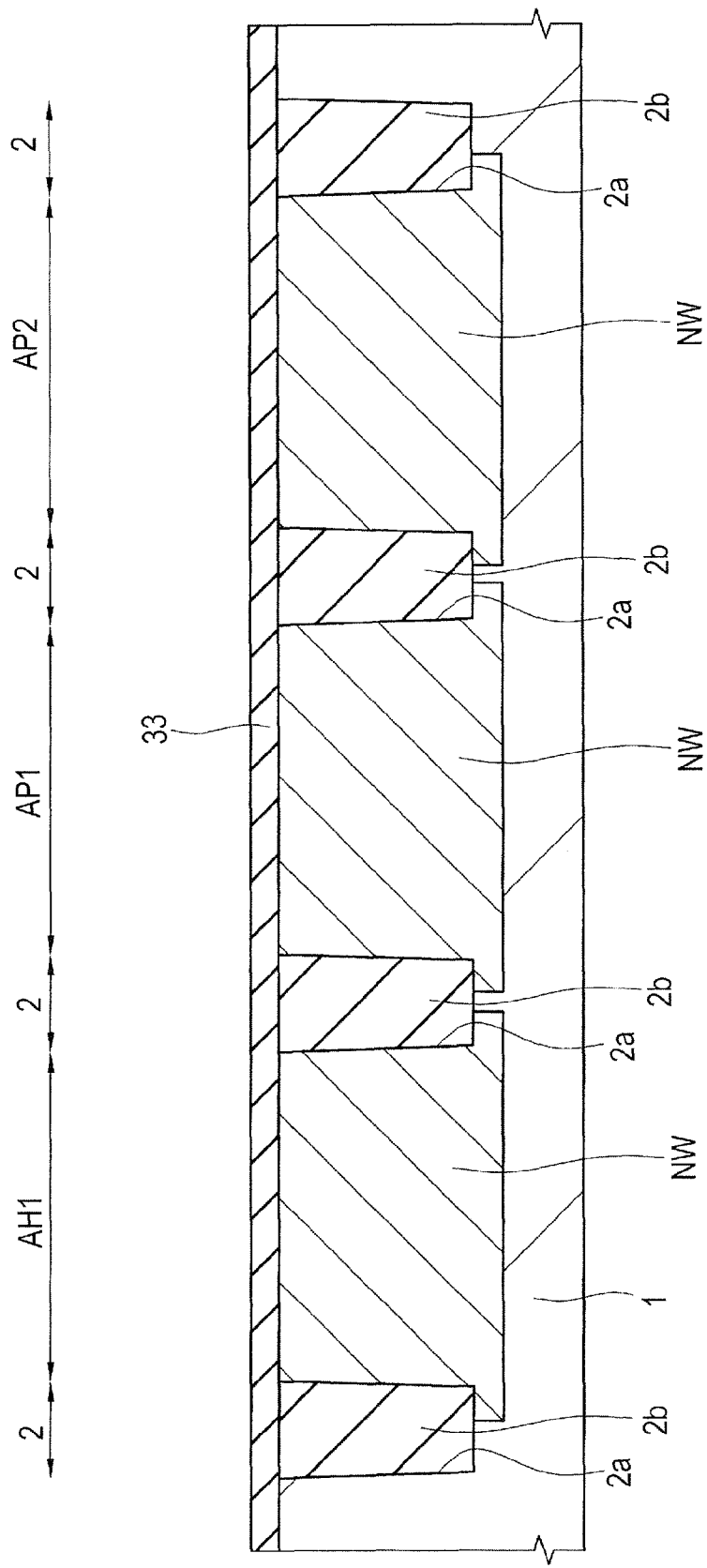
FIG. 33 is an essential-part cross-sectional view in a manufacturing step of the semiconductor device of the second embodiment.

Then, as shown in FIG. 33, over the semiconductor substrate 1, there is formed an insulation film 33 (Step S35 of FIG. 29). In the Step S35, over the entire main surface (front surface) of the semiconductor substrate 1, the insulation film 33 formed of silicon oxide is formed by, for example, a thermal oxidation method.

Figure 34:
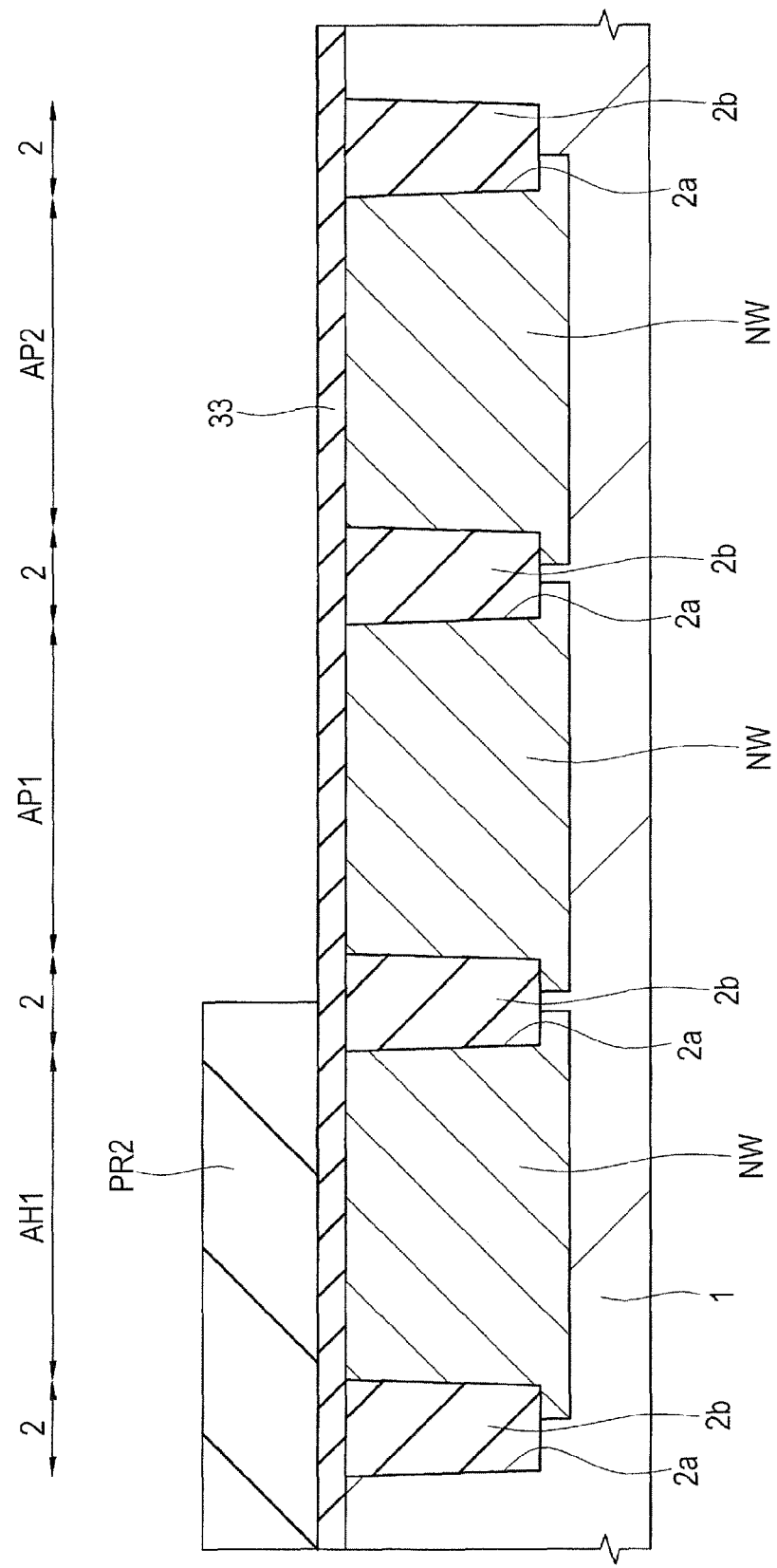
FIG. 34 is an essential-part cross-sectional view in a manufacturing step of the semiconductor device of the second embodiment.

Then, as shown in FIG. 34, over the semiconductor substrate 1, there is formed a photoresist pattern PR2 (Step S36 of FIG. 29). In the Step S36, over the entire main surface (front surface) of the semiconductor substrate 1, namely, over the insulation film 33, a photoresist layer is coated, and then, the photoresist layer is exposed to light/developed. As a result, a photoresist pattern PR2 is formed in such a manner as to have an opening in the MISFET formation regions AP1 and AP2.

Figure 35:
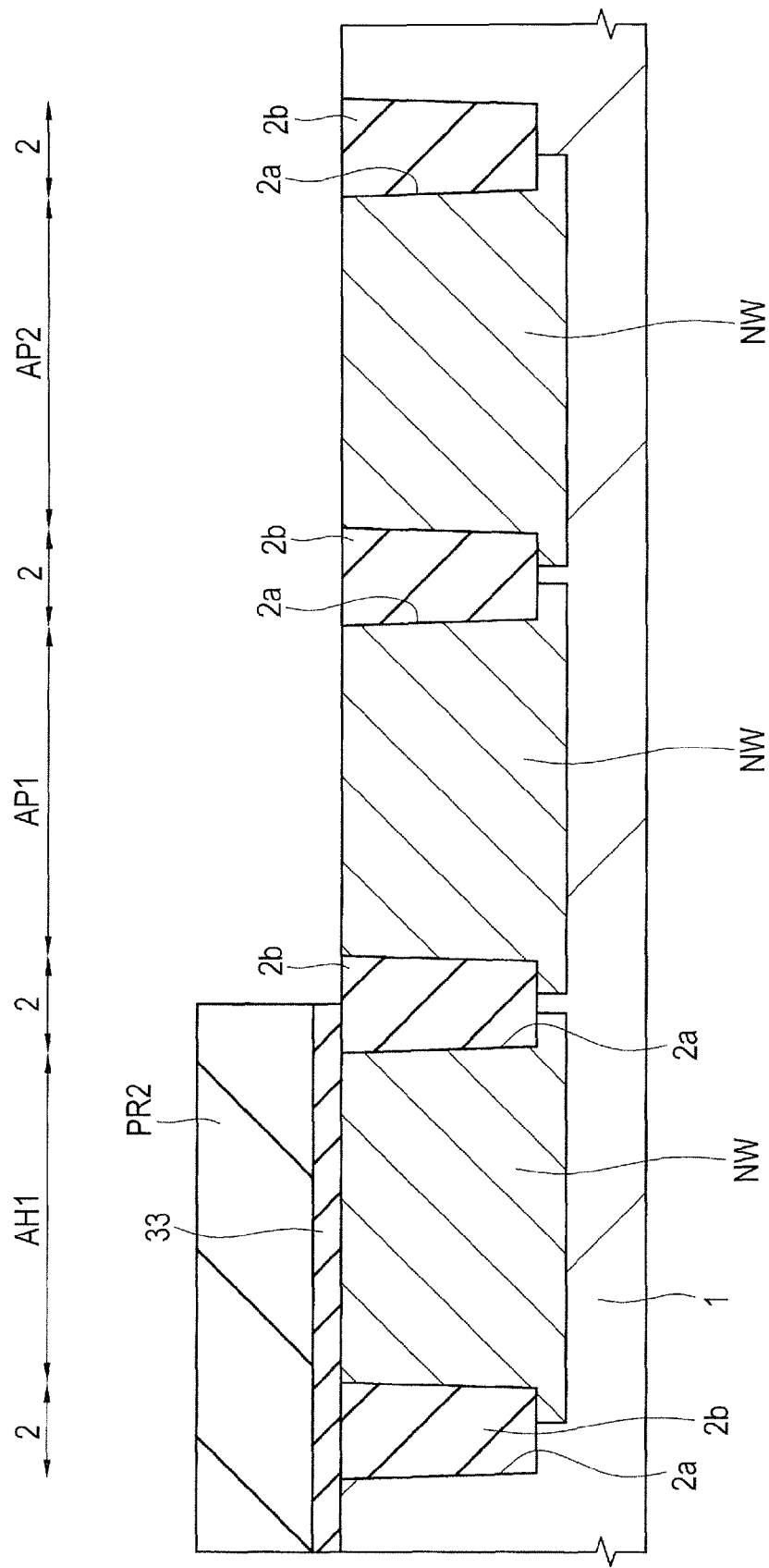
FIG. 35 is an essential-part cross-sectional view in a manufacturing step of the semiconductor device of the second embodiment.

Then, as shown in FIG. 35, using the photoresist pattern PR2 as an etching mask, the insulation film 33 is etched (Step S37 of FIG. 29). In the Step S37, by wet etching using, for example, hydrofluoric acid as a chemical solution (etchant), the insulation film 33 is etched. As a result, the insulation film 33 is selectively removed at portions thereof exposed from the photoresist pattern PR2. At this step, in a high breakdown voltage MISFET QH1 forming region (high breakdown voltage MISFET formation region AH1) which is a portion covered with the photoresist pattern PR2, the insulation film 33 is not removed, and is left. On the other hand, in a (low breakdown voltage) p channel type MISFET QP1 and MISFET QP2 forming region (the p type MISFET formation region AP1 and the p type MISFET formation region AP2), the insulation film 33 is removed, thereby to expose the top surface (i.e., Si surface) of the semiconductor substrate 1.

Figure 36:
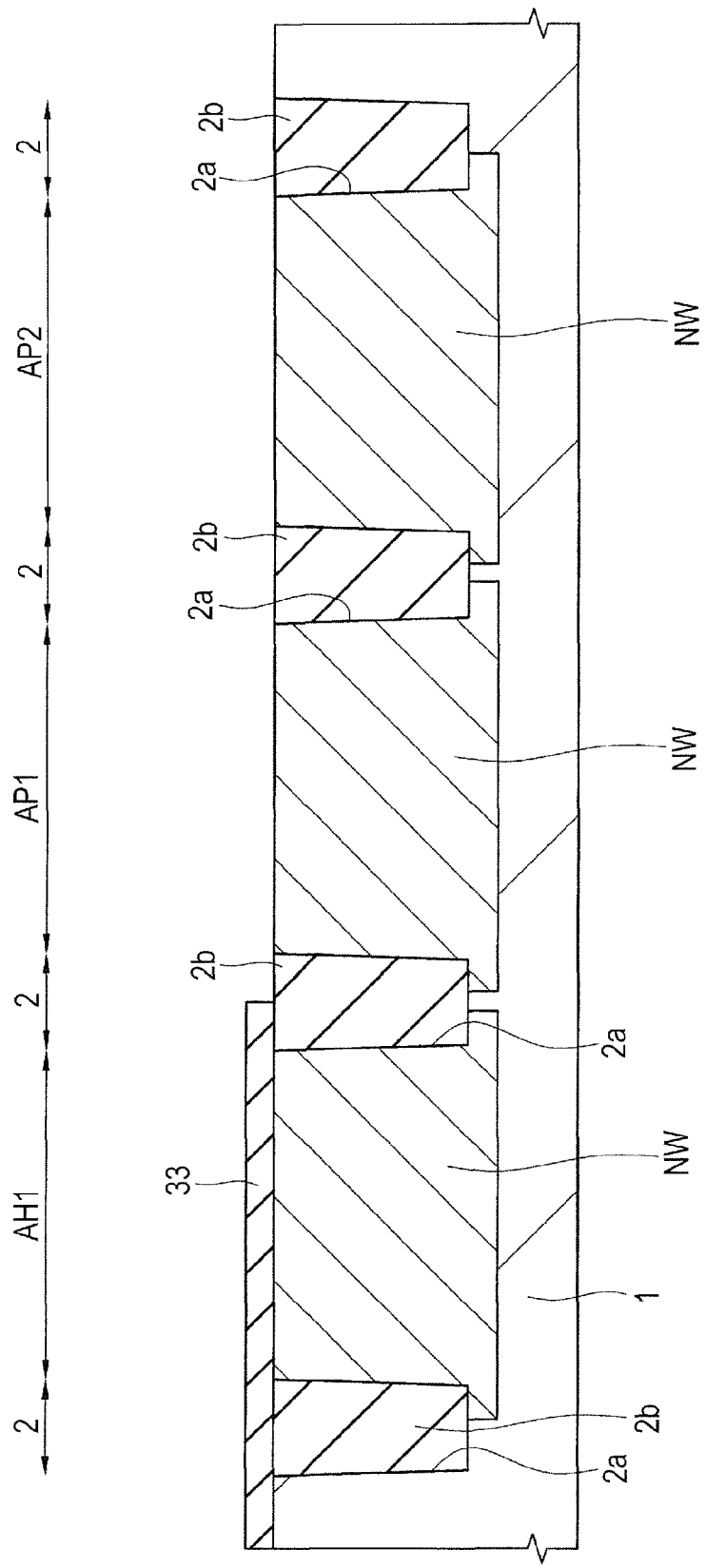
FIG. 36 is an essential-part cross-sectional view in a manufacturing step of the semiconductor device of the second embodiment.

Then, as shown in FIG. 36, the photoresist pattern PR2 is removed (Step S38 of FIG. 29). In the Step S38, removal by a wet treatment is employed, and for example, SPM washing using a SPM solution can be employed.

Figure 37:
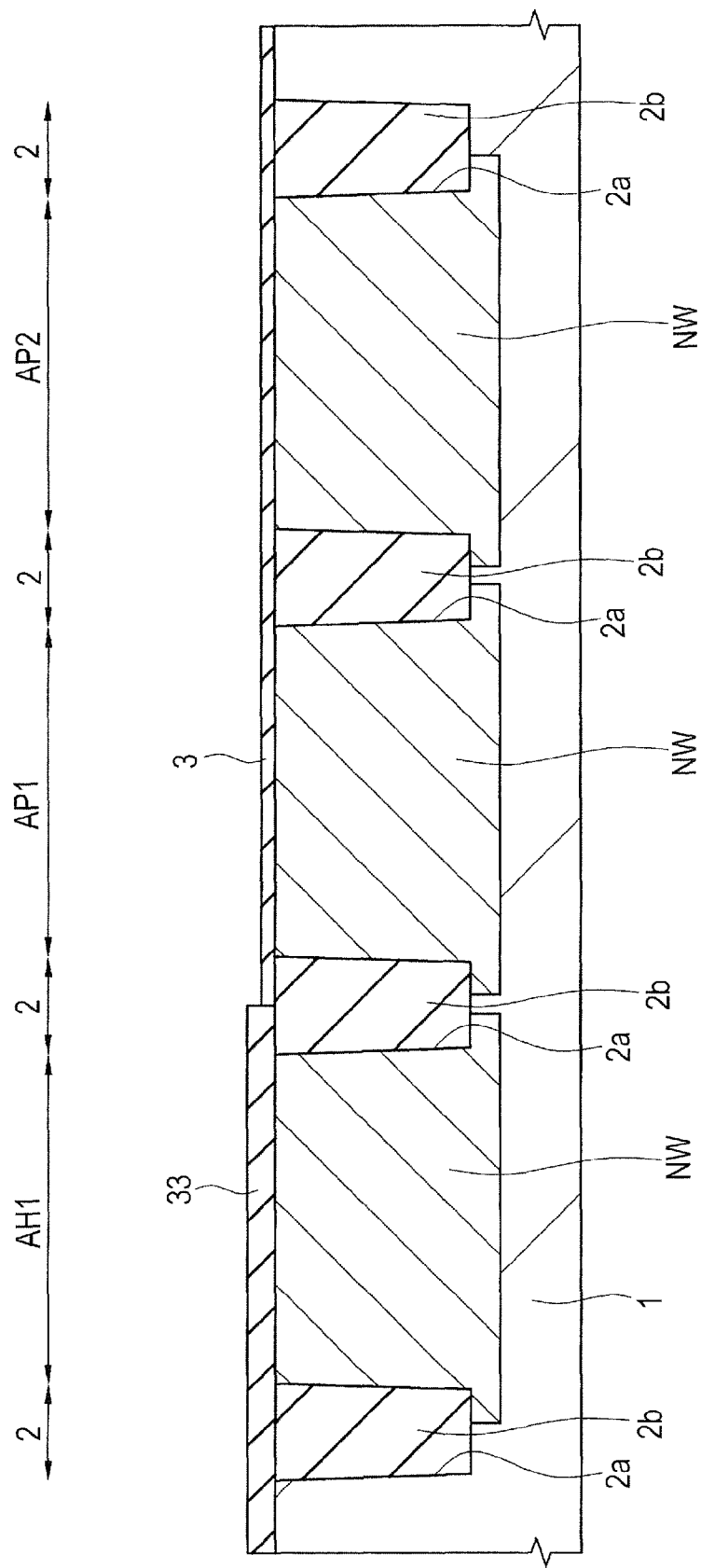
FIG. 37 is an essential-part cross-sectional view in a manufacturing step of the semiconductor device of the second embodiment.

Then, as shown in FIG. 37, over the semiconductor substrate 1, there is formed the insulation film 3 (Step S39 of FIG. 29). In the Step S39, over the surface (i.e., the surface of the n type well region NW) of the semiconductor substrate 1 in the regions (MISFET formation regions AP1 and AP2) from which the insulation film 33 has been removed in the Step S37, the insulation film 3 formed of silicon oxide is formed by, for example, a thermal oxidation method. The thickness of the insulation film 3 is set to be smaller than the thickness of the insulation film 33. When the thickness of the insulation film 33 is, for example, 7 to 12 nm, the thickness of the insulation film 3 can be set at, for example, 2 nm. Incidentally, when Step S39 is performed to form the insulation film 3, the thickness of the insulation film 33 may be larger than the thickness of the insulation film 33 after Step S35.

This results in the following state: as shown in FIG. 37, over the surface of the semiconductor substrate 1 (n type well region NW) in the (low breakdown voltage) MISFET formation regions AP1 and AP2, there is formed the insulation film 3; and over the surface of the semiconductor substrate 1 (n type well region NW) in the high breakdown voltage MISFET formation region AH1, there is formed the insulation film 33 larger in thickness than the insulation film 3.

Figure 38:
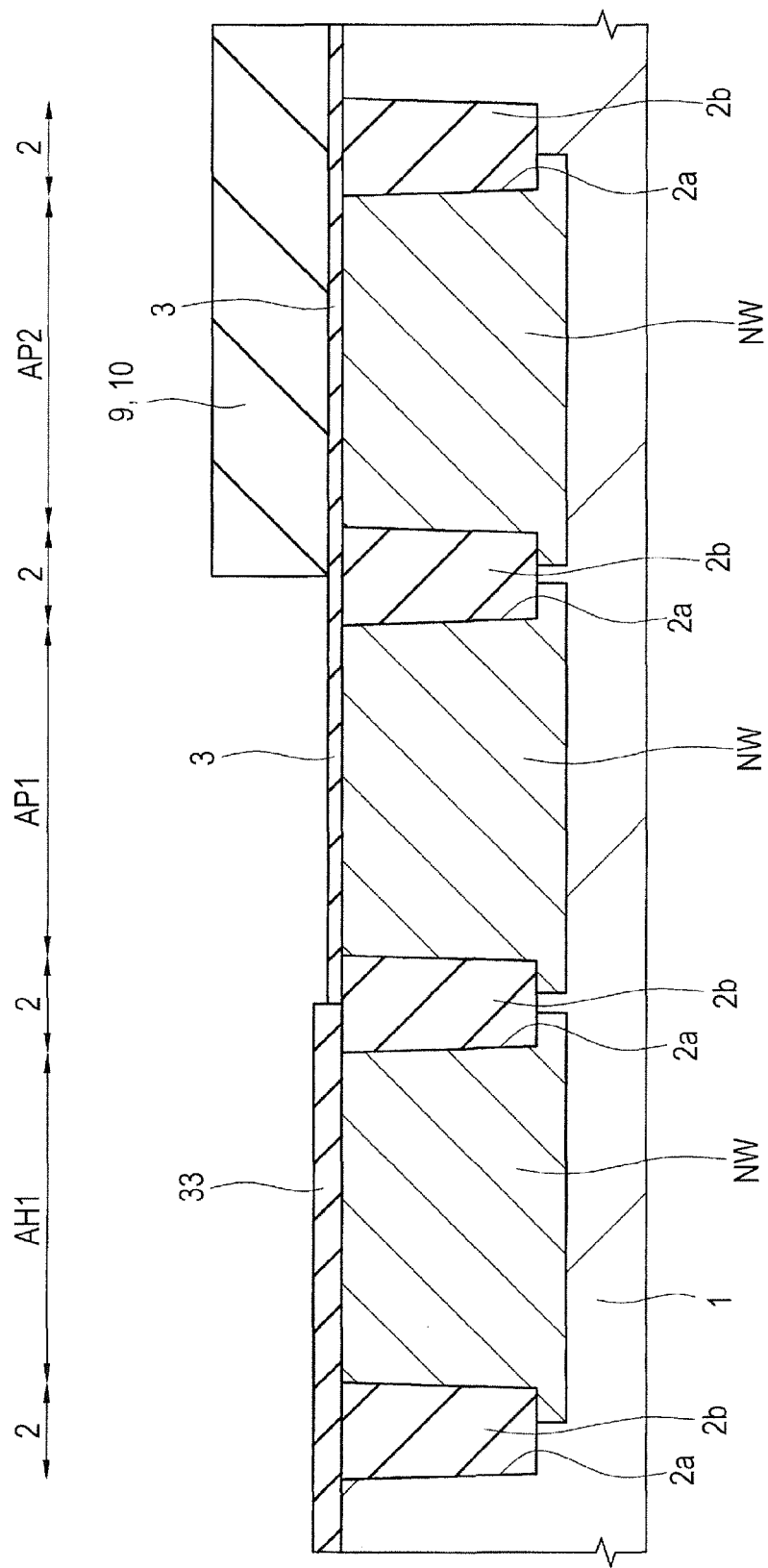
FIG. 38 is an essential-part cross-sectional view in a manufacturing step of the semiconductor device of the second embodiment.

Then, as shown in FIG. 38, over the semiconductor substrate 1, there is formed a mask film 9 (Step S40 of FIG. 29). In the Step S40, as with the step of Step S16 of FIG. 3, first, the mask film 9 with a thickness of, for example, about 5 to 30 nm is formed by, for example, a thermal CVD method. As the mask film 9, there is preferably used a film formed of one or more of silicon oxide such as TEOS, silicon nitride (SiN), and titanium nitride (TiN).

After the formation of the mask film 9, over the entire main surface (front surface) of the semiconductor substrate 1, a photoresist layer is coated. The photoresist layer is exposed to light and developed. As a result, a photoresist pattern (not shown) is formed in such a manner as to have an opening in the MISFET formation regions AH1 and AP1. Then, with the photoresist pattern as an etching mask, the mask film 9 is dry etched. Then, the photoresist pattern is removed. As a result, a hard mask pattern 10 formed of the mask film 3 is formed in such a manner as to have an opening in the MISFET formation regions AN1 and AP1, and to cover the insulation film 3 in the MISFET formation region AP2. Namely, the hard mask pattern 10 formed of the mask film 9 is formed in such a manner as to expose the insulation film 33 in the MISFET formation regions AH1, to expose the insulation film 3 in the MISFET formation region AP1, and to cover the insulation film 3 in the MISFET formation region AP2.

Figure 39:
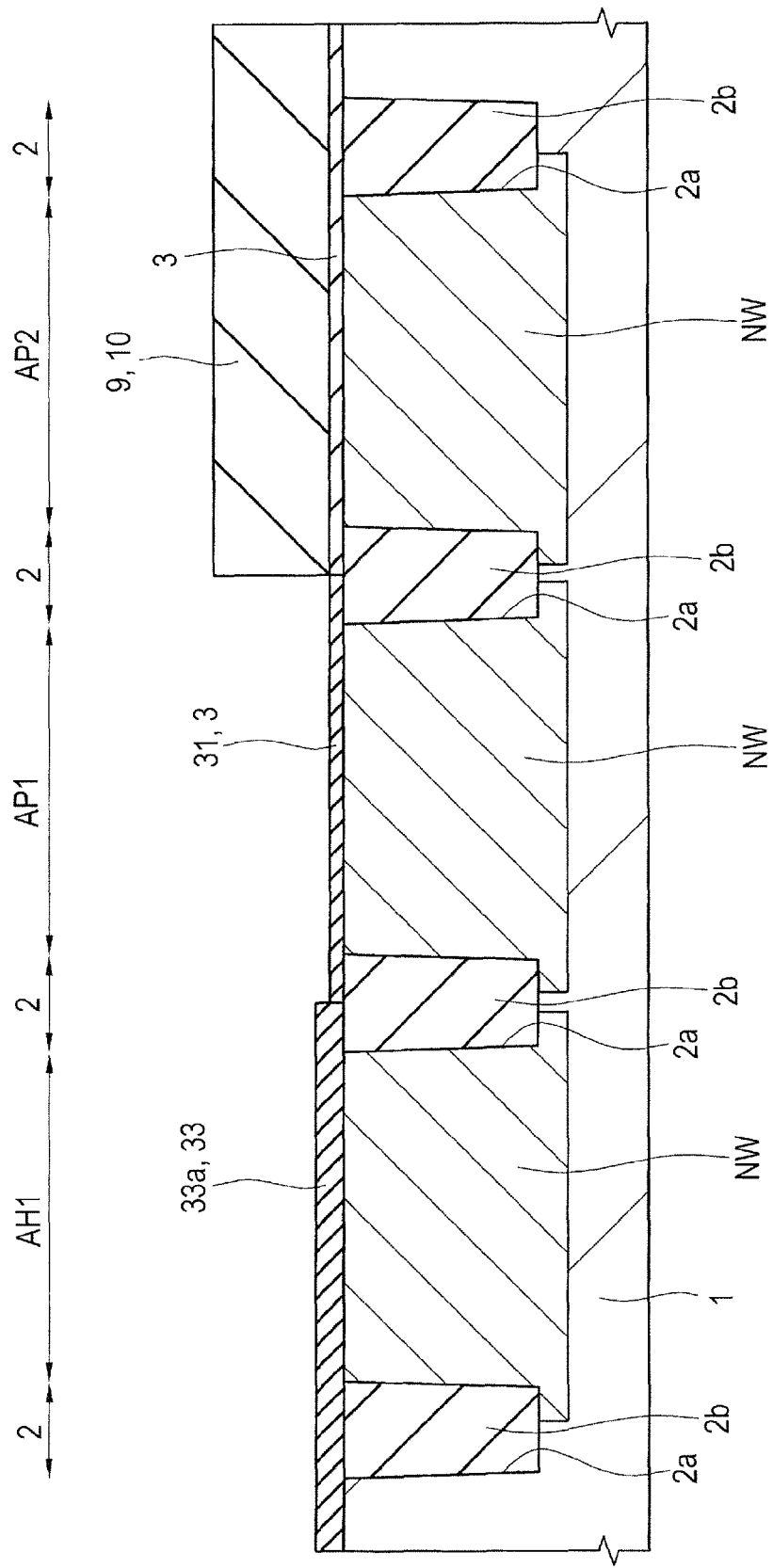
FIG. 39 is an essential-part cross-sectional view in a manufacturing step of the semiconductor device of the second embodiment.

Then, as shown in FIG. 39, the semiconductor substrate 1 is subjected to a nitriding treatment (Step S41 of FIG. 29). In the Step S41, as with the step of Step S17 of FIG. 3, the surface of the semiconductor substrate 1 is subjected to a nitriding treatment. As a result, the insulation film 33 formed of silicon oxide in the MISFET formation region AH1 is nitrided, resulting in an insulation film 33*a* formed of silicon oxynitride; and the insulation film 3 formed of silicon oxide in the MISFET formation region AP1 is nitrided, resulting in an insulation film 31 formed of silicon oxynitride. At this step, the concentration of nitrogen in the insulation film 33*a* in the MISFET formation region AH1, and the concentration of nitrogen in the insulation film 31 in the MISFET formation region AP1 are set so as to be, for example, about 10 atom %. The specific method of the nitriding treatment is the same as in the step of Step S17 of FIG. 3.

Figure 40:
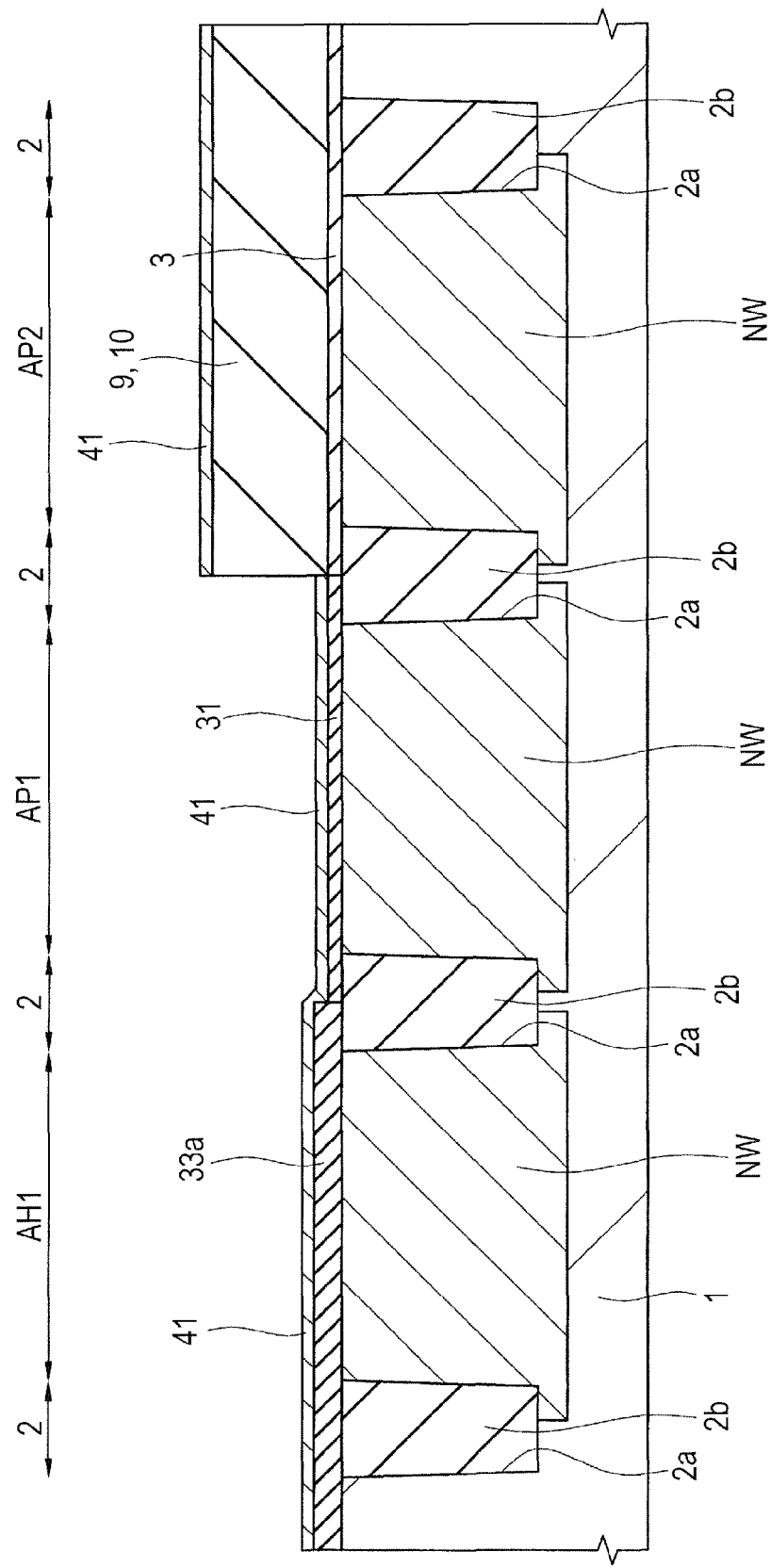
FIG. 40 is an essential-part cross-sectional view in a manufacturing step of the semiconductor device of the second embodiment.
Figure 41:
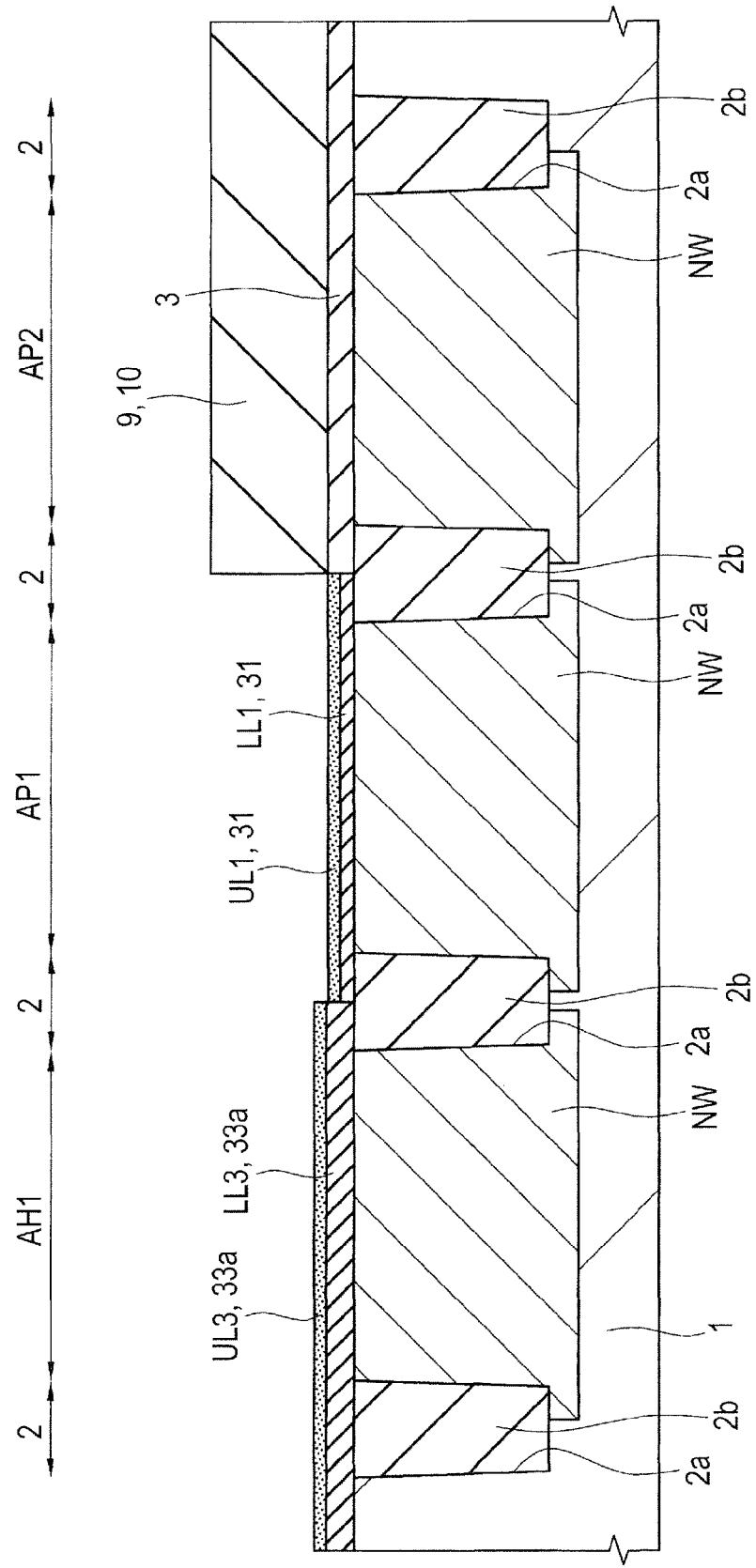
FIG. 41 is an essential-part cross-sectional view in a manufacturing step of the semiconductor device of the second embodiment.

Then, as shown in FIG. 40, over the semiconductor substrate 1, a metal-containing film 41 is formed (deposited) (Step S42 of FIG. 29). In the Step S42, as with the step of Step S18 of FIG. 3, with the insulation film 3 in the MISFET formation region AP2 being covered with the mask film 9, the metal-containing film 41 with a thickness of, for example, about 1 nm is formed over the entire main surface (front surface) of the semiconductor substrate 1 by, for example, an ALP method. As a result, the metal-containing film 41 with a thickness of, for example, about 1 nm is formed over surface of the insulation film 33a with a thickness of, for example, about 5 nm, and formed of silicon oxynitride in the MISFET formation region AH1; and the metal-containing film 41 with a thickness of, for example, about 1 nm is formed over surface of the insulation film 31 with a thickness of, for example, about 2 nm, and formed of silicon oxynitride in the MISFET formation region AP1.

As the metal-containing film 41, as with the step of Step S18 of FIG. 3, there is formed the one containing a metal such as hafnium (Hf), aluminum (Al), or titanium (Ti), or the one containing titanium nitride (TiN). Out of these, hafnium (Hf) is preferable in that it produces a larger effect of enabling adjustment of the threshold voltage (Vth) without adjusting the impurity concentration of the channel region than those of other metals. Whereas, when the metal-containing film 41 contains hafnium, the metal-containing film 41 is formed of one or more of hafnium oxide (HfO), hafnium oxynitride (HfON), and HfSiON. At this step, the concentration of hafnium in the metal-containing film 41 is set so as to be, for example, about $5 \times 10^{13}$ atoms/cm$^2$.

Further, in consideration of the reduction due to etching in the subsequent step (Step S43 of FIG. 30), in Step S42, the concentration of hafnium is preferably set so as to be an amount about 1.5 to 2.0 times the desirable concentration. At this step, the concentration of hafnium in the metal-containing film 41 is set so as to be, for example, about $7.5 \times 10^{13}$ to $1 \times 10^{14}$ atoms/cm$^2$.

FIG. 40 shows the case where the metal-containing film 41 is definitely formed. However, there is also a case where a metal-containing film is not definitely formed, and a metal is added to the insulation film 33a and the insulation film 31. FIG. 41 shows the following state: a metal is added to the insulation film 33a, so that in the MISFIT formation region AH1, there are formed an upper layer film UL3 formed of the insulation film 33a including a metal added therein, and a lower layer film LL3 formed of the insulation film 33a not including a metal added therein. Whereas, FIG. 41 shows the following state: a metal is added to the insulation film 31, so that in the MISFIT formation region AP1, there are formed an upper layer film UL1 formed of the insulation film 31 including a metal added therein, and a lower layer film LL1 formed of the insulation film 31 not including a metal added therein.

Figure 42:
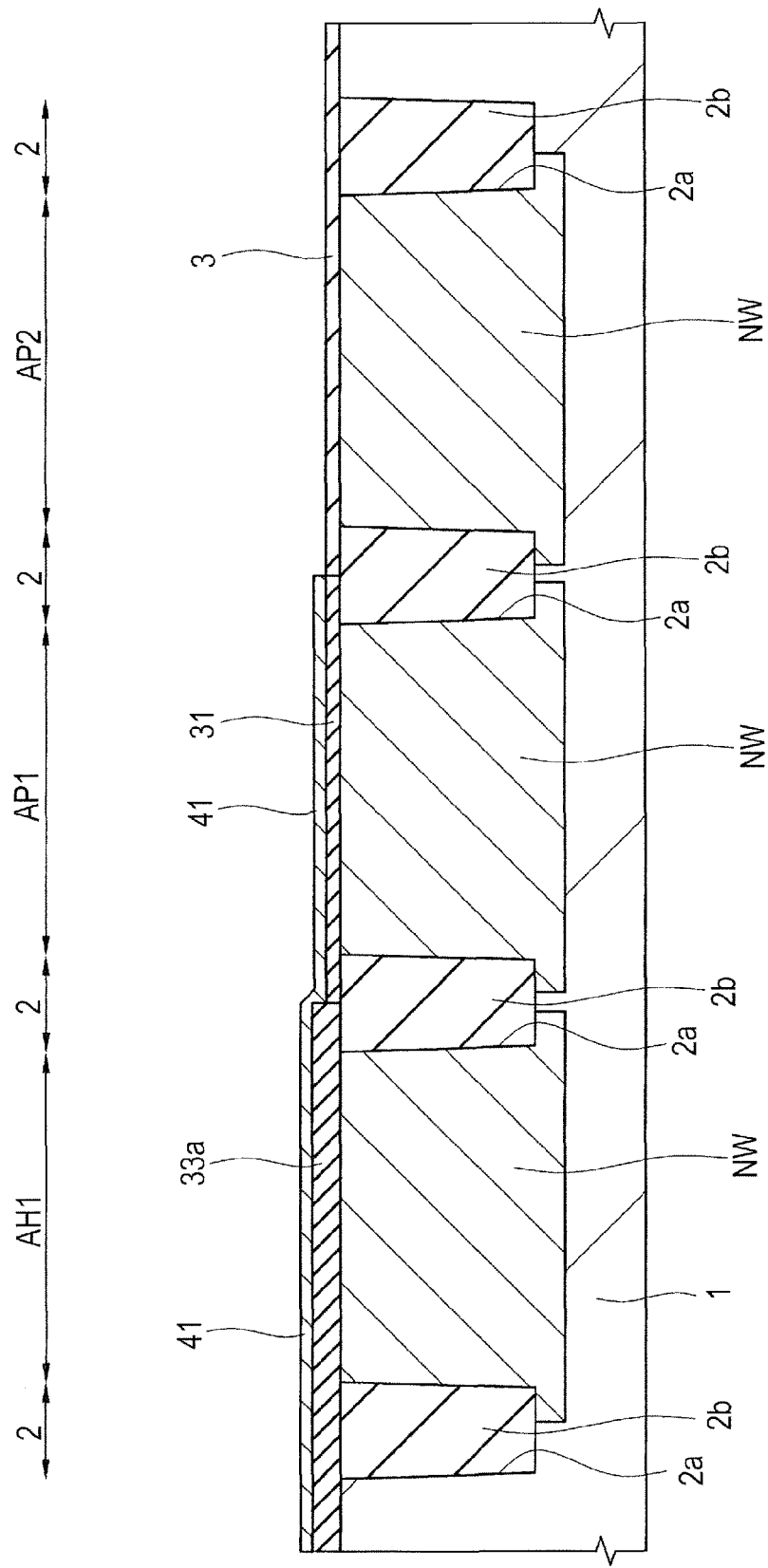
FIG. 42 is an essential-part cross-sectional view in a manufacturing step of the semiconductor device of the second embodiment.

Then, as shown in FIG. 42, wet etching is performed (Step S43 of FIG. 30). In the Step S43, as with the step of Step S19 of FIG. 3, the mask film 9 is removed by wet etching. When the mask film 9 is formed of silicon oxide such as TEOS, silicon nitride (SiN), or titanium nitride (TiN), as the chemical solution (etchant) for wet etching, there is preferably used hydrofluoric acid, or hot phosphoric acid or hydrofluoric acid. Then, in the MISFET formation region AP2, the mask film 9 is removed, and the insulation film 3 is exposed.

Figure 43:
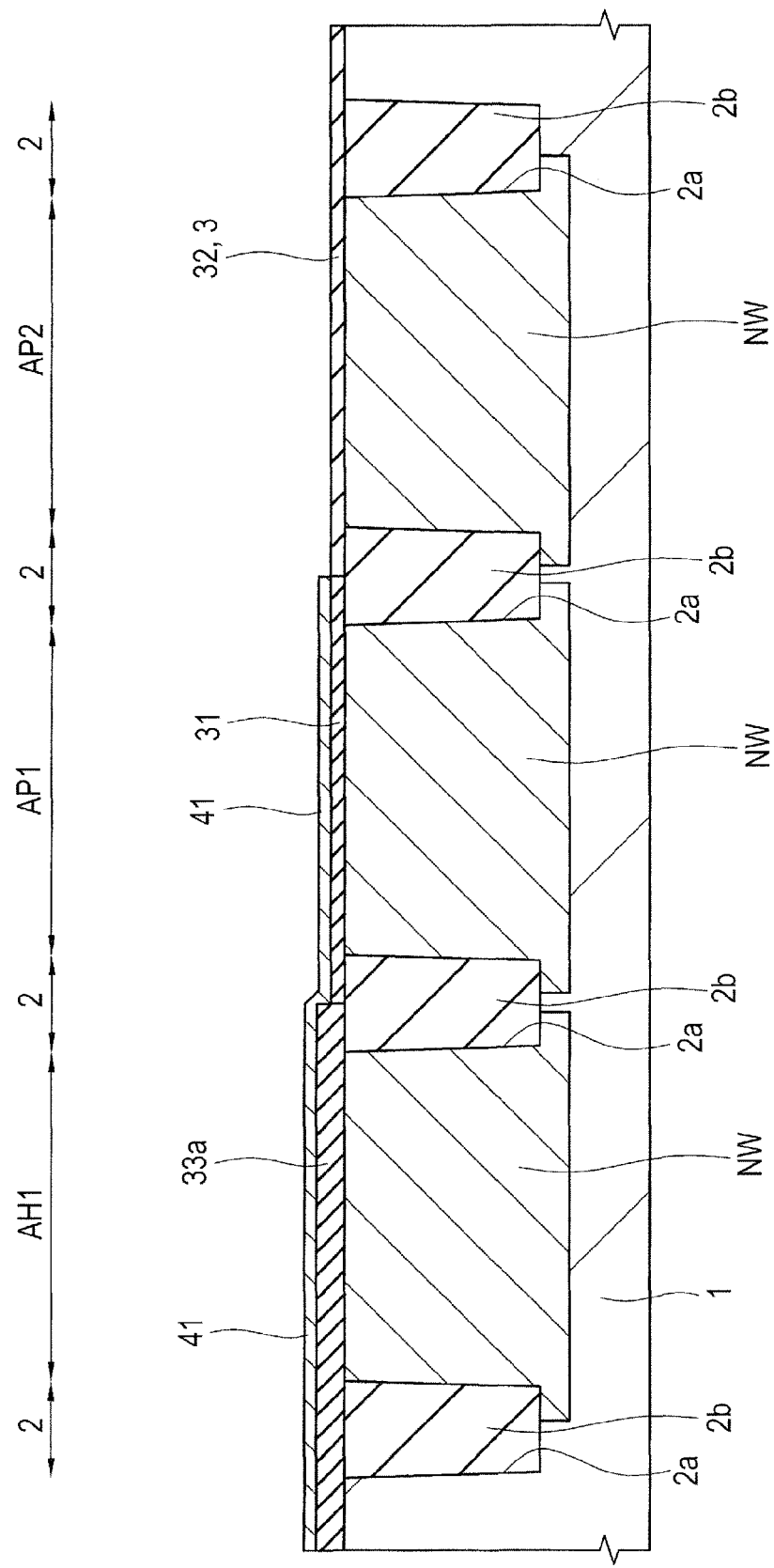
FIG. 43 is an essential-part cross-sectional view in a manufacturing step of the semiconductor device of the second embodiment.

Then, as shown in FIG. 43, the semiconductor substrate 1 is subjected to a nitriding treatment (Step S44 of FIG. 30). In the Step S44, the entire main surface (front surface) of the semiconductor substrate 1 including the portion of the insulation film 3 in the MISFET formation region AP2 not nitrided in Step S41 is subjected to a nitriding treatment. As a result, the insulation film 3 formed of silicon oxide in the MISFET formation region AP2 is nitrided, resulting in an insulation film 32 formed of silicon oxynitride. At this step, the concentration of nitrogen in the insulation film 32 in the p type MISFET formation region AP2 is set so as to be, for example, about 5 atom %.

The nitriding treatment in Step S44 is also performed in the same manner as the nitriding treatment in Step S41.

Figure 44:
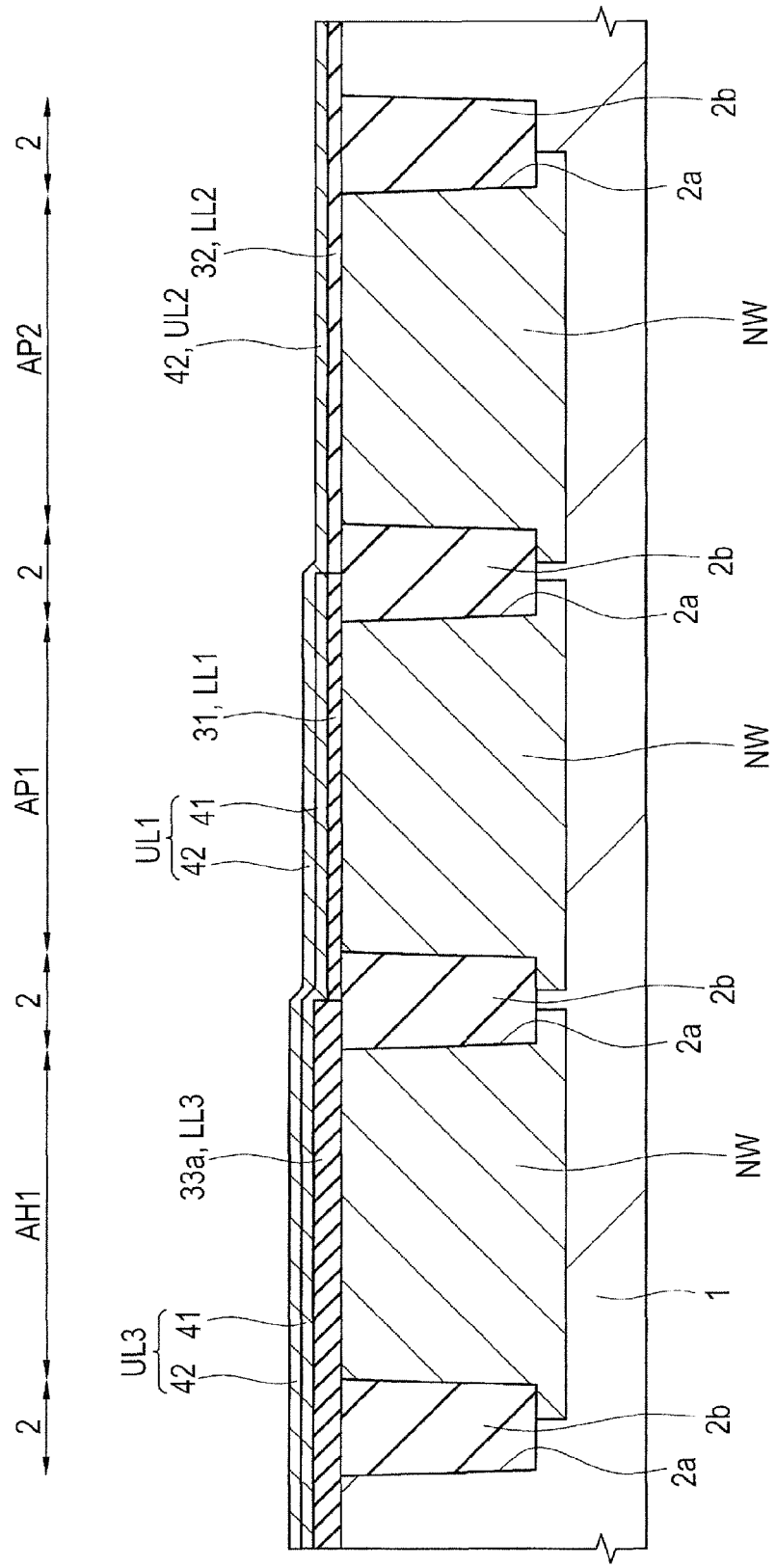
FIG. 44 is an essential-part cross-sectional view in a manufacturing step of the semiconductor device of the second embodiment.
Figure 45:
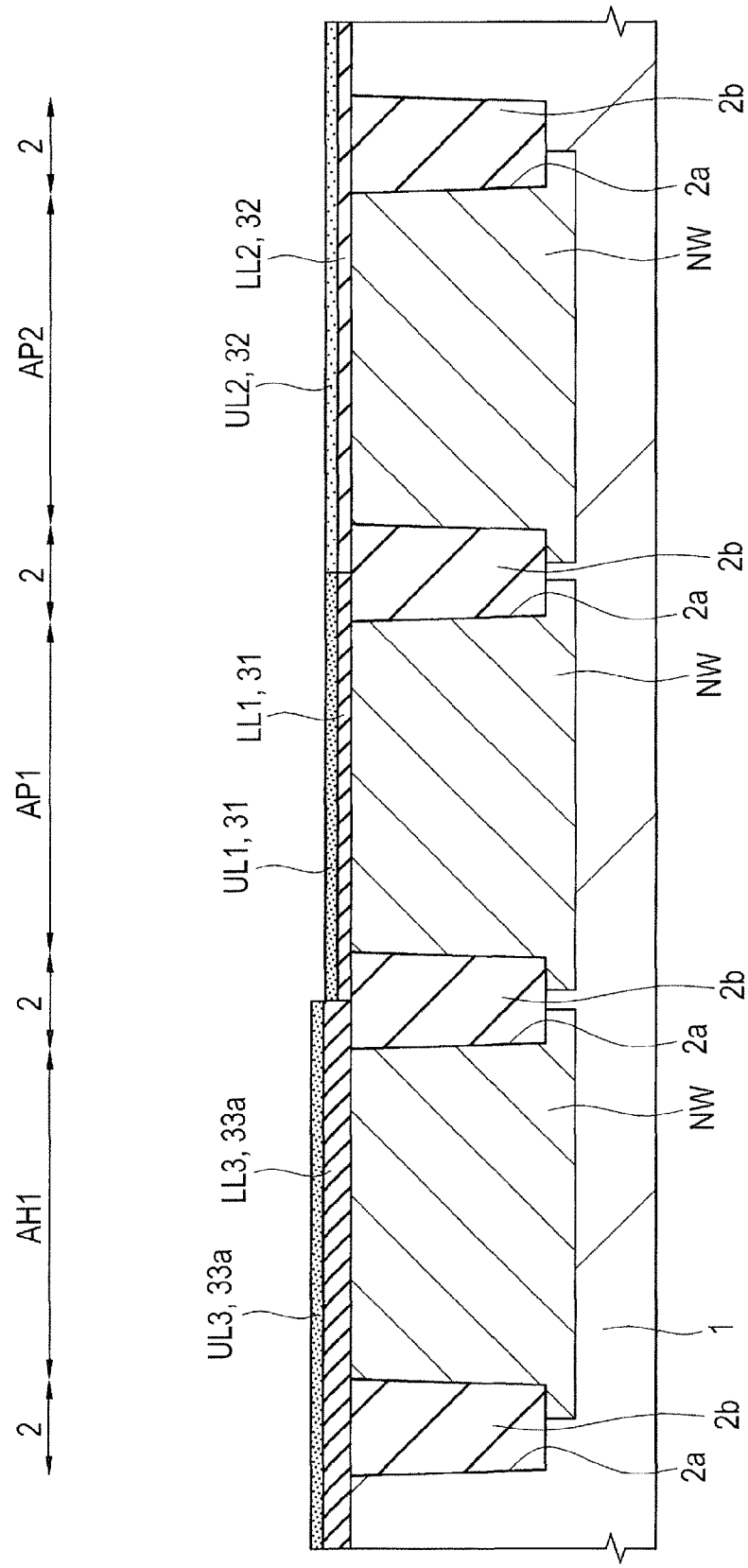
FIG. 45 is an essential-part cross-sectional view in a manufacturing step of the semiconductor device of the second embodiment.

Then, as shown in FIG. 44, over the semiconductor substrate 1, the metal-containing film 42 is formed (deposited) (Step S45 of FIG. 30). In the Step S45, over the entire main surface (front surface) of the semiconductor substrate 1, including the portion of the insulation film 32 in the MISFET formation region AP2 on which the metal-containing film 41 was not formed (deposited) in Step S42, the metal-containing film 42 with a thickness of, for example, about 1 nm is formed by, for example, an ALD method. As a result, in the MISFET formation region AP2, over the surface of the insulation film 32 with a thickness of, for example, about 2 nm, and formed of silicon oxynitride, there is formed the metal-containing film 42 with a thickness of, for example, about 1 nm. Whereas, in the MISFET formation regions AH1 and AP1, over the surface of the metal-containing film 41 with a thickness of, for example, about 1 nm, there is formed the metal-containing film 42 with a thickness of, for example, about 1 nm.

The insulation film 33a in the MISFET formation region AH1 forms the lower layer film LL3 of the gate insulation film GI3 (see FIG. 47) to be formed in the subsequent step (Step S48 of FIG. 30). The metal-containing film 41 and the metal-containing film 42 in the MISFET formation region AH1 form the upper layer film UL3 of the gate insulation film GI3 (see FIG. 47) to be formed in the subsequent step (Step S48 of FIG. 30). The insulation film 31 in the MISFET formation region AP1 forms the lower layer film LL1 of the gate insulation film GI1 (see FIG. 47) to be formed in the subsequent step (Step S48 of FIG. 30). Thee metal-containing film 41 and the metal-containing film 42 in the MISFET formation region AP1 form the upper layer film UL1 of the gate insulation film GI1 (see FIG. 47) to be formed in the subsequent step (Step S48 of FIG. 30). The insulation film 32 in the MISFET formation region AP2 forms the lower layer film LL2 of the gate insulation film GI2 (see FIG. 47) to be formed in the subsequent step (Step S48 of FIG. 30). The metal-containing film 42 in the MISFET formation region AP2 forms the upper layer film UL2 of the gate insulation film GI2 (see FIG. 47) to be formed in the subsequent step (Step S48 of FIG. 30). Whereas, the thickness of the upper layer film UL2 formed of the metal-containing film 42 is smaller than the thickness of any film of the upper layer films UL3 and UL1 formed of the metal-containing films 41 and 42.

For the metal-containing film 42, there is used the same material as that for the metal-containing film 41. Whereas, when the metal-containing film 42 contains hafnium, the concentration of hafnium in the metal-containing film 42 is set so as to be, for example, about $5 \times 10^{13}$ atoms/cm$^2$. Then, when the concentration of hafnium in the metal-containing film 41 is set at about $5 \times 10^{13}$ atoms/cm$^2$ as described above, the concentration of hafnium in the upper layer film UL2 formed of the metal-containing film 42 is set at, for example, about $5 \times 10^{13}$ atoms/cm$^2$. As a result, it is possible to set the concentration of hafnium in the upper layer films UL3 and UL1 formed of the metal-containing films 41 and 42 at, for example, about $1 \times 10^{14}$ atoms/cm$^2$.

FIG. 44 shows the case where the metal-containing film 42 is definitely formed. However, there is also a case where a metal-containing film is not definitely formed, and a metal is added to the insulation film 32. FIG. 45 shows the following state: a metal is added to the insulation film 32, so that in the MISFET formation region AP2, there are formed an upper layer film UL2 formed of the insulation film 32 including a metal added therein, and a lower layer film LL2 formed of the insulation film 32 not including a metal added therein. Incidentally, FIG. 45 shows the following state: also in the MISFET formation region AH1, there are formed the upper layer film UL3 formed of the insulation film 33a including a metal added therein, and the lower layer film LL3 formed of the insulation film 33a not including a metal added therein; and also in the MISFET formation region AP1, there are formed the upper layer film UL1 formed of the insulation film 31 including a metal added therein, and the lower layer film LL1 formed of the insulation film 31 not including a metal added therein.

Further, in FIG. 45, the dots of the upper layer film UL3 in the MISFET formation region AH1 and the dots of the upper layer film UL1 in the MISFET formation region AP1 are shown more thickly than the dots of the upper layer film UL2 in the MISFET formation region AP2. Such representation indicates that both of the concentration of the metal of the upper layer film UL3 in the MISFET formation region AH1, and the concentration of the metal of the upper layer film UL1 in the MISFET formation region AP1 are larger than the concentration of the metal of the upper layer film UL2 in the MISFET formation region AP2.

Figure 46:
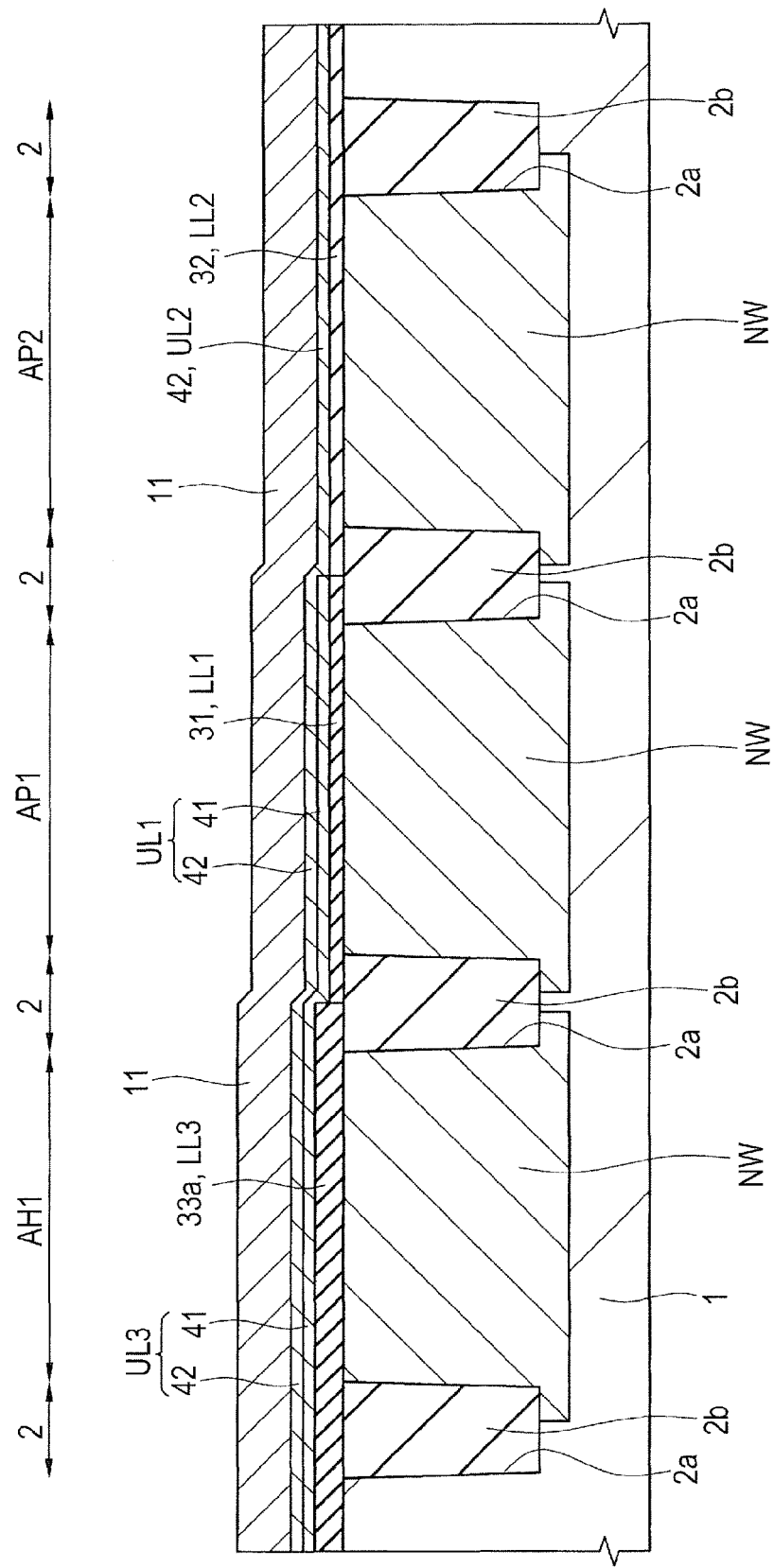
FIG. 46 is an essential-part cross-sectional view in a manufacturing step of the semiconductor device of the second embodiment.

Then, the same step as Step S22 of FIG. 4 is performed. As a result, as shown in FIG. 46, over the semiconductor substrate 1, there is formed a gate electrode conductor film 11 (Step S46 of FIG. 30). In the Step S46, as with the step of Step S22 of FIG. 4, over the entire main surface (front surface) of the semiconductor substrate 1, there is formed the gate electrode conductor film 11. As the gate electrode conductor film 11, there can be used a conductor film formed of, for example, polycrystal silicon (doped polysilicon).

Then, as with the step of Step S23 of FIG. 4, over the entire main surface (front surface) of the semiconductor substrate 1, a photoresist layer is coated, and then, is exposed to light and developed, thereby to form a photoresist pattern PR1 (Step S47 of FIG. 30). Then, as with the step of Step S24 of FIG. 4, by dry etching using the photoresist pattern PR1 as an etching mask, there are etched the conductor film 11, the metal-containing film 42, the metal-containing film 41, the insulation film 33a, the insulation film 31, and the insulation film 32. As a result, as shown in FIG. 47, in the MISFET formation region AH1, there are formed the patterned gate electrode GE and gate insulation film GI3; in the MISFET formation region AP1, there are formed the patterned gate electrode GE and gate insulation film GI1; and in the MISFET formation region AP2, there are formed the patterned gate electrode GE and gate insulation film GI2 (Step S48 of FIG. 30). Thereafter, the photoresist pattern PR1 is removed. FIG. 47 shows the stage (state) at (in) which the photoresist pattern PR1 has been removed.

As shown in FIG. 47, the gate electrode GE is formed of the conductor film 11. The gate insulation film GI3 has the lower layer film LL3 formed of the insulation film 33a, and the upper layer film UL3 formed over the lower layer film LL3, and formed of the metal-containing film 42 and the metal-containing film 41. The gate insulation film GI1 has the lower layer film LL1 formed of the insulation film 31, and the upper layer film UL1 formed over the lower layer film LL1, and formed of the metal-containing film 42 and the metal-containing film 41. The gate insulation film GI2 has the lower layer film LL2 formed of the insulation film 32, and the upper layer film UL2 formed over the lower layer film LL2, and formed of the metal-containing film 42.

Incidentally, when the metal-containing film 41 and the metal-containing film 42 are not definitely formed, and a metal is added to the insulation film 33a, the insulation film 31, and the insulation film 32 as described by reference to FIGS. 41 and 45, in Step S48, the conductor film 11, the insulation film 33a, the insulation film 31, and the insulation film 32 are etched by dry etching. As a result, in the MISFET formation region AH1, there are formed the patterned gate electrode GE and gate insulation film GI3; in the MISFET formation region AP1, there are formed the patterned gate electrode GE and gate insulation film GI1; and in the MISFET formation region AP2, there are formed the patterned gate electrode GE and gate insulation film GI2. This state is shown in FIG. 48. Incidentally, in FIG. 48, in the MISFET formation region AH1, the gate insulation film GI3 has the upper layer film UL3 formed of the insulation film 33a including a metal added therein, and the lower layer film LL3 formed of the insulation film 33a not including a metal added therein. Whereas, in the MISFET formation region AP1, the gate insulation film GI1 has the upper layer film UL1 formed of the insulation film 31 including a metal added therein, and the lower layer film LL1 formed of the insulation film 31 not including a metal added therein. Further, in the MISFET formation region AP2, the gate insulation film GI2 has the upper layer film UL2 formed of the insulation film 32 including a metal added therein, and the lower layer film LL2 formed of the insulation film 32 not including a metal added therein.

Figure 49:
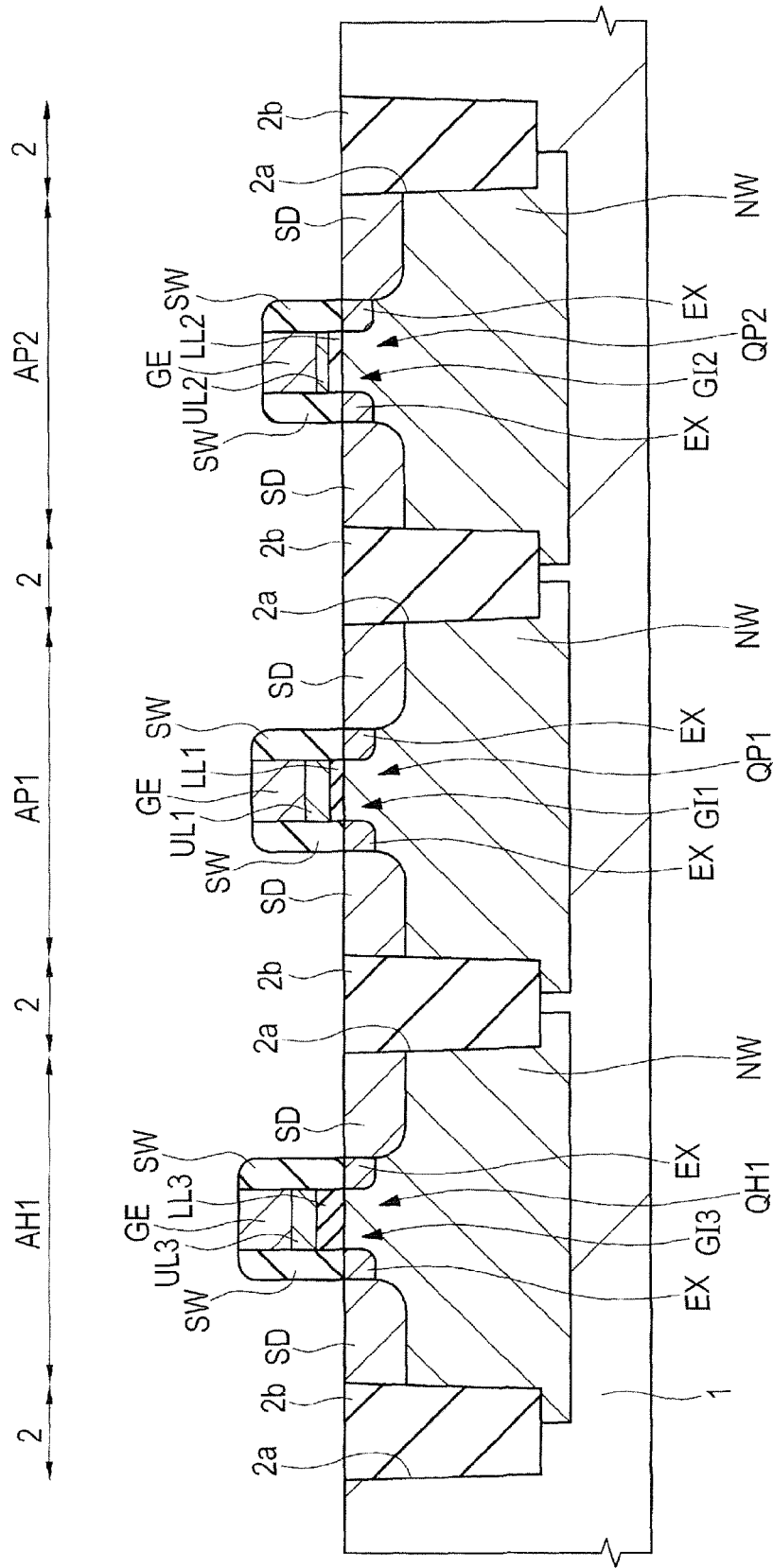
FIG. 49 is an essential-part cross-sectional view in a manufacturing step of the semiconductor device of the second embodiment.

Thereafter, the same steps (Step S49 to Step S51 of FIG. 30) as Step S25 to Step S27 of FIG. 4 are performed. As a result, as shown in FIG. 49, in the high breakdown voltage MISFET formation region AH1, there is formed the high breakdown voltage MISFET QH1. Whereas, in the p type MISFET formation region AP1, there is formed the p channel type MISFET QP1 having a large threshold voltage (Vth). Further, in the p type MISFET formation region AP2, there is formed the p channel type MISFET QP2 having a small threshold voltage (Vth). Further, as with the step of Step S20 of FIG. 4, there is formed the interlayer insulation film 5 and the plug PG (Step S52 of FIG. 30). As with the step of Step S29 of FIG. 4, over the interlayer insulation film 5 including the plugs PG embedded therein, there are formed the insulation film 6 and the wire M1 (Step S53 of FIG. 30). As a result, as shown in FIG. 27, there is manufactured the semiconductor device of the present embodiment. Incidentally, when the metal-containing film 41 and the metal-containing film 42 are not definitely formed, and a metal is added to the insulation film 33a, the insulation film 31, and the insulation film 32 as described by reference to FIGS. 41, 45, and 48, there is manufactured the semiconductor device as shown in FIG. 28.

<Main Features and Effects of the Present Embodiment>

The semiconductor device of the present embodiment also has the p channel type MISFET QP1 having a large threshold voltage (Vth), and the p channel type MISFET QP2 having a small threshold voltage (Vth). Then, the concentration of hafnium (metal) in the upper layer film UL2 of the MISFET QP2 is made smaller than the concentration of hafnium (metal) in the upper layer film UL1 of the MISFET QP1; and the concentration of nitrogen in the lower layer film LL2 of the MISFET QP2 is made smaller than the concentration of nitrogen in the lower layer film LL1 of the MISFET QP1. As a result, as with the first embodiment, when the threshold voltage (Vth) of the MISFET QP2 is adjusted so as to be reduced, the impurity concentration in the channel region is not required to be reduced. For this reason, even when the channel length of the MISFET QP2 is short, the deterioration of the transistor characteristics can be suppressed.

Further, the semiconductor device of the present embodiment has the high breakdown voltage MISFET QH1 in addition to the MISFET QP1 having a large threshold voltage (Vth) and the MISFET QP2 having a small threshold voltage (Vth). Then, the concentration of hafnium (metal) in the upper layer film UL2 of the MISFET QP2 is set smaller than the concentration of hafnium (metal) in the upper layer film UL3 of the MISFET QH1. The concentration of nitrogen in the lower layer film LL2 of the MISFET QP2 is set smaller than the concentration of nitrogen in the lower layer film LL3 of the MISFET QH1.

When a circuit including a high breakdown voltage MISFET and a circuit including a (low breakdown voltage) MISFET which does not have a high breakdown voltage are merged in the same semiconductor device, the power supply voltage is high in the circuit including a high breakdown voltage MISFET. Therefore, for the high breakdown voltage MISFET, from the viewpoint of ensuring the high breakdown voltage, and from the viewpoint of so-called hot carrier resistance, it is more advantageous to increase the threshold voltage (Vth) by adjusting the structure of the gate insulation film than to increase the threshold voltage (Vth) by adjusting the impurity concentration in the channel region. Namely, the increase in concentration of the metal such as hafnium in the gate insulation film of the high breakdown voltage MISFET is more advantageous in being capable of increasing the threshold voltage (Vth) of the high breakdown voltage MISFET with ease than the adjustment of the impurity concentration in the channel region.

On the other hand, it can also be considered that the design of the structure of the source/drain regions SD, or the design of the LDD structure including the source/drain regions SD and the extension region EX increases the threshold voltage (Vth) of the high breakdown voltage MISFET. However, as described above, the increase in concentration of the metal such as hafnium in the gate insulation film can increase the threshold voltage (Vth) of the high breakdown voltage MISFET with ease. For this reason, it is possible to improve the performances of the semiconductor device including a high breakdown voltage MISFET merged therein with more ease. As a result, it is possible to design the semiconductor device including a high breakdown voltage MISFET merged therein readily and rationally.

Up to this point, the inventions made by the present inventors were specifically described by way of embodiments thereof. However, it is naturally understood that the present invention is not limited to the embodiments, and may be variously changed within the scope not departing from the gist thereof.

The present invention is effectively applicable to a semiconductor device and a manufacturing method thereof.

What is claimed is:

1. A semiconductor device comprising a first MISFET and a second MISFET formed over a semiconductor substrate,
the first MISFET comprising:
a first gate insulation film including a first lower layer film including silicon, oxygen, and nitrogen formed over the semiconductor substrate, and a first upper layer film including hafnium formed over the first lower layer film; and
a first gate electrode formed over the first gate insulation film, and
the second MISFET comprising:
a second gate insulation film including a second lower layer film including silicon, oxygen, and nitrogen formed over the semiconductor substrate, and a second upper layer film including hafnium formed over the second lower layer film; and
a second gate electrode formed over the second gate insulation film,
wherein the concentration of hafnium in the second upper layer film is smaller than the concentration of hafnium in the first upper layer film, and
wherein the concentration of nitrogen in the second lower layer film is smaller than the concentration of nitrogen in the first lower layer film,
wherein both of the first MISFET and the second MISFET are of a p channel type.

2. The semiconductor device according to claim 1, wherein the thickness of the second upper layer film is smaller than the thickness of the first upper layer film.

3. The semiconductor device according to claim 1, comprising the first MISFET, the second MISFET, and an n channel type third MISFET,
the third MISFET comprising:
a third gate insulation film including a third lower layer film including silicon, oxygen, and nitrogen formed over the semiconductor substrate, and a third upper layer film including hafnium formed over the third lower layer film; and
a third gate electrode formed over the third gate insulation film,
wherein the concentration of hafnium in the second upper layer film is smaller than the concentration of hafnium in the third upper layer film, and
wherein the concentration of nitrogen in the second lower layer film is smaller than the concentration nitrogen in the third lower layer film.

4. The semiconductor device according to claim 1, wherein both of the first upper layer film and the second upper layer film each include one or more of HfO, HfON, and HfSiON.

5. A semiconductor device comprising a first MISFET, a second MISFET, and a third MISFET formed over a semiconductor substrate,
the first MISFET comprising:
a first gate insulation film including a first lower layer film including silicon, oxygen, and nitrogen formed over the semiconductor substrate, and a first upper layer film including hafnium formed over the first lower layer film; and
a first gate electrode formed over the first gate insulation film,
the second MISFET comprising:
a second gate insulation film including a second lower layer film including silicon, oxygen, and nitrogen formed over the semiconductor substrate, and a second upper layer film including hafnium formed over the second lower layer film;
a second gate electrode formed over the second gate insulation film,
wherein the concentration of hafnium in the second upper layer film is smaller than the concentration of hafnium in the first upper layer film, and
wherein the concentration of nitrogen in the second lower layer film is smaller than the concentration of nitrogen in the first lower layer film, and
the third MISFET comprising:
a third gate insulation film including a third lower layer film including silicon, oxygen, and nitrogen formed over the semiconductor substrate, and a third upper layer film including hafnium formed over the third lower layer film; and a third gate electrode formed over the third gate insulation film, wherein the thickness of the third lower layer film is larger than the thickness of any of the first lower layer film and the second lower layer film, wherein the concentration of hafnium in the second upper layer film is smaller than the concentration of hafnium in the third upper layer film, and wherein the concentration of nitrogen in the second lower layer film is smaller than the concentration of nitrogen in the third lower layer film.

6. The semiconductor device according to claim 5, wherein the concentration of hafnium in the third upper layer film is equal to the concentration of hafnium in the first upper layer film, and wherein the concentration of nitrogen in the third lower layer film is equal to the concentration of nitrogen in the first lower layer film.

7. A method for manufacturing a semiconductor device, the semiconductor device comprising a first MISFET and a second MISFET formed over a semiconductor substrate, the first MISFET, having: a first gate insulation film formed over the semiconductor substrate; and a first gate electrode formed over the first gate insulation film, and the second MISFET, having: a second gate insulation film formed over the semiconductor substrate; and a second gate electrode formed over the second gate insulation film, the method, comprising the steps of:
(a) preparing the semiconductor substrate;
(b) after the step (a), forming a first film including silicon and oxygen over the semiconductor substrate;
(c) after the step (b), forming a mask film over the semiconductor substrate in such a manner as to expose the first film in a first region in which the first MISFET is formed, and to cover the first film in a second region in which the second MISFET is formed;
(d) alter the step (c), subjecting the first film exposed in the first region to a nitriding treatment;
(e) after the step (d), forming a second film including hafnium over the first film exposed in the first region;
(f) after the step removing the mask film, and thereby exposing the first film in the second region;
(g) after the step (f), subjecting the first film exposed in the second region to a nitriding treatment;
(h) after the step (g), forming a third film including hafnium over the semiconductor substrate, and thereby forming a first lower layer film including silicon, oxygen, and nitrogen disposed over the semiconductor substrate, and a first upper layer film including hafnium disposed over the first lower layer film in the first region, and forming a second lower layer film including silicon, oxygen, and nitrogen disposed over the semiconductor substrate, and a second upper layer film including hafnium disposed over the second lower layer film in the second region;
(i) after the step (h), forming a conductor film over the semiconductor substrate; and
(j) alter the step (i), patterning the conductor film, the first upper layer film, the first lower layer film, and the second lower layer film, and thereby forming the first gate electrode formed of the conductor film, and the first gate insulation film formed of the first upper layer film and the first lower layer film in the first region. and forming the second gate electrode formed of the conductor film, and the second gate insulation film formed of the second upper layer film and the second lower layer film in the second region, wherein the concentration of hafnium in the second upper layer film is smaller than the concentration of hafnium in the first upper layer film, and wherein the concentration of nitrogen in the second lower layer film is smaller than the concentration of nitrogen in the first lower layer film, wherein both of the first MISFET and the second MISFET are of a p channel type.

8. The method for manufacturing a semiconductor device according to claim 7, wherein the thickness of the second upper layer film is smaller than the thickness of the first upper layer film.

9. The method for manufacturing a semiconductor device according to claim 7, wherein both of the first upper layer film and the second upper layer film each include one or more of HfO, HfON, and HfSiON.

10. A method for manufacturing a semiconductor device, the semiconductor device comprising a first MISFET and a second MISFET formed over a semiconductor substrate, the first MISFET, having: a first gate insulation film formed over the semiconductor substrate; and a first gate electrode formed over the first gate insulation film, and the second MISFET, including: a second gate insulation film formed over the semiconductor substrate; and a second gate electrode formed over the second gate insulation film, the method, comprising the steps of:
(a) preparing the semiconductor substrate;
(h) after the step (a), forming a first film including silicon and oxygen over the semiconductor substrate;
(c) after the step (b), forming a mask film over the semiconductor substrate in such a manner as to expose the first film in a first region in which the first MISFET is formed, and to cover the first film in a second region in which the second MISFET is formed;
(d) after the step (c), subjecting the first film exposed in the first region to a nitriding treatment;
(e) after the step (d), adding hafnium to the first film exposed in the first region;
(f) after the step (e), removing the mask film, and thereby exposing the first film in the second region;
(g) after the step (1), subjecting the first film exposed in the second region to a nitriding treatment;
(h) after the step (g), adding hafnium to the semiconductor substrate, and thereby forming a first lower layer film including silicon, oxygen, and nitrogen disposed over the semiconductor substrate, and a first upper layer film including hafnium disposed over the first lower layer film in the first region, and forming a second lower layer film including silicon, oxygen, and nitrogen disposed over the semiconductor substrate, and a second upper layer film including hafnium disposed over the second lower layer film in the second region;
(i) after the step (h), forming a conductor film over the semiconductor substrate; and
(j) after the step (i), patterning the conductor film, the first upper layer film, the second upper layer film, the first lower layer film, and the second lower layer film, and thereby forming the first gate electrode formed of the conductor film, and the first gate insulation film formed of the first upper layer film and the first lower layer film in the first region, and forming the second gate electrode formed of the conductor film, and the second gate insulation film formed of the second upper layer film and the second lower layer film in the second region, wherein the concentration of hafnium in the second upper layer film is smaller than the concentration of hafnium in the first upper layer film, and wherein the concentration of nitrogen in the second lower layer film is smaller than the concentration of nitrogen in the first lower layer film, wherein both of the first MISFET and the second MISFET are of a p channel type.

11. The method for manufacturing a semiconductor device according to claim 10, wherein both of the first upper layer film and the second upper layer film each include one or more of HfO, HfON, and HfSiON.

* * * * *